US011097401B2

(12) United States Patent
Morton et al.

(10) Patent No.: US 11,097,401 B2
(45) Date of Patent: Aug. 24, 2021

(54) MAGNETIC COUPLING DEVICE WITH AT LEAST ONE OF A SENSOR ARRANGEMENT AND A DEGAUSS CAPABILITY

(71) Applicant: MAGSWITCH TECHNOLOGY WORLDWIDE PTY LTD., Lafayette, CO (US)

(72) Inventors: David H. Morton, Boulder, CO (US); Paul J. Karp, Boulder, CO (US); Thomas R. Whitt, Redmond, WA (US); Michael C. Blanchard, Thornton, CO (US)

(73) Assignee: MAGSWITCH TECHNOLOGY WORLDWIDE PTY LTD., Lafayette, CO (US)

( * ) Notice: Subject to any disclaimer, the term of this patent is extended or adjusted under 35 U.S.C. 154(b) by 211 days.

(21) Appl. No.: 15/964,884

(22) Filed: Apr. 27, 2018

(65) Prior Publication Data

US 2018/0311795 A1    Nov. 1, 2018

Related U.S. Application Data

(60) Provisional application No. 62/490,705, filed on Apr. 27, 2017, provisional application No. 62/490,706, filed on Apr. 27, 2017.

(51) Int. Cl.
| B23B 45/14 | (2006.01) |
| B25B 11/00 | (2006.01) |
| G01R 33/02 | (2006.01) |

(52) U.S. Cl.
CPC ........... B25B 11/002 (2013.01); G01R 33/02 (2013.01)

(58) Field of Classification Search
None
See application file for complete search history.

(56) References Cited

U.S. PATENT DOCUMENTS

| 2,863,550 A | 12/1958 | Hommel |
| 2,947,429 A | 8/1960 | Buccicone |
| 3,089,064 A | 5/1963 | Cotton |
| 3,316,514 A | 4/1967 | Radus et al. |
| 3,355,209 A | 11/1967 | Richards et al. |
| 3,452,310 A | 6/1969 | Israelson |
| 3,646,669 A | 3/1972 | Erickson |
| 3,895,270 A | 7/1975 | Maddox |

(Continued)

FOREIGN PATENT DOCUMENTS

| CN | 2179359 Y | 10/1994 |
| CN | 1402876 A | 3/2003 |

(Continued)

OTHER PUBLICATIONS

International Search Report and Written Opinion of the International Searching Authority, Australian Patent Office, PCT/US2018/029786 to Magswitch Technology Worldwide PTY Ltd. et al., Aug. 21, 2018, 17 pages.

(Continued)

*Primary Examiner* — Stephen W Jackson
(74) *Attorney, Agent, or Firm* — Faegre Drinker Biddle & Reath LLP

(57) ABSTRACT

Magnetic coupling devices are disclosed having magnetic field sensors. The magnetic coupling device may include degaussing coils wrapped about pole extension shoes of the magnetic coupling device.

81 Claims, 25 Drawing Sheets

(56) References Cited

U.S. PATENT DOCUMENTS

| | | |
|---|---|---|
| 4,314,219 A | 2/1982 | Tosimichi |
| 4,384,313 A | 5/1983 | Steingroever et al. |
| 4,465,993 A | 8/1984 | Braillon |
| 4,610,580 A * | 9/1986 | Palm ............... B23Q 5/54 |
| | | 408/136 |
| 4,639,170 A * | 1/1987 | Palm ............... H01F 7/04 |
| | | 279/128 |
| 4,921,292 A | 5/1990 | Harwell et al. |
| 4,956,625 A | 9/1990 | Cardone et al. |
| 5,525,950 A | 6/1996 | Chin-Yuan |
| 5,794,497 A * | 8/1998 | Anderson ............ B25B 23/12 |
| | | 81/125 |
| 6,076,873 A | 6/2000 | Hyung |
| 6,104,270 A | 8/2000 | Elias |
| 6,160,697 A | 12/2000 | Edel |
| 6,331,810 B1 | 12/2001 | Hyung |
| 6,489,871 B1 | 12/2002 | Barton |
| 6,573,817 B2 | 6/2003 | Gottschalk |
| 6,636,153 B1 | 10/2003 | Barton et al. |
| 6,663,154 B2 | 12/2003 | Italo |
| 6,707,360 B2 | 3/2004 | Underwood et al. |
| 7,012,495 B2 | 3/2006 | Underwood et al. |
| 7,049,919 B2 | 5/2006 | Masaru |
| 7,148,777 B2 | 12/2006 | Chell et al. |
| 7,161,451 B2 | 1/2007 | Chi-Hung |
| 7,396,057 B2 | 7/2008 | Ye et al. |
| 8,031,038 B2 | 10/2011 | Seiji |
| 8,183,965 B2 | 5/2012 | Michael |
| 8,256,098 B2 | 9/2012 | Michael |
| 8,350,663 B1 | 1/2013 | Michael |
| 8,604,900 B2 | 12/2013 | Franz |
| 8,878,639 B2 | 11/2014 | Franz |
| 8,907,754 B2 | 12/2014 | Barton et al. |
| 8,934,210 B1 | 1/2015 | Denis et al. |
| 9,164,154 B2 | 10/2015 | Filosa et al. |
| 9,202,616 B2 | 12/2015 | Fullerton et al. |
| 9,232,976 B2 | 1/2016 | Fortier et al. |
| 9,242,367 B2 | 9/2016 | Timmons et al. |
| 9,453,769 B2 | 9/2016 | Michael |
| 9,484,137 B2 | 11/2016 | Franz |
| 9,589,715 B2 | 3/2017 | Kwang |
| 2004/0239460 A1 | 12/2004 | Franz |
| 2010/0201468 A1 | 8/2010 | Pohl et al. |
| 2010/0301839 A1 | 12/2010 | Cardone et al. |
| 2011/0248806 A1 | 10/2011 | Michael |
| 2013/0285399 A1 | 10/2013 | Sarh et al. |
| 2013/0320686 A1 | 12/2013 | Morton |
| 2014/0055069 A1 | 2/2014 | Dai et al. |
| 2014/0132254 A1 | 5/2014 | Thomas et al. |
| 2015/0035632 A1 | 2/2015 | Sarh et al. |
| 2016/0187208 A1 | 6/2016 | Michael |
| 2016/0289046 A1 | 10/2016 | Norton et al. |
| 2017/0232605 A1 | 8/2017 | Morton |
| 2018/0111237 A1 | 4/2018 | Michael |
| 2018/0193899 A1 | 7/2018 | Cengitz |
| 2018/0315563 A1 | 11/2018 | Morton et al. |
| 2020/0185137 A1 | 6/2020 | Morton et al. |
| 2021/0031335 A1 | 2/2021 | Morton et al. |

FOREIGN PATENT DOCUMENTS

| | | |
|---|---|---|
| CN | 1245725 C | 3/2006 |
| CN | 101356597 | 2/2013 |
| CN | 103563019 A | 2/2014 |
| CN | 105684102 A | 6/2016 |
| CN | 105940468 A | 9/2016 |
| DE | 202016006696 U1 | 12/2016 |
| EP | 1425763 A1 | 6/2004 |
| EP | 1419034 B1 | 7/2006 |
| EP | 2611569 A1 | 7/2013 |
| EP | 2535307 B1 | 4/2015 |
| EP | 2611569 B1 | 11/2016 |
| EP | 3100288 B1 | 3/2018 |
| EP | 3460411 A1 | 3/2019 |
| GB | 0695130 A | 8/1953 |
| JP | 5798208 B2 | 10/2015 |
| KR | 10-2003-0007387 A | 1/2003 |
| WO | 2003/009972 | 2/2003 |
| WO | 03/19583 A1 | 3/2003 |
| WO | 2009/000008 A1 | 12/2008 |
| WO | 2010/020006 A1 | 2/2010 |
| WO | 2010/135788 A1 | 12/2010 |
| WO | 2012/029073 A1 | 3/2012 |
| WO | 2012/160262 A1 | 11/2012 |
| WO | 2014/033757 A1 | 3/2014 |
| WO | WO2014033757 A1 | 3/2014 |
| WO | 2015/033851 A1 | 3/2015 |
| WO | WO2015114214 A1 | 8/2015 |
| WO | WO2016162419 A1 | 10/2016 |
| WO | 2018/200948 A1 | 11/2018 |
| WO | 2018/227140 A1 | 12/2018 |

OTHER PUBLICATIONS

International Preliminary Report on Patentability received for PCT Patent Application No. PCT/US2018/029786, dated Nov. 7, 2019, 10 pages.

International Search Report and Written Opinion received for PCT Patent Application No. PCT/US2019/019179, dated Jun 24, 2019, 14 pages.

International Search Report and Written Opinion received for PCT Patent Application No. PCT/US2019/027267, dated Jul. 17, 2019, 27 pages.

'Ixtur Automatic On/Off Lifting Magnets; Industrial Magnetics, Inc., magnetics com, 2015-11-01, https://web.archive.org/web/20151101101715/https://www.magnetics.com product.asp?ProductID=169, two pages.

"RPL 11 ERIEZ Lifting Magnet 1,100 lb Hoist or Crane," eBay, ebay.com, seller: industrial supplies warehouse, ebay Item No. 263279261219, accessed: Oct. 2017. https://www.ebay.com/itm/RPL-11-ERIEZ-Lifting-Magnet-1-100-lb-Hoist-or-Crane-/263279261219.

Knaian, "Electropermanent Magnetic Connectors and Actuators: Devices and Their Application in Programmable Matter", PhD Thesis, Massachusetts Institute of Technology, 2010 (206 pages).

"Pick 'n Place D Series", DocMagnet, retrieved from https://web.archive.org/web/20150512113557/http://www. docmagnet.com:80/products/magnetic-material-handling/automation/pick-n-place-d-series/, May 12, 2015, (4 pages).

Material Handling Catalogue, DocMagnet, undated, (8 pages).

"Pick & Place For End-of-Arm Tooling", DocMagnet, undated, (5 pages).

"MaxX The hand controlled magnetic lifter", Tecnomagnete, Oct. 2008, (16 pages).

"MagnaGrip SS Sensing System" https://www.maglogix.com/maglogix-switchable-permanent-magnets-magnagrip, copyright 2014-2017, printed Jul. 20, 2019, (5 pages).

Official Action for Canadian Application No. 3,061,331, dated Feb. 9, 2021, 3 pages.

Extended European Search Report for European Application No. 18792036.8, dated Dec. 8, 2020, 8 pages.

Search Report and First Office Action for Chinese Application No. 2018800408500, dated Apr. 6, 2021, 16 pages.

\* cited by examiner

MAGNETIC COUPLING DEVICE WITH AT LEAST ONE OF A SENSOR ARRANGEMENT AND A DEGAUSS CAPABILITY

RELATED APPLICATIONS

The present application claims the benefit of U.S. Provisional Patent Application No. 62/490,705, titled MAGNETIC COUPLING TOOL WITH SENSOR ARRANGEMENT, filed Apr. 27, 2017 and U.S. Provisional Patent Application No. 62/490,706, titled MAGNETIC COUPLING TOOL WITH DEGAUSS CAPABILITY, filed Apr. 27, 2017, the entire disclosures of which are expressly incorporated by reference herein.

TECHNICAL FIELD

The present disclosure is related to magnetic coupling devices having at least one sensor to determine one or more parameters indicative of the quality of the magnetic circuit between the magnetic coupling device and a ferromagnetic workpiece, as well as, a relative position between magnetic coupling device and the ferromagnetic workpiece. Additionally, the magnetic coupling devices may include degauss capability.

BACKGROUND

There are numerous devices which use magnetic fields in order to attract and/or secure a ferromagnetic target to a working face of the device. Examples include magnetic clamping devices such as workpiece chucks, permanent magnet lifting devices, magnetic latches, magnetic tool stands, etc.

Generally speaking, most of such devices include one or more sources of magnetic flux. These sources include electromagnets, electro-permanent magnets, switchable permanent magnet units or arrangements, and combinations thereof. In order to channel the magnetic flux provided by the magnet(s) to one of more working face(s) of the device at which the target is to be secured magnetically, high magnetic permeability pole shoes or guides are often used, in creating a magnetic working circuit.

In many applications, and from a practical engineering perspective, users of such devices are primarily interested in determining the actual (pull) force which is exerted at the working face on the target, having otherwise access to rating data of the magnet(s) employed in the device and which, all other aspects of the device-internal part of the magnetic working circuit being ideal, includes the Gauss rating of the magnet. The Gauss rating in turn allows determining of a maximum, theoretical pull force which such magnet(s) can exert on a target, using established formulae, where the target's size, geometry and ferromagnetic composition enables it to be fully magnetically saturated. That is, it is assumed that no or only negligible stray magnetic field lines outside the circuit comprised of magnet, pole shoes and target exist, in particular at the working face where 'air gaps' are often present between pole shoes and target which adversely affect pull force. Some magnet manufacturers also provide maximum pull force rating values for their magnets, based on laboratory testing.

It is well known that the actual pull force exerted by a magnetic device on a target will be different to that determinable from the Gauss rating of the magnet or the rated maximum pull force determined by experimentation. The actual or effective pull force is reduced by a number of factors, including uneven contact at the interface pole shoe—target (i.e. presence of air gaps at the interface), the interface pole shoe—target not being perpendicular to the magnetic field lines at the interface, target having 'thin' dimensions leading to magnetic field lines extending past and outside the target (stray and leakage flux leakage), target surface geometry and coatings, etc.

In the context of magnetic devices which use robotic arms and other positioning devices to move the device between off-target and on-target operating positions, additional factors beyond pull force need to be accounted for, e.g. the need for precise positioning of the device with its working face against specific areas or zones on the target, which can be of as simple geometric shape as a plate or thin sheet metal stamping, to more complex multi-curved forms such as engine cam shafts.

Because many of these variables are difficult or impossible to predict in use of such magnetic devices, various operating methods and measuring systems have been proposed and integrated into such magnetic devices, to gain in-use and real-time information about qualitative and quantitative parameters relevant to the external part of magnetic working circuit, relevantly whether the target is and remains safely attached to the working face of the device, and whether the pull force remains within safety or rating thresholds.

Magnetic grippers are a common tool for handling steel workpieces in industrial automation. They achieve large holding forces and are relatively straight-forward to integrate into a robotics system, but for specific problems noted below. Many magnetic grippers used in industry are powered by pneumatic actuators. This prevents most magnetic grippers from interfacing with control electronics of a fully automated process. Without an interface between a magnet gripper and the control electronics, the robot (and the operator) has no easy way of obtaining feedback from the magnet gripper on tool status or workpiece handling performance.

One common way around this in industry is to provide additional sensors on the outside of the magnet gripper to detect various tool states, such as when the tool is turned fully on vs fully off, or when a target part is in contact with the magnet gripper's working face. Though this method of adding sensors works, it is expensive to add many additional and function-dedicated sensors. In addition, sensors added to the outside of the tool are vulnerable to damage from the robot's movement, operation, and surrounding environment. Additional sensors also add wiring complexity, making integration of the robot arm more expensive and difficult.

Regardless of the lay-out and the interface between the magnetic coupling device and the workpiece, it is well known that ferromagnetic workpieces that have been exposed to a magnetic field during handling by such devices retain residual magnetism from the handling operation, in particular where a strong magnetic field was used to generate sufficient pull force to retain the workpiece secured to the device. Relevantly, in many cases it is desired for such workpieces to be totally or to a viable extent free of residual magnetism, for example where following magnetic handling a workpiece is to be machined or residual magnetism may interfere with subsequent use of the workpiece.

It is equally well known that workpieces can be demagnetized by exposing these to an alternating magnetic field of decreasing intensity, for example by passing them through a field of an AC-powered Degaussing Chamber (or coil) if they are small enough or moving a tool comprising a demagnetization coils over the part while generating an alternating magnetic field of decreasing intensity that ultimately removes the remaining magnetism from the workpiece.

One problem with such methodologies is that they require a separate, dedicated extra processing step in workpiece handling/machining routines and/or a separate (additional) tool/device to perform the operation.

Against the above background, and m particular having regard to the added challenges which integration of sensors into robotic end of arm (EOA) magnetic coupling tools such as grippers and workpiece transfer equipment present, it is desired to provide a device (or tool) which is intended to allow integration of feedback measures in a magnetic coupling tool, to allow for superior operation and use of magnetic technology in robotics. Exemplary feedback measures may include an indication of whether a target (i.e. a workpiece) is properly magnetically retained at the working face of the tool, an indication of a quality of coupling between an end-of-arm magnetic tool (EOAMT) and workpiece, such as correct positioning of the tool within predetermined thresholds at a target zone of the workpiece, detection of proximity of a target workpiece vis a vis an EOAMT, and other factors. Further, it is desired to provide magnetic coupling tools with improved degaussing functionality.

SUMMARY

Embodiments of the present disclosure relate to magnetic couplers for lifting, transporting, and/or holding a ferromagnetic workpiece.

In an exemplary embodiment of the present disclosure, a magnetic coupling tool for magnetically coupling to a ferromagnetic workplace is provided. The magnetic coupling tool comprising a housing and a switchable magnetic flux source supported by the housing including a plurality of permanent magnets. The plurality of permanent magnets including a first permanent magnet and a second permanent magnet movable relative to the first permanent magnet. The magnetic coupling tool further comprising a plurality of workpiece engagement surfaces supported by the housing and magnetically coupled to the switchable magnetic flux source. The plurality of workpiece engagement surfaces adapted to contact the ferromagnetic workpiece. A first workpiece engagement surface of the plurality of workpiece engagement surfaces corresponding to a north pole of the magnetic coupling tool and a second workpiece engagement surface of the plurality of workpiece engagement surfaces corresponding to a south pole of the magnetic coupling tool. The magnetic coupling tool further comprising a plurality of magnetic field sensors supported by the housing. A first magnetic field sensor of the plurality of magnetic field sensors positioned to monitor a first magnetic flux associated with the first workpiece engagement surface of the plurality of workpiece engagement surfaces and a second magnetic field sensor of the plurality of magnetic field sensors positioned to monitor a second magnetic flux associated with the second workpiece engagement surface of the plurality of workpiece engagement surfaces. The magnetic coupling tool further comprising a logic control circuit operatively coupled to the plurality of magnetic field sensors. The logic control circuit configured to determine at least one operating state of the magnetic coupling tool based on an output from at least one of the plurality of magnetic field sensors.

In an example thereof, the logic control circuit is configured to determine if the switchable magnetic flux source is in an off state. In a variation thereof, the logic control circuit determines if the switchable magnetic flux source is in an off state by a comparison of an output of at least one of the plurality of magnetic field sensors to a first threshold stored on a memory accessible by the logic control circuit.

In another example thereof, the logic control circuit is configured to determine if at least one of the plurality of workpiece engagement surfaces is proximate to the ferromagnetic workpiece. In a variation thereof, the logic control circuit determines if at least one of the plurality of workpiece engagement surfaces is proximate to the ferromagnetic workpiece by a comparison of an output of at least one of the plurality of magnetic field sensors to a second threshold stored on a memory accessible by the logic control circuit.

In a further example thereof, the logic control circuit is configured to determine a spacing of the first workpiece engagement surface from the ferromagnetic workpiece. In a variation thereof, the spacing of the first workpiece engagement surface from the ferromagnetic workpiece is determined by a comparison of an output of the first magnetic field sensor to at least one threshold stored on a memory accessible by the logic control circuit.

In still another example thereof, the logic control circuit is configured to determine an orientation of the first workpiece engagement surface and the second workpiece engagement surface relative to the ferromagnetic workpiece. In a variation thereof, the orientation of the first workpiece engagement surface and the second workpiece engagement surface relative to the ferromagnetic workpiece is determined by a comparison of an output of the first magnetic field sensor and an output of the second magnetic field sensor. In a further variation thereof, a first spacing between the first workpiece engagement surface and the ferromagnetic workpiece and a second spacing between the second workpiece engagement surface and the ferromagnetic workpiece are determined by the logic control circuit to be generally equal when the output of the first magnetic field sensor and the output of the second magnetic field sensor satisfy a first criteria. In still a further variation thereof, the first criteria is that the output of the first magnetic field sensor is within a threshold amount of the output of the second magnetic field sensor.

In yet another example, the logic control circuit is configured to determine if a placement of the first workpiece engagement surface and the second workpiece engagement surface relative to the ferromagnetic workpiece are within a target zone of the ferromagnetic workpiece. In a variation thereof, the placement of the first workpiece engagement surface and the second workpiece engagement surface relative to the ferromagnetic workpiece are determined to be within a target zone of the ferromagnetic workpiece when both an output of the first magnetic field sensor satisfies a first criteria and an output of the second magnetic field sensor satisfies a second criteria. In a further variation thereof, the first criteria is the output of the first magnetic field sensor is within a first range of magnetic flux values and the second criteria is the output of the second magnetic field sensor is within a second range of magnetic flux values. In a still further variation thereof, the first range of magnetic flux values includes a first limit value corresponding to the first workpiece engagement surface positioned at a first limit position of the target zone relative to the ferromagnetic workpiece and a second limit value corresponding to the first workpiece engagement surface positioned at a second limit position of the target zone relative to the ferromagnetic workpiece. In yet still a further variation thereof, the second range of magnetic flux values includes a first limit value corresponding to the second workpiece engagement surface positioned at a first limit position of the target zone relative to the ferromagnetic workpiece and a second limit value corresponding to the second workpiece engagement surface positioned at a second limit position of the target zone relative to the ferromagnetic workpiece. In yet another still variation, the logic control circuit determines a first end of the magnetic coupling tool including the first workpiece contact surface is positioned outside of the target zone when the second criteria is satisfied and the first criteria is not satisfied. In a further yet variation, the logic control circuit determines a second end of the magnetic coupling tool including the second workpiece contact surface is positioned outside of the target zone when the first criteria is satisfied and the second criteria is not satisfied.

In still yet another example, the logic control circuit is configured to determine an orientation of the first workpiece engagement surface and the second workpiece engagement surface relative to the ferromagnetic workpiece in two rotational axes based on the output of the plurality of magnetic field sensors. In a variation thereof, the plurality of magnetic field sensors includes a third magnetic field sensor and a fourth magnetic field sensor. The first magnetic field sensor being positioned in a left side half of the magnetic coupling tool. The second magnetic field sensor being positioned in a right side half of the magnetic coupling tool. The third magnetic field sensor being positioned in a front half of the magnetic coupling tool, the front half including a first portion of the left side half and a first portion of the right side half. The fourth magnetic field sensor being positioned in a rear half of the magnetic coupling tool, the rear half including a second portion of the left side half and a second portion of the right side half. The logic control circuit determines the orientation of the first workpiece engagement surface and the second workpiece engagement surface relative to the ferromagnetic workpiece in two rotational axes based on the output of each of the first magnetic field sensor, the second magnetic field sensor, the third magnetic field sensor, and the fourth magnetic field sensor. In another variation thereof, the logic control circuit is configured to determine an orientation of the first workpiece engagement surface and the second workpiece engagement surface relative to the ferromagnetic workpiece in two rotational axes based on the output of the plurality of magnetic field sensors, the first magnetic field sensor and the second magnetic field sensor each being a three-dimensional magnetic field sensor. In still another variation thereof, the logic control circuit is further configured to determine a spacing of the magnetic coupling tool relative to the ferromagnetic workpiece. In a further still variation, the logic control circuit is configured to determine the spacing of the magnetic coupling tool relative to the ferromagnetic workpiece independent of the orientation of the magnetic coupling tool relative to the ferromagnetic workpiece.

In a further yet example, the logic control circuit is configured to determine, whether one or more of the workpiece engagement surfaces at the pole extension shoes abut a workpiece, and whether abutment of a workpiece at one or more of the workpiece engagement surfaces is adequate and within predetermined positional thresholds.

In another still example, the magnetic coupling tool further comprises an actuator operatively coupled to the second permanent magnet to move the second permanent magnet relative to the first permanent magnet. In a variation thereof, the actuator is a stepper motor. In another variation thereof, the logic control circuit is operatively coupled to the actuator to control an orientation of the second permanent magnet relative to the first permanent magnet.

In yet another example thereof, the second permanent magnet is rotatable relative to the first permanent magnet about an axis intersecting with the second permanent magnet to alter a position of the second permanent magnet relative to the first permanent magnet.

In still yet another example thereof, the second permanent magnet is rotatable relative to the first permanent magnet about an axis in a non-intersecting relationship with the second permanent magnet to alter a position of the second permanent magnet relative to the first permanent magnet. In a variation thereof, the magnetic coupling tool further comprises a first platter supported by the housing and a second platter supported by housing. The second platter being moveable relative to the first platter to alter a position of the second permanent magnet relative to the first permanent magnet. The first platter comprising a first plurality of spaced apart permanent magnets including the first permanent magnet, each of the first plurality of spaced apart permanent magnets has a north pole side and a south pole side, and a first plurality of pole portions interposed between adjacent permanent magnets of the first plurality of permanent magnets, wherein the first plurality of permanent magnets are arranged so that each pole portion of the first plurality of pole portions is one of a north pole portion which is adjacent the north pole side of two permanent magnets of the first plurality of permanent magnets and a south pole portion which is adjacent the south pole side of two permanent magnets of the first plurality of permanent magnets. The second platter comprising a second plurality of spaced apart permanent magnets including the second permanent magnet, each of the second plurality of spaced apart permanent magnets has a north pole side and a south pole side, and a second plurality of pole portions interposed between adjacent permanent magnets of the second plurality of permanent magnets, wherein the second plurality of permanent magnets are arranged so that each pole portion of the first plurality of pole portions is one of a north pole portion which is adjacent the north pole side of two permanent magnets of the second plurality of permanent magnets and a south pole portion which is adjacent the south pole side of two permanent magnets of the second plurality of permanent magnets, wherein the first magnetic sensor is associated with one of the north pole portions of the second platter and the second magnetic sensor is associated with one of the south pole portions of the second platter.

In another still example thereof, the magnetic coupling tool further comprises a plurality of pole extension shoes supported by the housing. The plurality of pole extension shoes including a first pole extension shoe including the first workpiece engagement surface and a second pole extension shoe including the second workpiece engagement, wherein the housing includes a lower side positioned between the first pole extension shoe and the second pole extension shoe, the first pole extension shoe and the second pole extension shoe extending below the lower side of the housing. In a variation thereof, the first pole extension shoe and the second pole extension shoe are removable from the housing.

In a further still example thereof, the first magnetic field sensor and the second magnetic field sensor are positioned outside of an envelope of the second permanent magnet.

In another example thereof, the first magnetic field sensor is positioned in a first half of the magnetic coupling tool and the second magnetic field sensor is positioned in a second half of the magnetic coupling tool. In a variation thereof, the first pole extension shoe is associated with a flux detection circuit surface opposite the workpiece engagement surface of the first pole extension shoe, the first magnetic sensor is positioned above the flux detection circuit associated with the first pole extension shoe. In another variation thereof, the housing includes a first recess, the first pole extension shoe being received in the first recess and the first magnetic sensor being positioned directly above the first recess. In another variation thereof, the second pole extension shoe is associated with a flux detection circuit surface opposite the workpiece engagement surface of the second pole extension shoe, the second magnetic sensor is positioned above the flux detection circuit associated with the second pole extension shoe. In a further variation thereof, the housing includes a second recess, the second pole extension shoe being received in the second recess and the second magnetic sensor being positioned directly above the second recess.

In a further example thereof, the first magnetic field sensor and the second magnetic field sensor are positioned within the housing.

In a further still example thereof, the magnetic coupling tool further comprises at least one temperature sensor supported by the housing, the logic control circuit is operatively coupled to the at least one temperature sensor and the logic control circuit based on an output of the temperature sensor adjusts the output received from the at least one of the plurality of magnetic field sensors.

In still a further example thereof, the first magnetic field sensor and the second magnetic field sensor are each vector magnetometers.

In yet another example thereof, the magnetic coupling tool further comprises a communication module supported by the housing, wherein the logic control circuit is operatively coupled to the communication module to interface with external control electronics.

In another example thereof, the magnetic coupling tool further comprises a plurality of degaussing electrical windings. A first degaussing electrical winding of the plurality of degaussing electrical windings being positioned about the first pole extension shoe of the plurality of pole extension shoes. A second degaussing electrical winding of the plurality of degaussing electrical windings being positioned about a second pole extension shoe of the plurality of pole extension shoes. The logic control circuit is operatively coupled to the first degaussing electrical winding and the second degaussing electrical winding. The logic control circuit configured to perform a degaussing cycle with the plurality of degaussing electrical windings. The degaussing cycle including generating an oscillating and alternating magnetic field with the first degaussing electrical winding and the second degaussing electrical winding for a period of time. In a variation thereof, each of the first pole extension shoe and the second pole extension shoe include a first portion covered by the respective first and second degaussing electrical windings, a cross sectional area of the respective first portions being sufficient to direct a substantial and preferably all of the magnetic flux generated upon the respective first and second degaussing electrical windings being energised to the respective first and second workpiece engagement surfaces. In another variation thereof, the first workpiece engagement surface and the second workpiece engagement surface are both in contact with the ferromagnetic workpiece during the degaussing cycle and the switchable magnetic flux source is in an off state.

In still another example thereof, the magnetic coupling device further comprises an output device which provides an indication of the operating state of the magnetic coupling device.

In a further example thereof, the magnetic coupling device further comprises an output device which provides a plurality of distinct indications, each corresponding to a respective one of a plurality of distinct operating states of the magnetic coupling device. In a variation thereof, the plurality of distinct indications are each a visual indication perceivable from an exterior of the housing. In another variation thereof, the output device includes a plurality of lights which are controlled to provide the plurality of distinct indications.

In another exemplary embodiment of the present disclosure, a robotic system for lifting a ferromagnetic workpiece is provided. The robotic system comprising a robotic arm including a base and a plurality of moveable arm segments and a magnetic coupling device according to any one of the above mentioned embodiments, examples, and variations, the magnetic coupling device being operatively coupled to the robotic arm at a first end opposite the base.

In a further exemplary embodiment of the present disclosure, a method of determining at least one operating state of a magnetic coupling tool is provided. The method comprising the steps of: detecting a first magnetic flux associated with a north pole of a switchable magnetic flux source supported by a housing, the switchable magnetic flux source including a plurality of permanent magnets, including a first permanent magnet and a second permanent magnet movable relative to the first permanent magnet, the first magnetic flux being detected at a location remote from a workpiece engagement surface of the north pole of the magnetic coupling tool and to a first side of the switchable magnetic flux source; detecting a second magnetic flux associated with a south pole of the switchable magnetic flux source, the second magnetic flux being detected at a location remote from a workpiece engagement surface of the south pole of the magnetic coupling tool and to a second side of the switchable magnetic flux source, the second side being opposite the first side; and determining if the magnetic coupling tool is in a first operating state based on at least one of the detected first magnetic flux and the detected second magnetic flux.

In an example thereof, the step of determining the first operating state of the magnetic coupling tool includes the steps of: determining if the detected first magnetic flux satisfies a first criteria; determining if the detected second magnetic flux satisfies a second criteria, and determining that the magnetic coupling tool is in the first operating state if the detected first magnetic flux satisfies the first criteria and the detected second magnetic flux satisfies the second criteria. In a variation thereof, the first criteria is the output of the first magnetic field sensor is within a first range of magnetic flux values and the second criteria is the output of the second magnetic field sensor is within a second range of magnetic flux values. In a further variation thereof, the first range of magnetic flux values includes a first limit value corresponding to the first workpiece engagement surface positioned at a first limit position of a target zone relative to the ferromagnetic workpiece and a second limit value corresponding to the first workpiece engagement surface positioned at a second limit position of the target zone relative to the ferromagnetic workpiece. In a still further variation thereof, the second range of magnetic flux values includes a first limit value corresponding to the second workpiece engagement surface positioned at a first limit position of the target zone relative to the ferromagnetic workpiece and a second limit value corresponding to the second workpiece engagement surface positioned at a second limit position of the target zone relative to the ferromagnetic workpiece. In another variation, the method further comprises the step of determining the first side of the magnetic coupling tool including the first workpiece contact surface is positioned outside of a target zone on the ferromagnetic workpiece when the second criteria is satisfied and the first criteria is not satisfied. In another variation thereof, the method further comprises the step of determining the second side of the magnetic coupling tool including the second workpiece contact surface is positioned outside of a target zone on the ferromagnetic workpiece when the first criteria is satisfied and the second criteria is not satisfied.

In another example thereof, the first operating state is the magnetic coupling tool is in an off state. In a variation thereof, the step of determining if the magnetic coupling tool is in the first operating state includes the step of comparing of an output of at least one of the plurality of magnetic field sensors to a first threshold.

In yet another example, the first operating state is that at least one of the plurality of workpiece engagement surfaces is proximate to the ferromagnetic workpiece. In a variation thereof, the step of determining if the magnetic coupling tool is in the first operating state includes the step of comparing an output of at least one of the plurality of magnetic field sensors to a second threshold stored on a memory accessible by the logic control circuit.

In still another example thereof, the method further comprises the step of determining a spacing of the first workpiece engagement surface from the ferromagnetic workpiece.

In still a further example thereof, the method further comprises the step of determining an orientation of the first workpiece engagement surface and the second workpiece engagement surface relative to the ferromagnetic workpiece. In a variation thereof, the step of determining the orientation of the first workpiece engagement surface and the second workpiece engagement surface relative to the ferromagnetic workpiece includes the step of comparing an output of the first magnetic field sensor and an output of the second magnetic field sensor. In another variation thereof, the first workpiece engagement surface and the second workpiece engagement surface of the magnetic coupling tool are generally parallel to the ferromagnetic workpiece when the output of the first magnetic field sensor and the output of the second magnetic field sensor satisfy a first criteria. In a still further variation thereof, the first criteria is that the output of the first magnetic field sensor is within a threshold amount of the output of the second magnetic field sensor.

In still a further exemplary embodiment of the present disclosure, a magnetic coupling tool for magnetically coupling to a ferromagnetic workpiece is provided. The magnetic coupling tool comprising: a housing; a switchable magnetic flux source supported by the housing including a plurality of permanent magnets, the plurality of permanent magnets including a first permanent magnet and a second permanent magnet movable relative to the first permanent magnet, a plurality of pole extension shoes each having a workpiece interface; the plurality of pole extension shoes coupled to the housing to receive magnetic flux from the switchable magnetic flux source, the received magnetic flux being available to the ferromagnetic workpiece through the respective workpiece interfaces of the plurality of pole extension shoes; a plurality of degaussing electrical windings, a first degaussing electrical winding of the plurality of degaussing electrical windings being positioned about a first pole extension shoe of the plurality of pole extension shoes and a second degaussing electrical winding of the plurality of degaussing electrical windings being positioned about a second pole extension shoe of the plurality of pole extension shoes; and a logic control circuit operatively coupled to the switchable magnetic flux source. The first degaussing electrical winding, and the second degaussing electrical winding, the logic control circuit configured to (i) positon the second permanent magnet in a first orientation relative to first permanent magnet and (ii) perform a degaussing cycle with the plurality of degaussing electrical windings, the degaussing cycle including generating an oscillating and alternating magnetic field with the first electrical winding and the second electrical winding for a period of time.

In an example thereof, each of the first pole extension shoe and the second pole extension shoe include a first portion covered by the respective first and second degaussing electrical windings, a cross sectional area of the respective first portions being sufficient to direct a substantial and preferably all of the magnetic flux generated upon the respective first and second degaussing electrical windings being energised to the respective first and second workpiece engagement surfaces.

In another example thereof, the first workpiece engagement surface and the second workpiece engagement surface are both in contact with the ferromagnetic workpiece during the degaussing cycle and the switchable magnetic flux source is in an off state.

In a further exemplary embodiment of the present disclosure, an end of arm magnetic coupling tool (EOAMT) devised for magnetically securing a ferromagnetic workpiece to a working face of the tool is provided. The end of arm magnetic coupling tool comprising: an on-off switchable magnetic flux source; a housing component in which is received the magnetic flux source; at least two, magnetic pole extension shoes having each a workpiece engagement surface and flux detection surface at an end opposite to the workpiece engagement surface, wherein the pole extension shoes are mounted to or at least partially form integral part of the housing component such as to receive magnetic flux from the magnetic flux source and make such available at the workpiece engagement surface; a number of first magnetic field detection sensors equal in number to the pole extension shoes and each located a predetermined distance away but in close proximity to the flux detection surface of an associated one of the pole extension shoes; and a logic control circuit operative to receive an output signal from one or more of the magnetic field detection sensors and determine from said output signal(s) at least one of the following operating states of the tool: whether the magnetic flux source is switched on or off, whether there is a ferromagnetic workpiece in spatial proximity to one or more of the workpiece engagement surfaces at the pole extension shoes, whether one or more of the workpiece engagement surfaces at the pole extension shoes abut a workpiece, and whether abutment of a workpiece at one or more of the workpiece engagement surfaces is adequate and within predetermined positional thresholds.

In an example thereof, the first magnetic field sensors and the logic control circuit are housed within a further (second) housing component which is preferably of multi-piece construction and which is secured to the first housing component, such as to provide a compact-footprint EOAMT with integrated magnetic field detection and workpiece—tool interface detection capabilities.

In another example thereof, the magnetic flux source, the first housing component and the pole extension shoes are comprised in an on-off switchable, dipole permanent magnet unit. In a variation thereof, the first housing component is a ferromagnetic steel housing component with a central cylindrical bore in which two cylindrical, diametrically polarized rare-earth permanent magnets are stacked such that one of the magnets is fixed against rotating within the cylindrical bore while the other magnet is free to rotate upon external torque application by an actuator (pneumatic, hydraulic or electric) interfaced with the rotatable magnet. In another variation thereof, the housing component comprises an upper, un-recessed portion and a lower recessed portion at which cuboid pole shoes are mounted such as to form a continuous, substantially air-gap-free flux delivery path towards the workpiece engagement surfaces provided at the free axial terminal ends of the pole shoes, and wherein the flux detection surfaces opposite the workpiece engagement surfaces are provided at an upper terminal face of the un-recessed housing portion, the housing having a substantially rectangular foot print.

In a further example thereof, a second housing component is provided in addition to the first housing component, secured to an end of the first housing component opposite the workpiece engagement surfaces. In a variation thereof, the second housing component is substantially non-ferromagnetic and includes at least two passage ways extending preferably to terminal openings located opposite the flux detection surfaces at the first housing component and receiving a respective one of two said first magnetic field detection sensors. In another variation thereof, the second housing component houses an actuator which interfaces with the rotatable magnet received in the first housing component to switch the magnetic flux source "on" and "off".

In still a further variation, the logic control circuit operative to receive output signals from the one or more of the first magnetic field (and any additional) detection sensors and determine from said output signal(s) one or more of the operating states of the tool, comprises a central control board, preferably a printed circuit board which contains a pre-programmed or programmable microprocessor, with analog to digital converters (ADCs) for sensor signal sampling and optionally with conditioning functionality. In a variation thereof, the logic control circuit of the central control board comprises additional transistors for interfacing a GPIO (general-purpose input/output) of the processor to industrial 24V logic. In another variation thereof, the central control board further comprises power conditioning to take 24 V from an industrial power supply and regulate it to 5V and/or 3.3 V for use by the microprocessor and other circuit components, as well as provide the working voltage for the magnetic field sensors. In still another variation thereof, the central control board comprises a series of blank headers for accept a communications module that allows the control board to interface with external control electronics.

In yet another example, the first magnetic field sensors are vector magnetometers, in particular solid-state linear Hall Effect sensors or magneto resistive sensors, with very small form factor and embodied in solid state ICs.

In still yet another example, the end of arm magnetic coupling tool further comprises visual status indicators, preferably in form of one or more LEDs which are driven by the microprocessor to indicate when a predefined one of the tool status is present or absent, including when the magnetic flux source is on or off, when the magnetic flux source is on and proximity of target is detected by the first magnetic field sensors, when the tool's workpiece engagement surfaces contact the workpiece outside intended specific areas on target and when tool engagement with the workpiece is within threshold limits, showing a safe magnetic coupling state.

In still a further exemplary embodiment thereof, an end of arm magnetic coupling tool devised for magnetically securing a ferromagnetic work piece to a working face of the tool is provided. The end of arm magnetic coupling tool comprises: an on-off switchable di-pole magnetic flux source; a first housing component in which is received the magnetic flux source; a pair of magnetic pole extension shoes having each a work piece engagement surface, wherein the pole extension shoes are mounted to the first housing component such as to receive magnetic flux from the magnetic flux source and make such available at the work piece engagement surfaces; at least one, but preferably a number of first magnetic field detection sensors equal in number to the pole extension shoes, located a predetermined distance away but in close proximity to a flux detection surface preferably at an end opposite the work piece engagement surface of an associated one of the pole extension shoes; a pair of degaussing electrical windings, one each wound about a section of an associated one of the two magnetic pole extension shoes, and a logic control circuit operative to (i) receive an output signal from the at least one magnetic field detection sensor and determine from said output signal(s) an operating state of the tool indicative of the magnetic flux source being switched off, (ii) switch-on an electric power supply to the degaussing electrical windings after detection of an off state of the magnetic flux source and (iii) perform a degaussing cycle wherein the degaussing electrical windings generate an oscillating and alternating magnetic field over a predetermined time.

In an example thereof, the first magnetic field sensors and the logic control circuit are housed within a second housing component which is preferably of multi-piece construction and which is secured to the first housing component such as to provide a compact-footprint EOAMT with integrated work piece coupling, magnetic field detection, work piece—tool interface detection and degaussing functionalities.

In another example thereof, the magnetic flux source, the first housing component and the pole extension shoes are comprised in an on-off switchable, dipole permanent magnet unit.

In yet another example, the first housing component is a ferromagnetic steel housing component with a central cylindrical bore in which two cylindrical, diametrically polarized rare-earth permanent magnets are stacked such that one of the magnets is fixed against rotation within the cylindrical bore while the other magnet is free to rotate upon external torque application by an actuator interfaced with the rotatable magnet.

In still another example thereof, the pole extension shoes comprise at least two components, including a first pole extension member secured in removable manner to the first housing component and a second pole extension member removably secured in extension to the first member and defining the work piece engagement surface. In a variation thereof, the degaussing electrical windings encircle a section of the second pole extension member. In another variation thereof, the second pole shoe member has a work piece engagement surface adapted to a contour or geometric parameters of a work piece.

In yet another example, the pole extension shoes have, in a section covered by the degaussing windings, a cross sectional area sufficient to direct a substantial and preferably all of the magnetic flux generated upon the degaussing windings being energised, to the work piece engagement surface.

In still another example, the pole extension shoes have, in a section covered by the degaussing windings, a cross sectional area sufficient to direct a substantial portion of the magnetic flux generated upon the degaussing windings being energised, to the work piece engagement surface and generate magnetic flux leakage around the work piece engagement surface.

In yet still another example, the first housing component comprises an upper, un-recessed portion and a lower portion recessed at opposite sides of the housing component, wherein the pole shoe extension members are or comprise a cuboid mounted to the recessed lower housing portions such as to form with the upper, un-recessed housing portion a continuous, substantially air-gap-free flux delivery path towards the work piece engagement surfaces provided at the free axial terminal ends of the pole extension shoes, and wherein the flux detection surfaces opposite the work piece engagement surfaces are provided at an upper terminal face of the un-recessed housing portion. In a variation thereof, the first housing component comprises through holes for guiding connection leads from the logic control circuit to the electric degaussing windings.

In a further example thereof, the second housing component is substantially non-ferromagnetic and preferably includes at least two passage ways extending from the through holes of the first housing component to the logic control circuit.

In yet a further example thereof, the logic control circuit is devised to perform the degaussing cycle when the tool is still resting with its work piece engagement surfaces at the work piece after having been magnetically secured thereto and the magnetic flux source has been turned off to effect decoupling from the work piece. In a variation thereof, the logic control circuit comprises a central control board, preferably a printed circuit board, which contains a pre-programmed or programmable microprocessor and circuitry for generating an AC signal causing the degaussing windings to generate the oscillating and alternating magnetic degaussing field. In another variation thereof, the logic control circuit of the central control board comprises components for interfacing a GPIO (general-purpose input/output) of the processor to industrial 24V logic. In still another variation thereof, the central control board further comprises power conditioning to take 24 V from an industrial power supply and regulate it to an operating value required by the electric degaussing windings to perform the degaussing cycle.

In a further still example, the end of arm magnetic coupling tool further comprises visual status indicators, preferably in form of one or more LEDs which are driven by the microprocessor to indicate when a predefined one of the tool status is present or absent, including when the magnetic flux source is on or off and when a degaussing cycle is being performed.

In a yet further example, the degaussing electrical windings and exchangeable pole extension shoe members form modular units attachable to the first housing component, wherein the pole extension shoe members form part of a magnetic flux delivery circuit of the EOAMT when used in magnetically coupling the EOAMT with a work piece, and wherein the pole extension shoe members form part of an electromagnet comprising the degaussing windings in degaussing the work piece.

Other aspects and optional and/or preferred embodiments will become apparent from the following description provided below with reference to the accompanying drawings.

DETAILED DESCRIPTION OF THE DRAWINGS

In the figures as well as in the preceding section of this specification, terms such as 'upper', 'lower', 'axial' and other terms of reference are used to facilitate an understanding of the technology here described and are not to be taken as absolute and limiting reference indicators, unless the context indicates otherwise. The terms "couples", "coupled", "coupler" and variations thereof are used to include both arrangements wherein the two or more components are in direct physical contact and arrangements wherein the two or more components are not in direct contact with each other (e.g., the components are "coupled" via at least a third component), but yet still cooperate or interact with each other.

Figure 1:
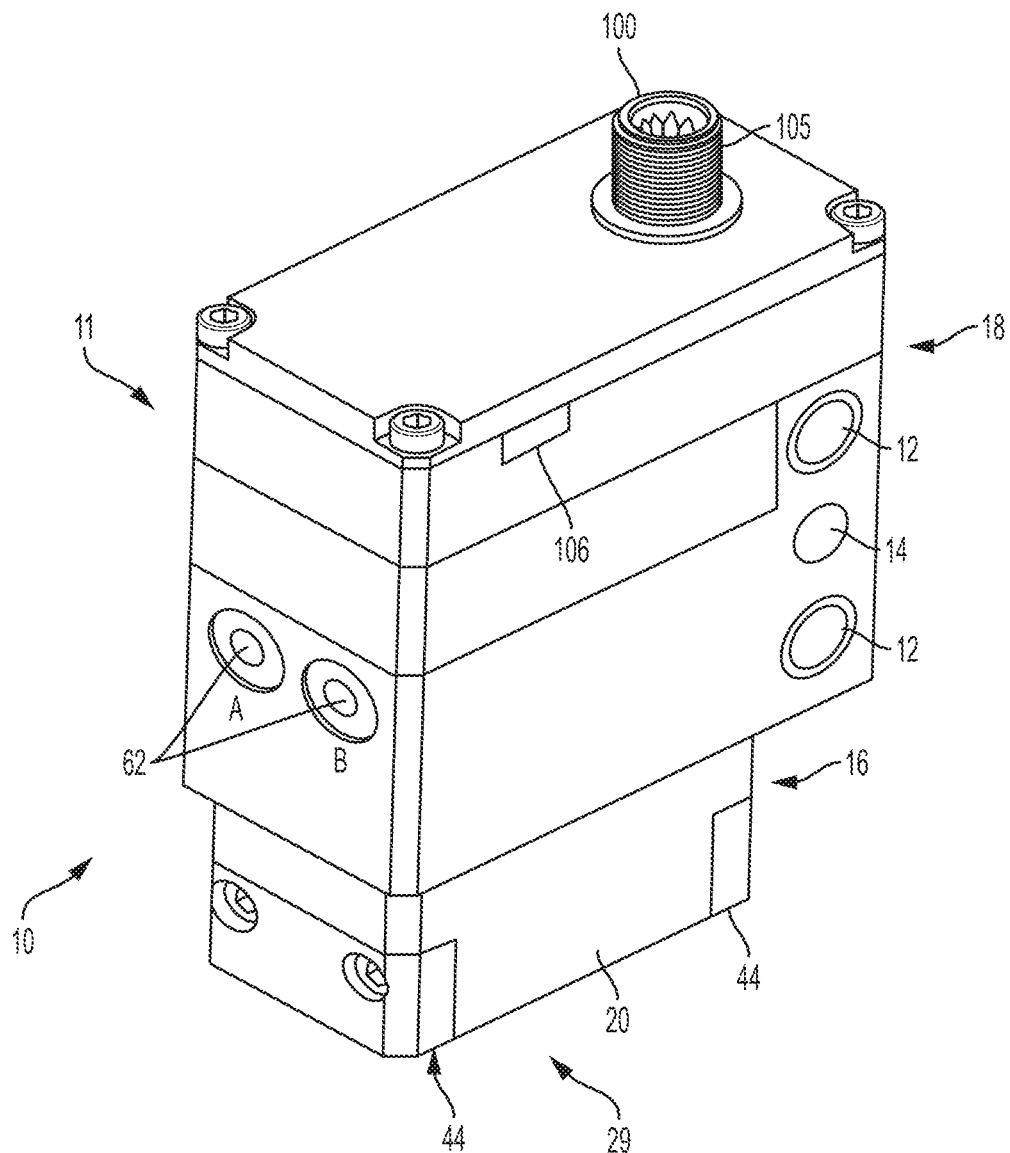
FIG. 1 illustrates a perspective view of an exemplary end-of-arm magnetic coupling tool.

Referring to FIG. 1 an exemplary magnetic coupling tool 10 is shown. Magnetic coupling tool 10 is configured to magnetically couple a ferromagnetic workpiece 17 (see FIG. 21). Magnetic coupling tool 10 is described herein for use as an end of arm ("EOAMT") unit for a robotic system, such as robotic system 700 (see FIG. 25), but may also used with other lifting and transporting systems for ferromagnetic materials. Exemplary lifting and transporting systems include robotic systems, mechanical gantries, crane hoists and additional systems which lift and/or transport ferromagnetic materials. Additionally, magnetic coupling tool 10 may also be used as part of a stationary fixture for holding at least one part for an operation, such as welding, inspection, and other operations. Logic control circuit 23 by monitoring sensors 98 is able to verify that the part being held on the stationary fixture is in a correct position.

Figure 2:
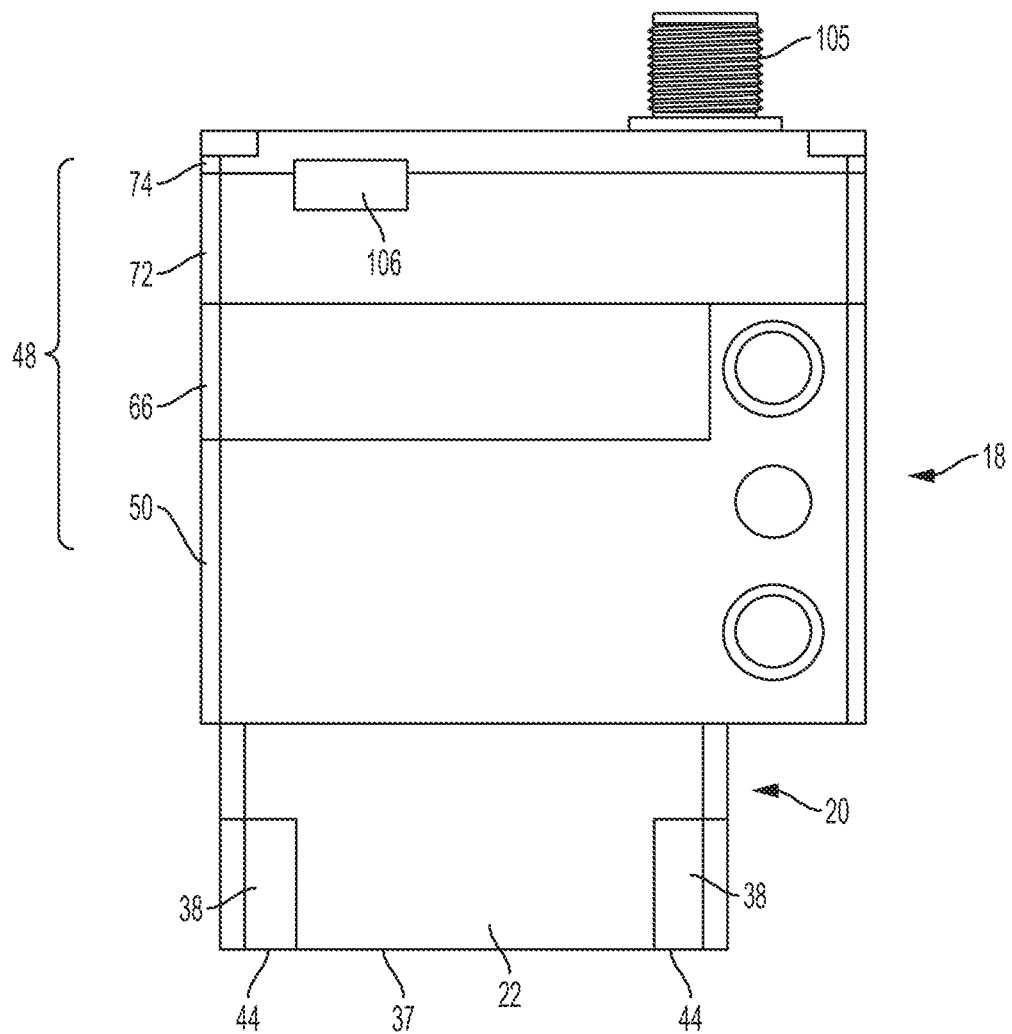
FIG. 2 illustrates a side elevation of the end-of-arm magnetic coupling tool of FIG. 1.
Figure 3:
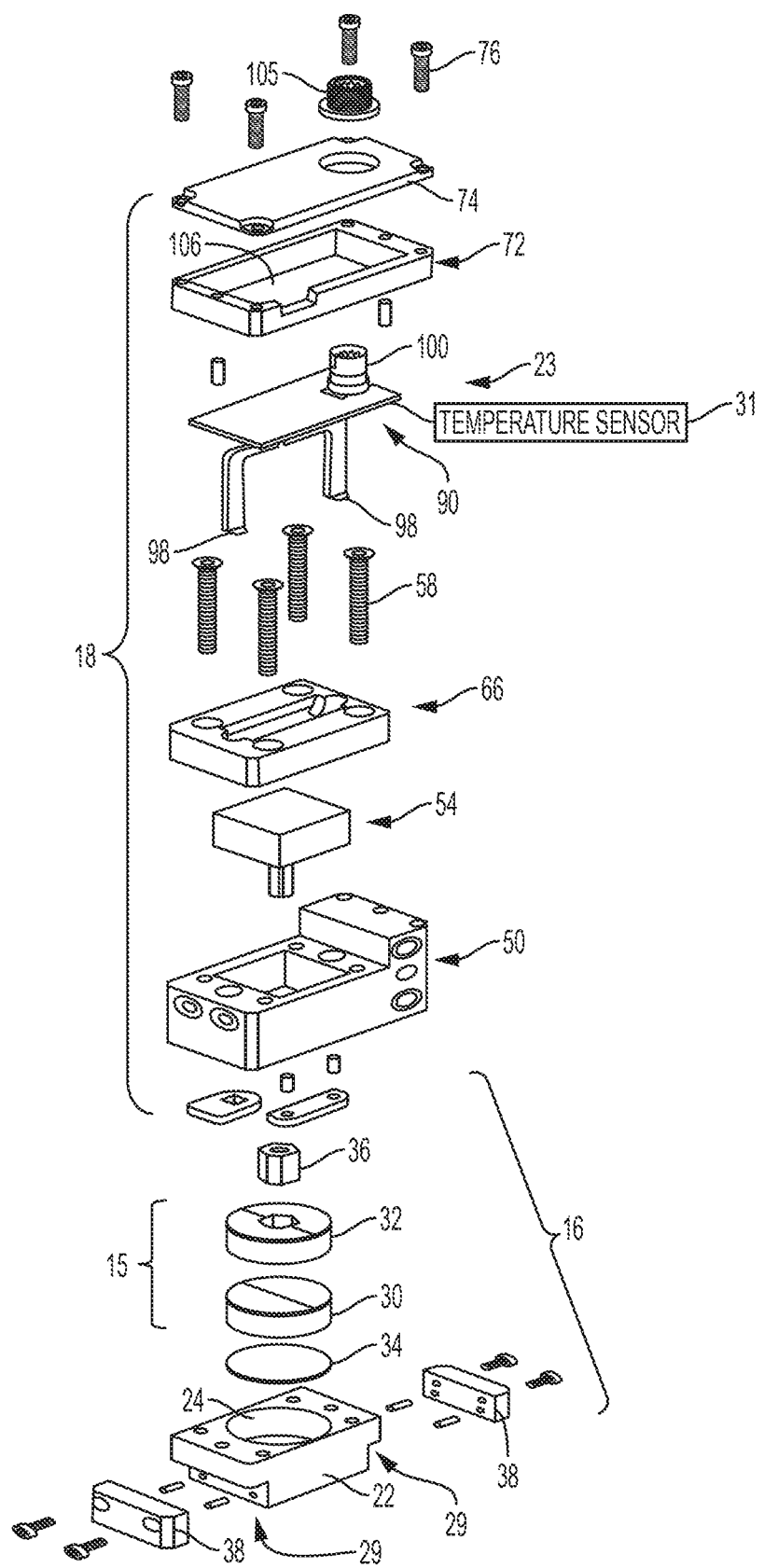
FIG. 3 illustrates an exploded perspective view of the end-of-arm magnetic coupling tool of FIG. 1.

Referring to FIGS. 1-3, magnetic coupling tool 10 includes a housing 11 and a switchable magnetic flux source 15 (see FIG. 3) supported by housing 11. The switchable magnetic flux source 15 includes a plurality of permanent magnets, illustratively permanent magnets 30, 32 (see FIG. 3). The plurality of permanent magnets including a first permanent magnet 30 and a second permanent magnet 32 movable relative to the first permanent magnet 30. First permanent magnet 30 being held fixed relative to housing 11. Magnetic coupling tool 10 further including a plurality of workpiece engagement surfaces 44 supported by housing 11. The plurality of workpiece engagement surfaces 44 being magnetically coupled to switchable magnetic flux source 15. The plurality of workpiece engagement surfaces 44 adapted to contact the ferromagnetic workpiece 17 (see FIG. 21). A first workpiece engagement surface 44 of the plurality of workpiece engagement surfaces corresponding to a north pole of the magnetic coupling tool 10 and a second workpiece engagement surface 44 of the plurality of workpiece engagement surfaces corresponding to a south pole of the magnetic coupling tool 10.

Magnetic coupling tool 10 further includes a plurality of magnetic field sensors 98 (see FIG. 3) supported by housing 11. A first magnetic field sensor 98 of the plurality of magnetic field sensors positioned to monitor a first magnetic flux associated with the first workpiece engagement surface 44 of the plurality of workpiece engagement surfaces and a second magnetic field sensor 98 of the plurality of magnetic field sensors positioned to monitor a second magnetic flux associated with the second workpiece engagement surface 44 of the plurality of workpiece engagement surfaces. Magnetic coupling device 10 further including a logic control circuit 23 operatively coupled to the plurality of magnetic field sensors 98. Logic control circuit 23 is configured to determine at least one operating state of magnetic coupling tool 10 based on an output from at least one of the plurality of magnetic field sensors 98.

In the illustrated embodiment of FIGS. 1-11, magnetic coupling device 10 is an end of arm magnetic coupling tool (herein "EOAMT") devised for magnetically securing a ferromagnetic workpiece 17 to a working face 44 of the tool 10. The end of arm magnetic coupling tool 10 comprises an on-off switchable magnetic flux source 15; a first housing component 22 of housing 11 in which is received the magnetic flux source 15; and at least two, magnetic pole extension shoes 38 each having each a workpiece engagement surface 44 and a flux detection surface 46 at an end opposite to the workpiece engagement surface 44. Pole extension shoes 38 are mounted to or at least partially form integral part of the first housing component 22 such as to receive magnetic flux from the magnetic flux source 15 and to make such received magnetic flux available at the workpiece engagement surfaces 44. In embodiments, workpiece engagement surfaces 44 are part of housing 22. Tool 10 further includes a number of magnetic field detection sensors 98. In embodiments, the number of magnetic field detection sensors is equal in number to the number of pole extension shoes 38 and/or workpiece engagement surfaces 44. Each of the magnetic field detection sensors 98 is located a predetermined distance away, but in close proximity to the flux detection surface of an associated one of the pole extension shoes 38. In one example, the magnetic field detection sensors 98 are positioned within respective pole extension shoes 38. In the illustrated embodiment, magnetic field detection sensors 98 are positioned above respective pole extension shoes 38. The tool 10 further comprising logic control circuit 23 which is operative to receive an output signal from one or more of the magnetic field detection sensors 98 and determine from said output signal (s) at least one of the following operating states of the tool: whether the magnetic flux source 15 is switched on or off, whether there is a ferromagnetic workpiece 17 in spatial proximity to one or more of the workpiece engagement surfaces 44 at the pole extension shoes 38, whether one or more of the workpiece engagement surfaces 44 at the pole extension shoes 38 abut a workpiece 17, and whether abutment of a workpiece 17 at one or more of the workpiece engagement surfaces 44 is adequate and within predetermined positioning thresholds.

In embodiments, the first magnetic field sensors 98 and the logic control circuit 23 are housed/received within a further (second) housing component 18 which itself may be of multi-piece construction and which is coupled/secured to the first housing component 22, such as to provide a compact-footprint end of arm magnetic coupling tool 10 with integrated magnetic field detection and workpiece—tool interface detection capabilities.

In embodiments of the end of arm magnetic coupling tool 10, the magnetic flux source 15, the first housing component 22 and the pole extension shoes 38 are based around on-off switchable, dipole permanent magnet units as developed by the Magswitch Group (of which the applicant is part of). In particular, modified Magswitch 'AR' series switchable magnetic flux sources may be used.

In embodiments, the first housing component 22 is a rectangular prism ferromagnetic steel housing component with a central cylindrical bore 24, in which two cylindrical, diametrically polarized rare-earth permanent magnets 30, 32 are stacked (the latter providing the on-off switchable magnetic flux source). One of the magnets 30 is fixed against rotating within the cylindrical bore 24, while the other magnet 32 is free to rotate upon external torque application using a suitable actuator 54 (pneumatic, hydraulic, or electric) interfaced with the rotatable magnet 32. The steel housing 22 has a substantially rectangular foot print, wherein the central bore 24 is centered in the housing 11 and dimensioned such that only thin wall webs connect the opposing thick walled housing halves that provide integral pole extension pieces of the device, as described in U.S. Pat. No. 6,707,360, the entire disclosure of which is expressly incorporated by reference herein. The lower magnet 30 is secured in the housing component 22 with the N-S pole separation plane extending (bridging) between the thin wall webs, so that the N- and S-poles of the magnet are extended into the respectively adjacent thick wall portion of the housing component 22 (see FIG. 4).

When rotatable magnet 32 is rotated relative to fixed magnet 30 to align the N- and S-poles of the two magnets 30, 32, the steel housing 22 becomes magnetically polarized, i.e. the housing itself provides part of or both of the pole extension shoes to redirect the flux from the magnets 30, 32 towards the two, magnetically separated workpiece engagement surfaces 44 provided at one axial end of the housing at the lower surfaces of pole extension shoes 38. This, in turn, allows a magnetic circuit to form between the two opposing sides of the steel housing 22. This turns the dipole flux source "on", i.e. an on state. When rotatable magnet 32 is rotated relative to fixed magnet 30 to partially, but not completely align the N- and S-poles of the two magnets, the steel housing 22 becomes magnetically polarized, i.e. the housing 22 itself provides part of or both of the pole extension shoes to redirect the flux from magnets 30, 32 towards the two, magnetically separated workpiece engagement surfaces 44 provided at one axial end of the housing 22 at the lower surfaces of the pole extension shoes 38. This in turn allows a magnetic circuit to form between the two opposing sides of steel housing 22. The magnetic flux available at workpiece engagement surfaces 44 is reduced compared to the on state and approaches the magnetic flux available at the workpiece engagement surfaces 44 of the on state the more aligned the N- and S-poles of the two magnets 30, 32 become. This turns the dipole flux source 15 "partially on", i.e. a partial on state. When top magnet 32 is rotated relative to fixed lower magnet 30 to anti-align the N- and S-poles, the magnetic circuit is closed within the housing 22, tuning the unit "off", i.e. an off state, and effectively no usable magnetic flux can be "tapped" by a target workpiece 17 when brought into contact with the workpiece engagement surfaces 44, as would otherwise be the case in the on state or the partial on state of the unit 10.

In embodiments, placement of magnetic field detection sensors 98 relative to the pole extension shoes 38 provides a sensing system for the switchable magnetic source 15. No matter what switching state (on state, partial on state, off state) the switchable dipole permanent magnet unit 15 is in, there is always some magnetic field present outside the vicinity of the workpiece engagement surfaces 44 on the lower side of the pole extensions shoes 38, providing "leakage flux" pathways. This leakage may be very small in the off state of the switchable permanent magnet unit 15, and could be confined. Relevantly though, the amount of leakage flux is heavily dependent on the internal magnetic circuit of the unit 10 itself, the on/partial on/off state of the unit 10, and the magnetic circuit formed between the unit 10 and the specific target workpiece 17.

When the unit 10 is in the off state wherein the two magnets 30, 32 are anti-aligned and forming a closed magnetic circuit inside of the steel housing 22, the unit 10 has very little leakage flux, though detectable with sensitive magnetic field sensors 98 when properly placed. When the unit 10 is in the on state wherein the two magnets 30, 32 are aligned and in absence of a fully shunting target workpiece 17 at or in proximity of the workpiece engagement surfaces 44 there is a much higher level of leakage flux. When the unit 10 is in the partial on state the level of leakage flux is less than in the on state and more than in the off state.

Further, in the on state or the partial on state, the amount of leakage flux is also determined by the quality of the working magnetic circuit formed between the pole shoes 38 of the unit 10 and workpiece 17 at the workpiece engagement surfaces 44, and the size, shape and material of the workpiece 17 itself. The quality of this magnetic circuit is determined primarily by the thickness and relative magnetic permeability of the workpiece material, and the quality of contact between the magnet through the workpiece engagement surfaces 44 and the workpiece 17. The higher quality the magnetic circuit is the less leakage flux there is to be detected on the side of the pole shoes 38 interacting with the workpiece 17. The quality of the magnetic circuit is increased the thicker the workpiece 17 is, the higher the workpiece's relative magnetic permeability, and the larger area of the contact between the pole shoes 38 and the workpiece 17.

These 'leakage' effects allow for the magnetic field sensors 98 to monitor and derive various operational states of unit 10 incorporating Magswitch switchable permanent magnet units or other suitable switchable magnet units. Magswitch "AR" series devices are normally designed for use with detachable pole shoes 38. Pole shoe size and geometry can be selected to suit application fields and dual purpose pole shoes 38 providing two differently contoured workpiece engagement surfaces at opposite axial ends may be employed. Additional pole shoe arrangements are disclosed in U.S. Provisional Patent Application No. 62/623,407, filed Jan. 29, 2018, titled MAGNETIC LIFTING DEVICE HAVING POLE SHOES WITH SPACED APART PROJECTIONS, docket MTI-0015-01-US, the entire disclosure of which is expressly incorporated by reference herein.

In embodiments, a lower part of the first housing component 22 (which is quadrilateral in cross-section), where the lower fixed magnet 30 is located, is recessed or machined on opposite external sides (i.e. at the thick walled portions) to provide respective shape-conforming receptacles or recesses 29 for two ferromagnetic pole shoes 38. In embodiments, the external shape of the two pole shoes 38 is chosen to provide four continuous and step-free external faces of the housing 11 when mounted thereto, i.e. these are rectangular prismatic or cuboid in shape.

The upper, un-recessed part of the first housing component 22 and the lower part of the first housing component with the exchangeably attached cuboid pole shoes 38 form a continuous, as flux-leakage free as possible flux delivery path towards the workplace engagement surfaces 44 provided at the free axial terminal ends of the pole shoes 38. In this case also, the flux detection surfaces 46 opposite the workpiece engagement surfaces 44 will be provided at an upper terminal face of the first housing component 22, given the gap free mounting of the pole shoes 38 at the receptacles. Pole shoes 38 may be lengthened to locate workpiece engagement surfaces 44 below a lower side 37 (see FIG. 3) of housing component 22.

In embodiments, the EOAMT 10 will comprise, in addition to the first housing component 22, a second housing component 18 secured to an end of the first housing component opposite the workpiece engagement surfaces 44 of the pole extension shoes 38. The second housing component 18 is substantially non-ferromagnetic and includes at least two passage ways 70 (see FIG. 5) extending preferably to terminal openings located opposite the flux detection surfaces 46 at the first housing component 22 and receiving a respective one of two said first magnetic field detection sensors 98. This arrangement protects the sensors 98 from external damage while equally ensuring that magnetic flux leakage from the flux detection surfaces 46 at the first housing component 22 is sampled with minimal interference of other ferromagnetic components that could distort the magnetic field.

For sturdiness considerations, and noting the need for the second housing component 18 to have magnetic properties that do not substantially adversely affect shaping (e.g. bundling) of magnetic field lines passing through the flux detection surfaces 46 at the first housing component 22, aluminum alloys are a preferred material choice, and non-ferrous stainless steel could be used as well. Equally, suitable impact resistant polymer materials (reinforced if desired) having the necessary low relative magnetic permeability values, can also find use. In this context, low relative magnetic permeability is one which is 4 to 6 orders of magnitude lower than that of the material used in the manufacture of the pole shoes 38 and the first housing component 22. In embodiments, the first housing component 22 and the pole shoes 38 are made from the same material.

The preferably also rectangular prismatic second housing component 18 can advantageously serve to house an actuator 54 which interfaces with the rotatable magnet 32 received in the first housing component 22 to switch the magnetic flux source 15 between an on state, an off state, and one or more partial on states, and to seal the bore 24 in which the magnets 30, 32 are received against infiltration of dust and water, in addition to housing the first sensors 98 in a protected manner against environmental influences.

In embodiments, the logic control circuit 23 is operative to receive output signals from the one or more of the first magnetic field (and any additional) detection sensors 98 and determine from said output signal(s) one or more of the operating states of the tool 10. In embodiments, the logic control circuit 23 comprises a central control board, preferably using a printed circuit board which contains a pre-programmed or programmable microprocessor, with analog to digital converters (ADCs) for sensor signal sampling and conditioning if required, and additional transistors that allow a GPIO (general-purpose input/output) of the processor to be interfaced to industrial 24V logic. The board wilt advantageously also host power conditioning, to take 24 V from an industrial power supply and regulate it to 5 or 3.3 V as normally used by industrial robotics microprocessors and circuit components, as well as provide the working voltage for the magnetic field sensors.

Figure 25:
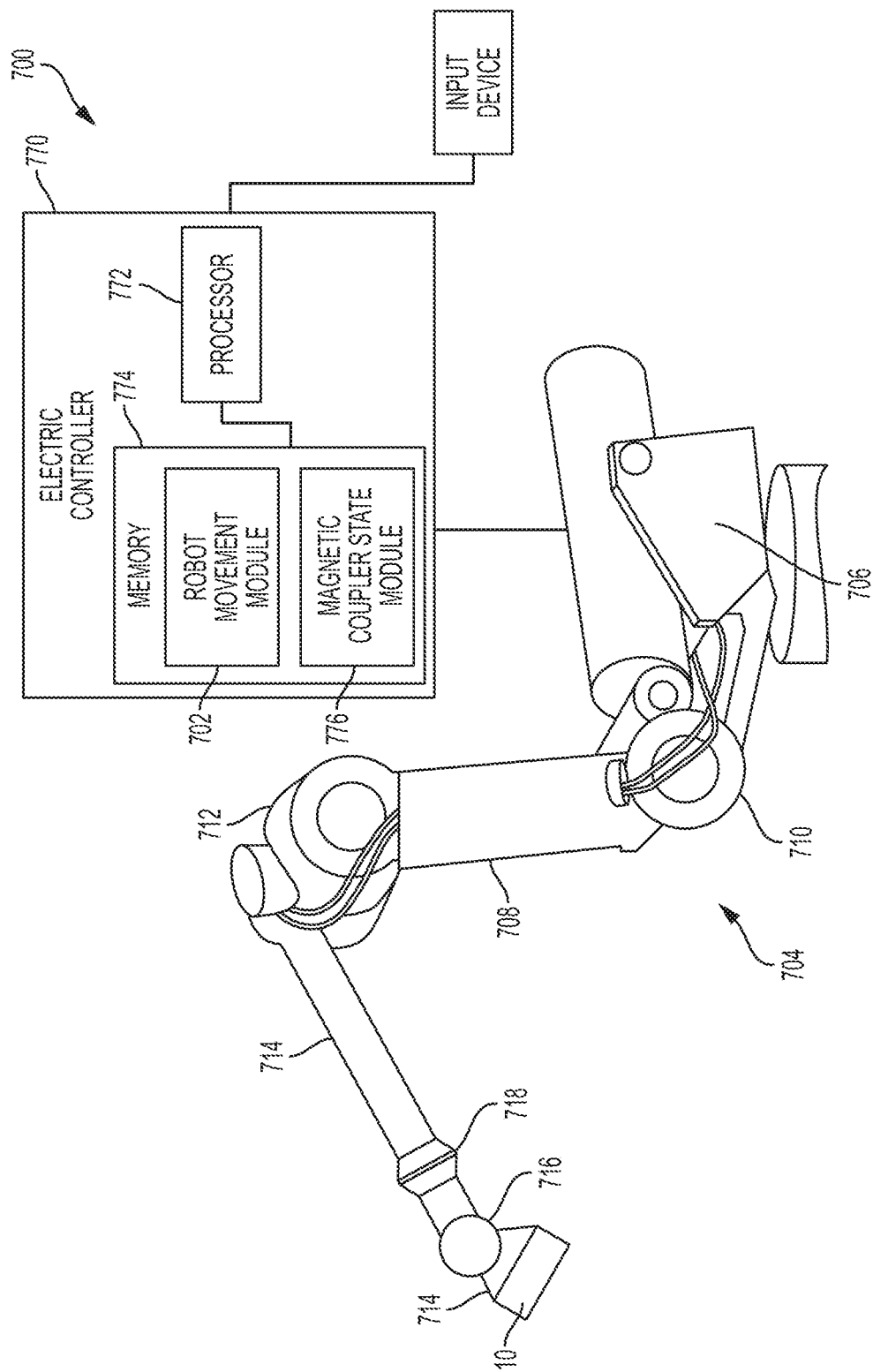
FIG. 25 illustrates a robotic system including the exemplary magnetic coupling device of FIG. 1 attached as an end of arm coupler.

In addition, the central control board may be provided with a series of blank headers, intended to accept a communications module that allows the control board to interface with external control electronics, such as robot controller 770 (see FIG. 25). This interface may be as simple as a discrete I/O connection, sending single bit On-Off signals over 24 V logic lines, or as advanced as a full industrial Ethernet connection.

As noted, the central control board will advantageously use ADCs for sensor signal sampling, but could equally incorporate direct analog inputs, with filtering and the required signal conditioning, that allow the microprocessor to receive and process signals from the first magnetic field sensors, but equally other sensors, e.g. temperature sensors 31, that may be incorporated into the first and/or second housing component.

The first magnetic field sensors 98 could be simple scalar magnetometers used to measure the total strength of a magnetic field. In embodiments, the magnetic field sensors 98 are preferably more complex and differentiating vector magnetometers, such as solid-state linear Hall Effect sensors, in particular of bi-directional type, magneto resistive sensors that can be incorporated in integrated circuits, etc. Linear Hall Effect sensors can have a very small form factor and embodied in solid state ICs (e.g. Honeywell SS39ET/SS49E/SS59ET series) and are therefore a preferred embodiment of the first magnetic field sensors. Because of the small form factor (e.g. 3×3×1.5 mm), it is possible to incorporate various Linear Hall Effect sensors having different magnetic field detection ranges and sensitivities, for example, in providing the first magnetic field sensors 98, and which using suitable logic circuitry can be switched so that the respective sensor output signals can be processed and if necessary combined to obtain a clearer picture of the magnetic field near the flux detection surfaces 46 of the pole extension shoes 38 of the EOAMT 10, if required. In embodiments, the magnetic field sensors 98 are three dimensional sensors having the capability to sense magnetic fields in three orthogonal directions. An exemplary magnetic field sensors is Model No. TLV493D-A1B6 three dimensional magnetic sensor available from Infineon Technologies AG located at Am Campeon 1-15, 85579 Neubiberg in Germany.

As noted, in embodiments additional sensors, such as temperature sensors 31 may be integrated in suitable cavities at the first housing component 22. An evaluation circuit (more precisely the software/program used in the microprocessor to perform signal evaluation and analysis) of the logic control circuit 23 will then compensate for temperature dependent drift of the magnetic field sensors 98 to yield more accurate EOAMT 10 positioning data.

Figure 14:
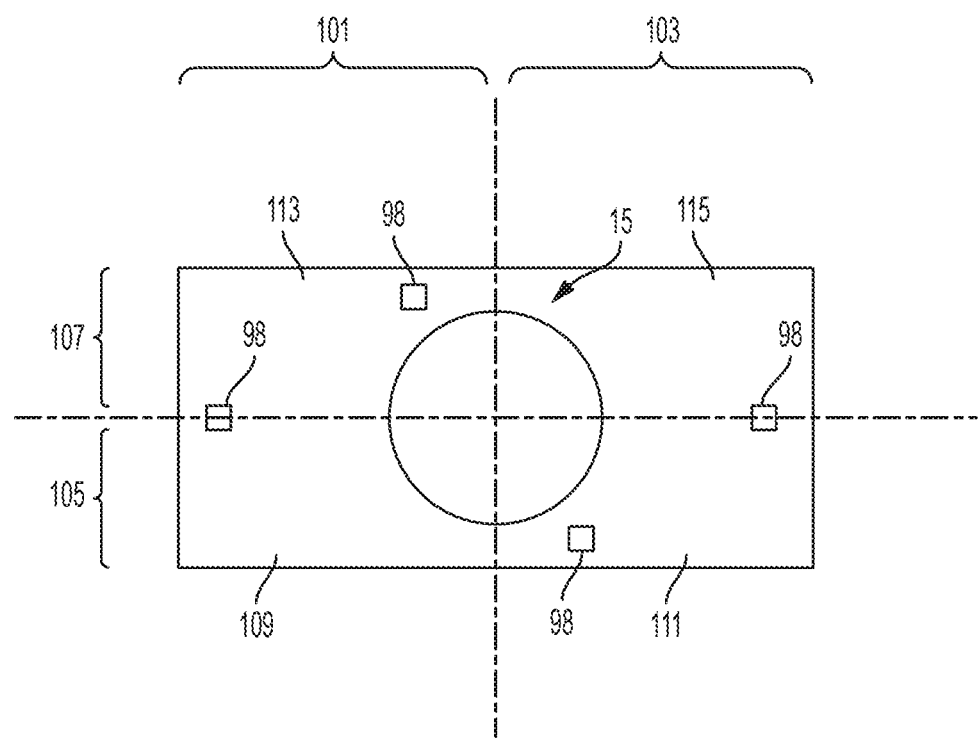
FIG. 14 illustrates a top view of an exemplary sensor layout of the end-of-arm magnetic coupling tool of FIG. 1.

Further, in embodiments, additional magnetic field sensors 98 are included. Referring to FIG. 14, a representative top view of unit 10, magnetic field sensors 98 are positioned as described herein with a first magnetic field sensor 98 being positioned in a left side half 101 of the magnetic coupling tool 10 and a second magnetic field sensor 98 being positioned in a right side half 103 of the magnetic coupling tool 10. Additionally, a third magnetic field sensor 98 is positioned in a front half 105 of the magnetic coupling tool 10 and a fourth magnetic field sensor 98 is positioned in a rear half 107 of the magnetic coupling tool 10. The front half 105 including a first portion 109 of the left side half 101 and a first portion 111 of the right side half 103. The rear half 107 including a second portion 113 of the left side half 101 and a second portion 115 of the right side half 103. The addition of the third and fourth magnetic field sensors 98 provides additional sensor values which may be used to determine various operating states of the magnetic coupling tool 10. For example, logic control circuit 23 based on the outputs of the four magnetic field sensors may determine an orientation of the workpiece engagement surfaces 44 relative to the ferromagnetic workpiece 17 in two rotational axes, such as left-to-right tilt and front-to-back tilt.

Figure 13:
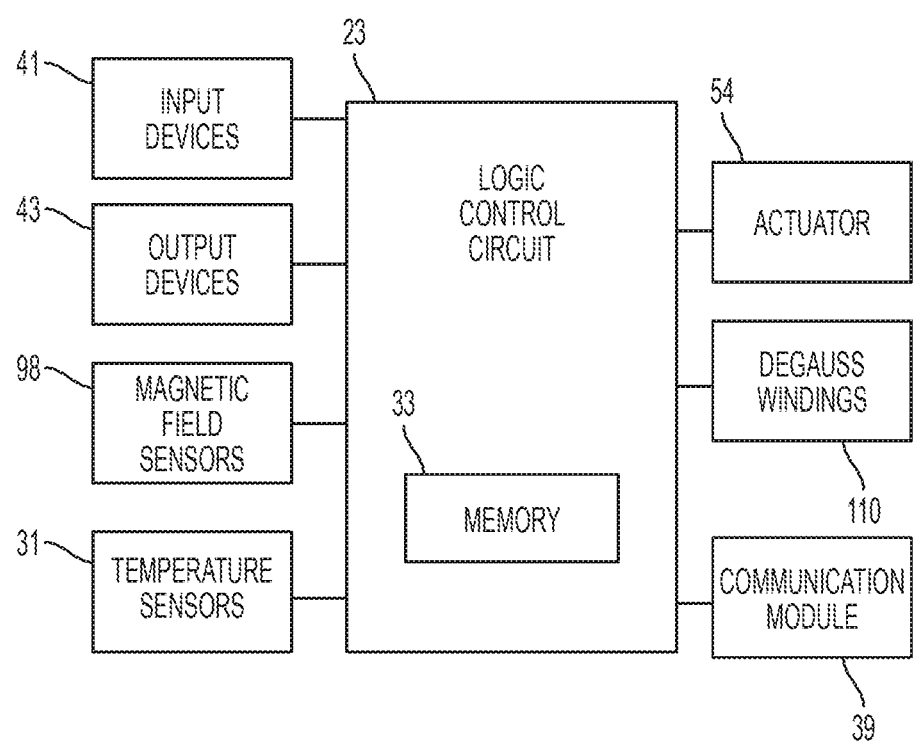
FIG. 13 illustrates a representative view of the logic control circuit of the end-of-arm magnetic coupling tool of FIG. 1.

Turning then to functional blocks of the logic control circuit 23. The simplest piece of information required about the EOAMT 10 is that of the switching state of the magnetic flux source 15 (unit), i.e. is the unit in the off state, the on state, or a partial on state. In the off state, the EOAMT 10 has extremely little or even no leakage flux. In the on state, even on a near perfect magnetic working circuit with a workpiece 17, the EOAMT's switchable permanent magnetic unit 15 has considerably more leakage flux than in the off state. Therefore, in a calibration process, the reading of one or more of the first magnetic field sensors 98 in the off state of the EOAMT 10 can be stored in a memory 33 (see FIG. 13) associated with the microprocessor of the logic control circuit 23 as a calibrated or hard coded value, and when the magnetometer reading rises above this off-state value, or some offset above this off-state value, the EOAMT 10 can be considered in the on state or a partial on state. When the magnetometer reading is at or close to the calibration stored value, the EOAMT 10 can be considered in the off state. In embodiments, through a calibration process, the reading of one or more of the first magnetic field sensors 98 in a desired partial on state may be stored in memory 33 as a calibrated or hard coded value, and when the magnetometer reading rises to a specific stored reading or within some percentage of the specific stored reading, the EOAMT 10 can be considered to be in the corresponding partial on state.

Figure 15:
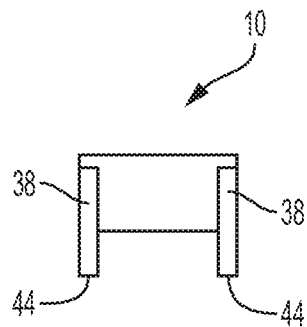
FIG. 15 illustrates a simplified front elevation view of the end of arm magnetic coupling device of FIG. 1 and no workpiece in the proximity of the end of arm magnetic coupling device.

Another functional block of the logic control circuit 23 may be used to determine if there is a ferromagnetic workpiece underneath one or both the workpiece engagement surfaces 44 of the two magnetic pole extension shoes 38 of the EOAMT 10, when the flux source unit is turned on or partially on. When no target part is present for the EOAMT to magnetically attach to (see FIG. 15), there is no 'true' (i.e. external working) magnetic circuit between the two pole shoes 38. Assuming that any workpiece 17 is sufficiently spaced apart from the pole shoes 38 so as to not distort the magnetic field, the flux would extend through air between the lower terminal ends of the pole shoes 38 (primarily between the workpiece engagement surfaces 44), effectively representing leakage flux. This also causes a high leakage flux to be present at the flux detection surfaces 46 of the pole extension shoes 38, and consequently a relatively high reading at the magnetic field sensors 98. By storing this "max leakage flux" for a given on state or partial on state in memory 33 associated with the microprocessor of the logic control circuit 23, either hard coded (given that this value would be invariable), or from a calibration run, in normal operation of the EOAMT 10 it is possible to determine if there is a workpiece present or not, by placing the magnetic switching unit in the on state or partial on state corresponding to the stored "max leakage flux" reference value and comparing a current sensor output with the stored "max leakage flux" reference value for the on state or the partial on state.

Figure 16:
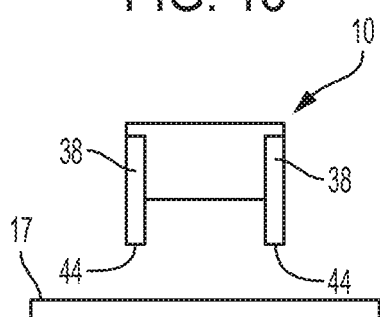
FIG. 16 illustrates a simplified front elevation view of the end of arm magnetic coupling device of FIG. 1 and a workpiece separated from the end of arm magnetic coupling device by a first separation.
Figure 17:
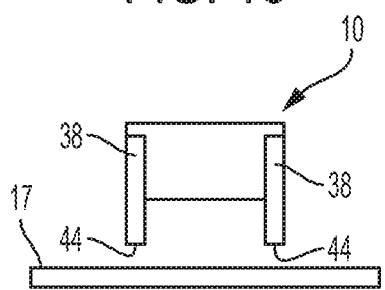
FIG. 17 illustrates a simplified front elevation view of the end of arm magnetic coupling device of FIG. 1 and a workpiece separated from the end of arm magnetic coupling device by a second separation.

In addition to detecting a presence or absence of workpiece 17, logic control circuit 23 may also provide an indication of a spacing of the workpiece engagement surfaces 44 from the workpiece 17 when the presence of a workpiece is detected (the current sensor value is below the stored "max leakage flux" for presence detection). In embodiments, logic control circuit 23, is configured to determine if at least one of the plurality of workpiece engagement surfaces 44 is proximate to the ferromagnetic workpiece 17. In one example, logic control circuit 23 determines if one of the workpiece engagement surfaces 44 is proximate to workpiece 17 when the current value for the corresponding sensor 98 falls below a threshold value. The threshold value may be determined and stored in memory 33 during a calibration run and may correspond to a known spacing between the workpiece engagement surface 44 and the workpiece 17 (see FIG. 16). In one embodiment, a plurality of threshold values are stored on memory 33, each corresponding to a respective known spacing. The plurality of stored threshold values permits logic control circuit 23 to provide better approximation of the spacing between the workpiece engagement surface 44 and the workpiece 17 and to distinguish between a first spacing (see FIG. 16) and a second, smaller spacing (see FIG. 17). An advantage, among others is that the ability to accurately determine proximity of a workpiece allows a robotic system (see FIG. 25) to move at a higher speed until magnetic coupling unit 10 is within a first spacing from workpiece 17 and thereafter move at a slower speed until contact is made with workpiece 17. In embodiments, for the various calibrations runs and values discussed herein, separate calibrations runs or values are performed for different types of ferromagnetic materials due to fact that target sensor readings may differ based on the respective size, shape, material, etc. of the target ferromagnetic workpiece.

Figure 18:
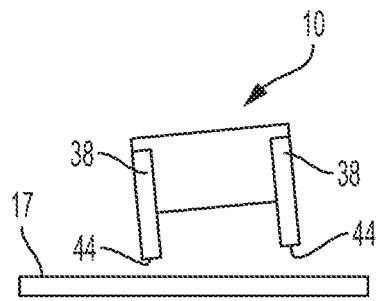
FIG. 18 illustrates a simplified front elevation view of the end of arm magnetic coupling device of FIG. 1 being tilted left-to-right relative to a workpiece.
Figure 19:
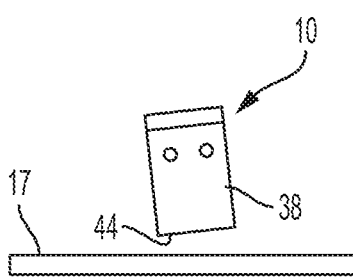
FIG. 19 illustrates a simplified front elevation view of the end of arm magnetic coupling device of FIG. 1 being tilted front-to-back relative to a workpiece.

In embodiments, logic control circuit 23 is configured to determine an orientation of the first workpiece engagement surface 44 and the second workpiece engagement surface 44 relative to the ferromagnetic workpiece 17. In one example, the orientation of the first workpiece engagement surface 44 and the second workpiece engagement surface 44 relative to the ferromagnetic workpiece 17 is determined by a comparison of an output of the first magnetic field sensor 98 and an output of the second magnetic field sensor 98. A first spacing between the first workpiece engagement surface 44 and the ferromagnetic workpiece 17 and a second spacing between the second workpiece engagement surface 44 and the ferromagnetic workpiece 17 are determined by logic control circuit 23 to be generally equal when the output of the first magnetic field sensor 98 and the output of the second magnetic field sensor 98 satisfy a first criteria. In one example, the first criteria is that the output of the first magnetic field sensor 98 is within a threshold amount of the output of the second magnetic field sensor 98. An example threshold amount is an absolute difference. In another example, the threshold amount is a percentage difference. When the first criteria is satisfied, the workpiece engagement surfaces 44 have generally equal spacing relative to the workpiece 17 (see FIG. 17). When the first criteria is not satisfied, the workpiece engagement surfaces 44 are angled relative to the workpiece 17 (see FIG. 18). If a third and fourth magnetic field sensor are incorporated, such as shown in FIG. 14, an angle about a pitch axis (see FIG. 19) may also be determined in addition to the angle about the roll axis depicted in FIG. 18.

In addition to these tool status and workpiece detection capabilities, the presence and specific location of at least two magnetic field sensors 98 in the specified location near the pole shoes 38, provides more advanced feedback. This is because situation-dependent, potentially uneven distribution of leakage flux around the individual pole extension shoes can be sampled, compared and evaluated.

In embodiments, in the on state (equally applicable to a known partial on state) of the magnetic flux source 15, if the workpiece engagement surfaces 44 of the pole extension shoe 38 with the magnets' North Poles has good contact with a workpiece 17, but the pole extension shoe 38 with the magnets' South Poles has poor contact with the workpiece 17 (see FIG. 20), there will be more leakage flux on the South Pole than the North Pole. The first magnetic field sensor 98 above the North Pole and the first magnetic field sensor above the South Pole 98 are able to detect this condition, and the sensor 98 above the South Pole will return a higher reading than the sensor 98 above the North Pole. In one example, bidirectional Hall Effect sensors are used for sensors 98. Therefore, by reading each sensor 98 separately and comparing the readings between them, logic control circuit 23 is able to determine that the South Pole has poor contact on the workpiece 17. In embodiments, the logic control circuit has a functional block to perform such evaluation, implementable in hardware and microprocessor software. In one example, logic control circuit 23 determines the South Pole has poor contact when a difference in the readings of the North Pole sensor 98 and the South Pole sensor 98 exceed a stored threshold amount.

Figure 21:
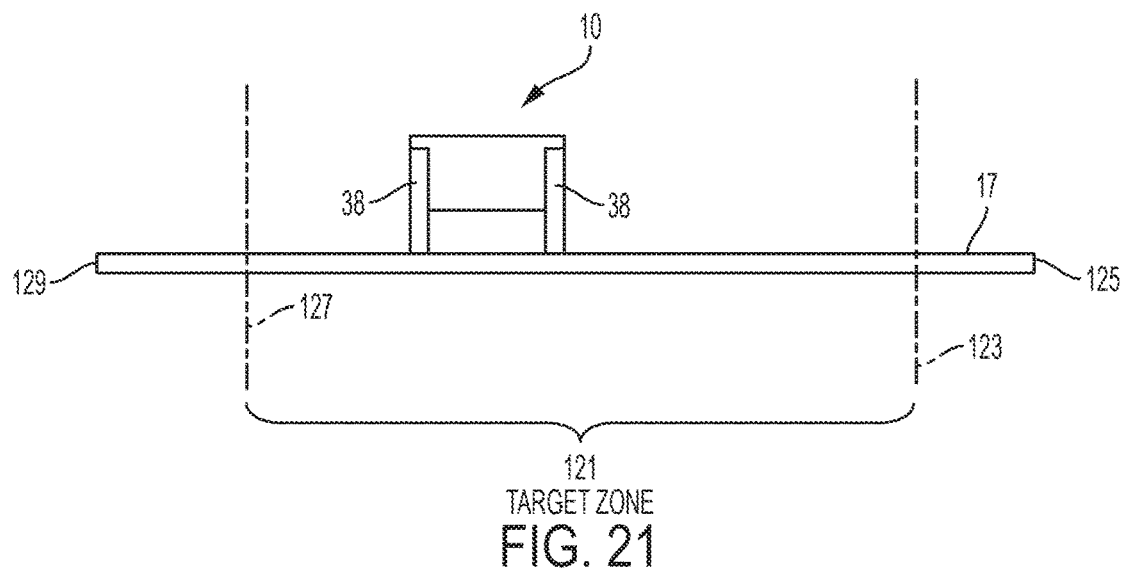
FIG. 21 illustrates a simplified front elevation view of the end of arm magnetic coupling device of FIG. 1 contacting a central portion of a workpiece.

In embodiments, logic control circuit 23 is configured to determine if a placement of the first workpiece engagement surface 44 and the second workpiece engagement surface 44 relative to the ferromagnetic workpiece 17 are within a target zone 121 on the ferromagnetic workpiece 17 (see FIG. 21). In one example, the placement of the first workpiece engagement surface 44 and the second workpiece engagement surface 44 relative to the ferromagnetic workpiece 17 are determined by logic control circuit 23 to be within the target zone 121 (FIGS. 21-23) of the ferromagnetic workpiece 17 when both an output of the first magnetic field sensor 98 satisfies a first criteria and an output of the second magnetic field sensor 98 satisfies a second criteria. An exemplary first criteria is that the output of the first magnetic field sensor 98 is within a first range of magnetic flux values and an exemplary second criteria is the output of the second magnetic field sensor 98 is within a second range of magnetic flux values.

Figure 22:
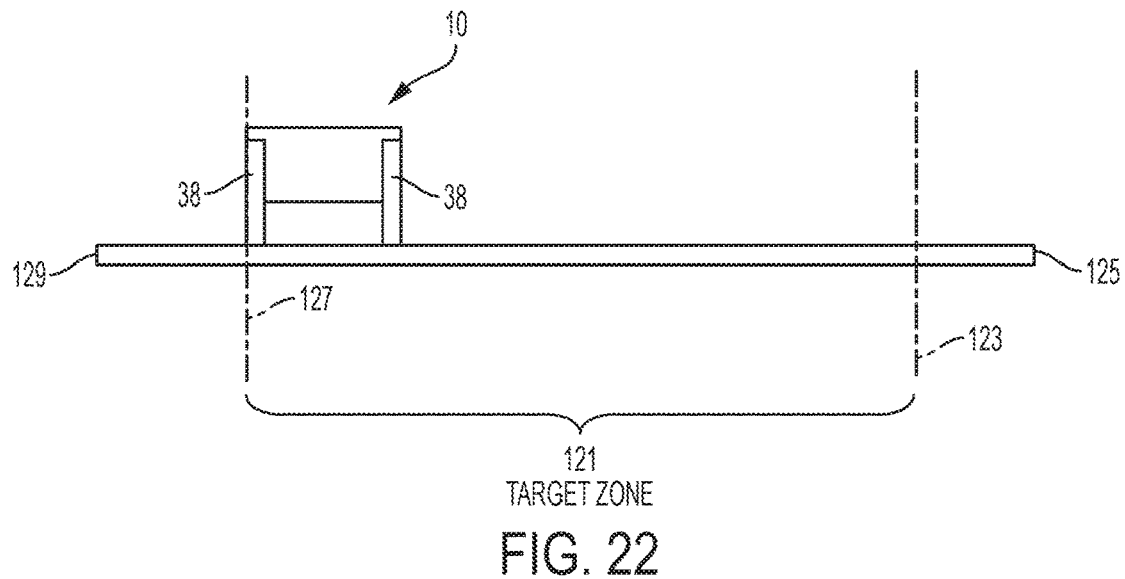
FIG. 22 illustrates a simplified front elevation view of the end of arm magnetic coupling device of FIG. 1 contacting a workpiece at a first limit position.
Figure 23:
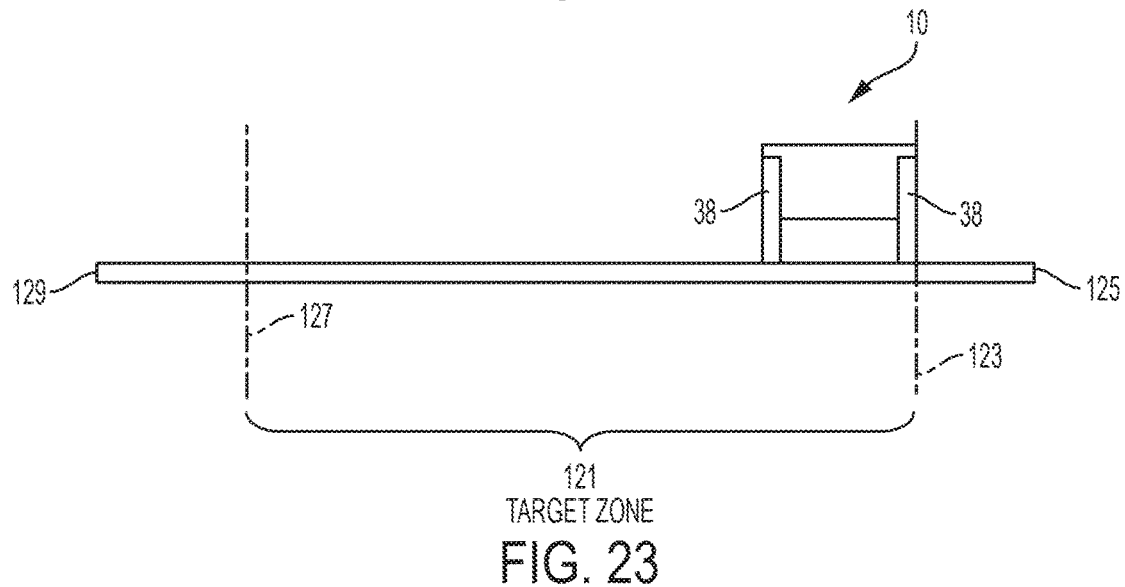
FIG. 23 illustrates a simplified front elevation view of the end of arm magnetic coupling device of FIG. 1 contacting a workpiece at a second limit position.

Referring to FIGS. 21-23, target zone 121 is illustrated. Workpiece 17 is illustrated as a sheet of material having a right end 125 and a left end 129. Target zone 121 is the portion of workpiece 17 between a first offset 123 from the right end 125 of workpiece 17 and a second offset 127 from the left end 129 of workpiece 17. In one example, as tool 10 approaches and/or exceeds second offset 127, the leakage flux associated with the left pole extension shoe 38 is higher than the leakage flux associated with the right pole extension shoe 38 due to the left pole extension shoe approaching left end 129 of workpiece 17. In similar fashion, as tool 10 approaches and/or exceeds first offset 123, the leakage flux associated with the right pole extension shoe 38 is higher than the leakage flux associated with the left pole extension shoe 38 due to the right pole extension shoe approaching right end 125 of workpiece 17. Although shown as a linear target zone 121, a two-dimensional target zone 121 may be defined for a length and a width of workpiece 17. In one example a calibration run is executed wherein tool 10 is placed at each of first limit 123 (see FIG. 23) and second limit 127 (see FIG. 22) and the corresponding leakage flux values for the magnetic flux sensors 98 at both limits are stored in memory 33. The two leakage flux values stored for the first limit position (see FIG. 23) are stored in memory 33 as "Limiting Position 1" (two values, one for each sensor 98). The two leakage flux values stored for the second limit position (see FIG. 22) are stored in memory 33 as "Limiting Position 2" (two values, one for each sensor 98). In embodiments, the first range of the first criteria are the values between and including Limiting Position 1 and Limiting Position 2 for one of the magnetic field sensors 98 and the second range of the second criteria are the values between and including Limiting Position 1 and Limiting Position 2 for the other of the magnetic field sensors 98. Assuming the first range of values correspond to the left side sensor 98 of unit 10 and the second range of values correspond to the right side sensor 98 of unit 10, logic control circuit 23 determines that a left end of the tool 10 is positioned outside of the target zone 121 when the second criteria is satisfied and the first criteria is not satisfied and likewise that a right end of the tool 10 is positioned outside of the target zone 121 when the first criteria is satisfied and the second criteria is not satisfied.

In embodiments, using (storing) 'Limiting Position 1' and Limiting Position 2' calibrated values on memory 33 allows a tool user to calibrate the workpiece present signal to only come on when a specific magnetic work circuit is formed (if calibrated as the same position) or within a range of magnetic working circuits (if calibrated as 2 different positions). The North and South pole signal positions can either be the equivalent of the "max leakage" position of Limiting Position 1/2 or it can be outside of that in a greater leakage position. These calibrations are what allow for so called double blank detection (DBD) and part specific or range specific confirmation. The freedom for the North and South pole positions to be outside of the limiting positions is intended to give the user more freedom, especially if they are landing near edges on thinner steel sheets.

In embodiments, it is also possible to use this multisensory approach to provide additional tool status data. In the above situation, beyond just comparing the two sensor readings to determine a general state of the tool and the presence or absence of a workpiece in proximity of the workpiece engagement surfaces of the pole extension shoes, by taking more differentiated and precise magnetic field measurements from each sensor when in closer proximity to the workpiece (i.e. presence already detected, but proximity not yet quantified) and performing calculations on the value of each sensor's signal and the value of the difference between the magnetometer readings, one can determine the orientation of the tool relative to the workpiece, such as what angle a magnet gripper including the tool 10 is sitting relative to a flat steel workpiece.

Taking this even further, using calibration runs of tool 10 with respect to a predefined workpiece having known parameters (size, shape, material, etc.) and by storing into memory of the evaluation circuit data obtained from processing of sensor output signals during the various calibration runs, it is possible to completely determine the orientation and distance to a workpiece target surface relative to the EOAMT position, even before the pole extension shoes contact the workpiece, in particular if additional magnetic field sensors are placed in locations other than the ones previously specified, such as shown in FIG. 14. As the unit 10 emits leakage flux in any state, even the off state, very sensitive sensors can respond to small variations in the leakage flux emanating from the pole shoes at the sensor detection surfaces in the off state. When an EOAMT in the off state or a known partial on state approaches a workpiece, then, adequately sensitive magnetometers can indicate proximity to component, and can deliver signals which are converted into control signals for the robotic arm in acting as a sort of "vision" for an otherwise blind robot.

For example, assuming that a total of four magnetometers are present, one at the flux detection surface of the North pole shoe and one at the flux detection surface of the South pole shoe associated with the magnetic flux source, as previously noted, and two additional sensors at other locations, such as shown in FIG. 14, when moving the EOAMT towards the workpiece with one of the sensors moving closer (in absolute terms) than the others, leakage flux lines near that sensor would increase in density, focusing themselves toward the workpiece. In bringing the EOAMT even closer to the workpiece (without changing spatial attitude and translational direction of the housing component coupled to the end of the arm of the robot, the flux lines would redistribute more intensely across the housing component, with the density of flux lines on the nearest sensor being inversely proportional to the distance between the sensor and the workpiece. This produces an even higher reading in the magnetometer over the close-proximity sensor. By comparing the close proximity magnetometer output to the signal output from the other 3 magnetometers, and by evaluating the data one can tell where and how close the workpiece is to the working faces of the EOAMT, given the known spatial relationships between the sensors and the working face of the pole extension shoes.

In performing accurate calculations on the outputs of the magnetometers of the EOAMT, other functionalities can be enabled when the magnetic flux source is switched on and contact is established with the workpiece. There is a direct relationship between the amount of magnetic flux in a working magnetic circuit, and the amount of physical force that the working magnetic circuit can withstand, which in the case of a magnetic coupling tool corresponds to the tool's payload. As the leakage flux from a permanent magnet depends on how much of the magnetic flux is 'consumed' (i.e. bound) in the primary working circuit, there is a correlation between the leakage flux and the maximum payload that can be sustained by the coupling tool. The microprocessor of the logic control circuit 23 is programmed, in one embodiment, with the appropriate formulae and calibration runs can be performed such that the combined readings of the magnetometers on the tool can be used to derive a more exact holding force of the EOAMT than with known devices. This could be used as a "safety check" to make sure that the EOAMT is able to lift the workpiece before being moved by the robot.

In all of these situations, the microprocessor of the logic control circuit 23 is responsible for accepting input from each of the magnetometers 98 of the EOAMT and performing calculations and comparisons. The microprocessor then determines various tool states based upon the calculations. In embodiments, tool 10 communicates the determined tool states and feedback points to an external robot controller 770 (see FIG. 25). This is handled by either the 24V I/O or a communications module 39. Once the feedback has been communicated to the robot controller 770, the robot controller 770 is then able to adjust an orientation of tool 10 and operation to address challenges or issues in operation.

It will be appreciated that the logic control circuit 23 comprises the required components to perform isolation, filtering and amplification of signals provided by the sensors for processing by the on-board microprocessor of the EOAMT 10.

In embodiments, the EOAMT 10 incorporates input devices 41 and output devices 43. Exemplary input devices include buttons, switches, levers, dials, touch displays, soft keys, and communication module 39. Exemplary output devices include visual indicators, audio indicators, and communication module 39. Exemplary visual indicators include displays, lights, and other visual systems. Exemplary audio indicators include speakers and other suitable audio systems. In embodiments, tool 10 includes simple visual status indicators, in the form of one or more LEDs positioned behind LED window 106, which are driven by the microprocessor of logic control circuit 23, to indicate when a predefined Tool status is present or absent (e.g. Red LED on when magnetic flux source 15 is off, Green LED blinking fast when magnetic flux source 15 is on and proximity of target 17 is detected, Green LED slower blinking with Yellow LED on when contacting target 17 outside intended specific area 121 on target 17 (e.g. partially complete magnetic working circuit) and Yellow LED off with steady Green LED on, showing tool engagement within threshold limits, showing safe magnetic coupling state.

Referring to the FIGS. 1-29, additional details regarding embodiments of tool 10 are provided. Referring to FIGS. 1 and 2, an embodiment of tool 10 is illustrated that can be integrated as an end of arm tool in a robotic material handling apparatus 700 (see FIG. 25) by way of fastening structures 12, 14 which in this case are threaded bores and a dowel bore in a housing component of tool 10 adapted to receive fastening bolts (not shown). Other arrangements/interfaces for securing tool 10 to a robotic arm 704 of robotic system 700 or other type of positioning apparatus are known to the skilled person.

Tool 10 incorporates magnetic field detection sensors 98, as well as, an on-board sensor output signal processing circuit with integrated microprocessor, logic control circuit 23, which in turn provides a variety of tool status information data that can be displayed visually and/or used by a controller 770 of robotic system 700 to determine whether the tool 10 is in an on state, a partial on state, or off state; whether the tool 10 has been positioned correctly (within predefined thresholds) on a target zone 121 of a workpiece 17 (see FIG. 21); whether a safe magnetic working circuit has been established between tool 10 and target workpiece 17; and also to assist in positioning tool 10 by the robotic arm 704.

Tool 10 includes two subassemblies, a switchable permanent magnet assembly 16 and an actuator and electronic sensor and feedback assembly 18. FIG. 3 is an exploded view of the entire tool 10, whereas FIGS. 4 and 5 respectively show the permanent magnet assembly 16 and the actuator 54 and electronic sensor and feedback assembly 18.

Figure 4:
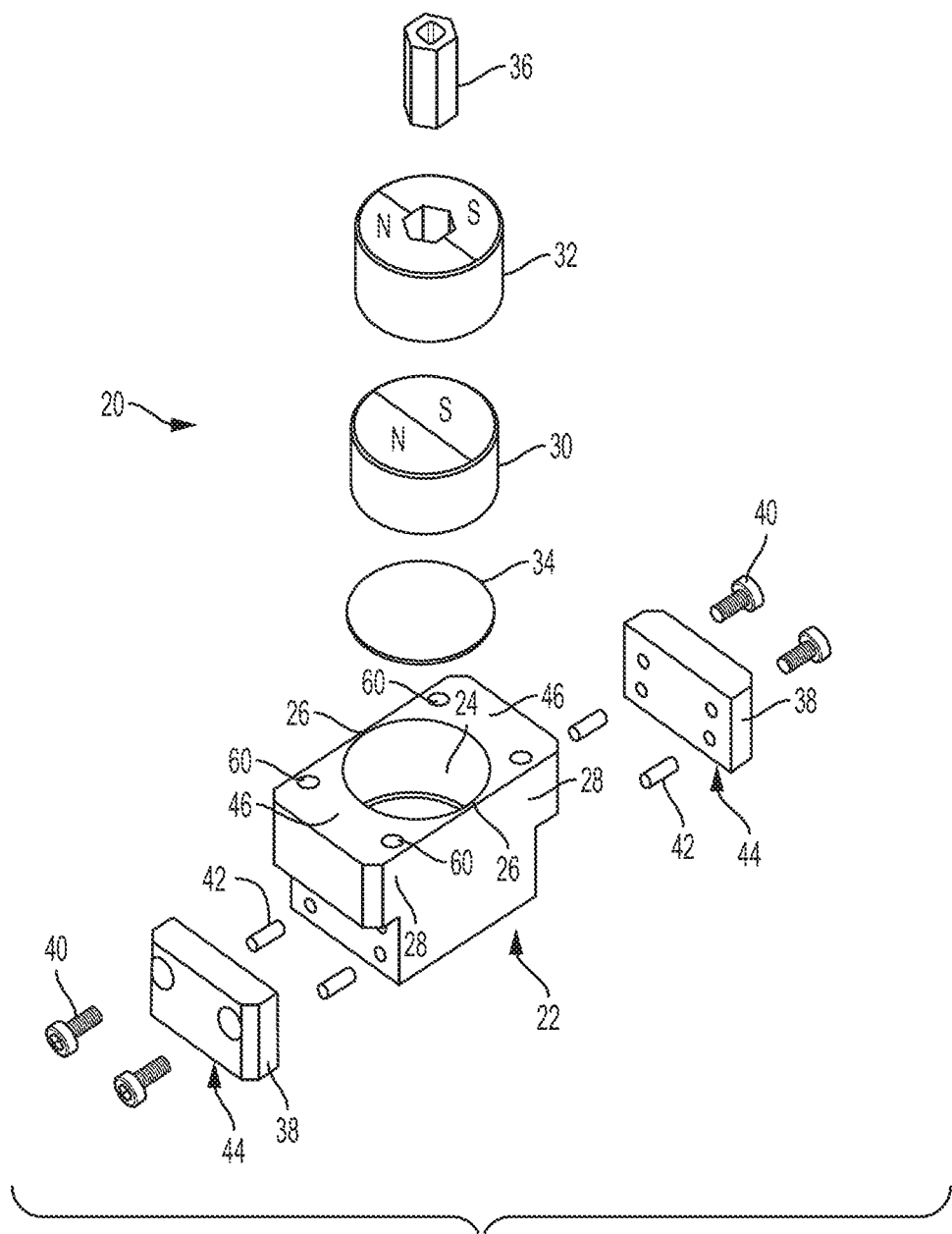
FIG. 4 illustrates an exploded perspective view of an exemplary switchable permanent magnet unit, a magnetic flux source, and replaceable pole extension shoes of the end-of-arm magnetic coupling tool of FIG. 1.

Referring to FIG. 4, an embodiment of a switchable permanent magnet device 20 as described in U.S. Pat. No. 7,012,495 (Magswitch), the entire disclosure of which is expressly incorporated by reference herein, is illustrated. Switchable permanent magnet device 20 is a modified version of an AR type Magswitch unit as manufactured and sold by Magswitch Technology Inc. Device 20 includes a ferromagnetic steel housing 22, illustratively of rectangular foot print, essentially a unitary rectangular prismatic body with an upper portion whose width is larger than a lower portion with both portions having the same depth. In one embodiment, housing 22 is a multi-piece housing. A circular bore 24 extends axially from the bottom to the top of housing 22, with its axis coinciding with the intersection of the width and depth symmetry planes of housing 22, so that a small web 26 of material is left standing on opposite depth ends of housing 22, which subdivide housing 22 in essentially magnetically isolated portions along the height of housing 22. The wall thickness of the width-ward housing portions 28 is substantial and sufficient to fully carry magnetic flux provided by two cylindrical, diametrically magnetized rare earth permanent magnets 30, 32 which are received in bore 24. A shunt plate 34 is inserted to close the bottom end of bore 24. Bottom magnet 30 is fixed against rotation in bore 24 in such an orientation that the N-S pole separation plane (p) of magnet 30 bisects the web portions 26 and polarizes the opposite width-ward housing portions with the respective N- and S-polarities of the dipole magnet 30. Top magnet 32, despite having a hexagonal prism depression on its upper face to allow for hexagonal prism drive shaft 36 to be inserted into it, has ideally and as far as possible the same magnetization characteristics as lower magnet 30.

Two ferromagnetic pole shoes 38, illustratively of essentially rectangular prismatic configuration (but for chamfered edges at an outside face), of a material magnetically compatible with or the same as housing 22, are mounted to the width-ward sides at the lower portion of housing 22 to complement the shape of the upper portion of housing 22, using bolts 40 and locator pins 42. Pole shoes 38 preferably extend beyond a lower side 37 (see FIG. 3) of housing 22, but are illustratively shown as generally flush with the lower side 37 of housing 22. Pole shoes 38 define at a lower face respective workpiece engagement surfaces 44 which in the illustrated embodiment are planar, but could be of different geometry and/or contoured to form fittingly abut against a target surface of a workpiece 17 to be magnetically coupled to and handled by tool 10. The fit of pole shoes 38 to the receptacles defined at the lower portion of housing 22 is such as to minimize or indeed essentially avoid magnetic circuit air gaps; in other words, the thick-walled width-ward portions of housing 22 and the pole shoes 38 together form a magnetic flux path from the magnets 30, 32 to the top and bottom axial end faces of housing 22.

As noted, the pole shoes 38 define at their lower terminal end the tool's workpiece engagement (or working) surface (s), whereas the top faces of the thick-walled width-ward portions of housing 22 define what will herein be termed flux detection surfaces 46. In absence of an external magnetic working circuit, and even when such is created, magnetic flux lines pass through both the workpiece engagement surfaces 44 at pole shoes 38 and flux detection surfaces 46 of housing 22.

For further details on such switchable permanent magnet units 20, compare Magswitch Technology technical information of its products which is publically available, including magnetic rating of Magswitch AR devices. For example, an AR 50 coupling unit has a max. workpiece break away rating of 249 kg with a safe working load of 62 Kg and safe shear load of 31 Kg, the magnets having a flux output to cause full saturation of a ferromagnetic workpiece having a thickness of 9.5 mm and a bottom face footprint area of 52×64 mm.

Figure 5:
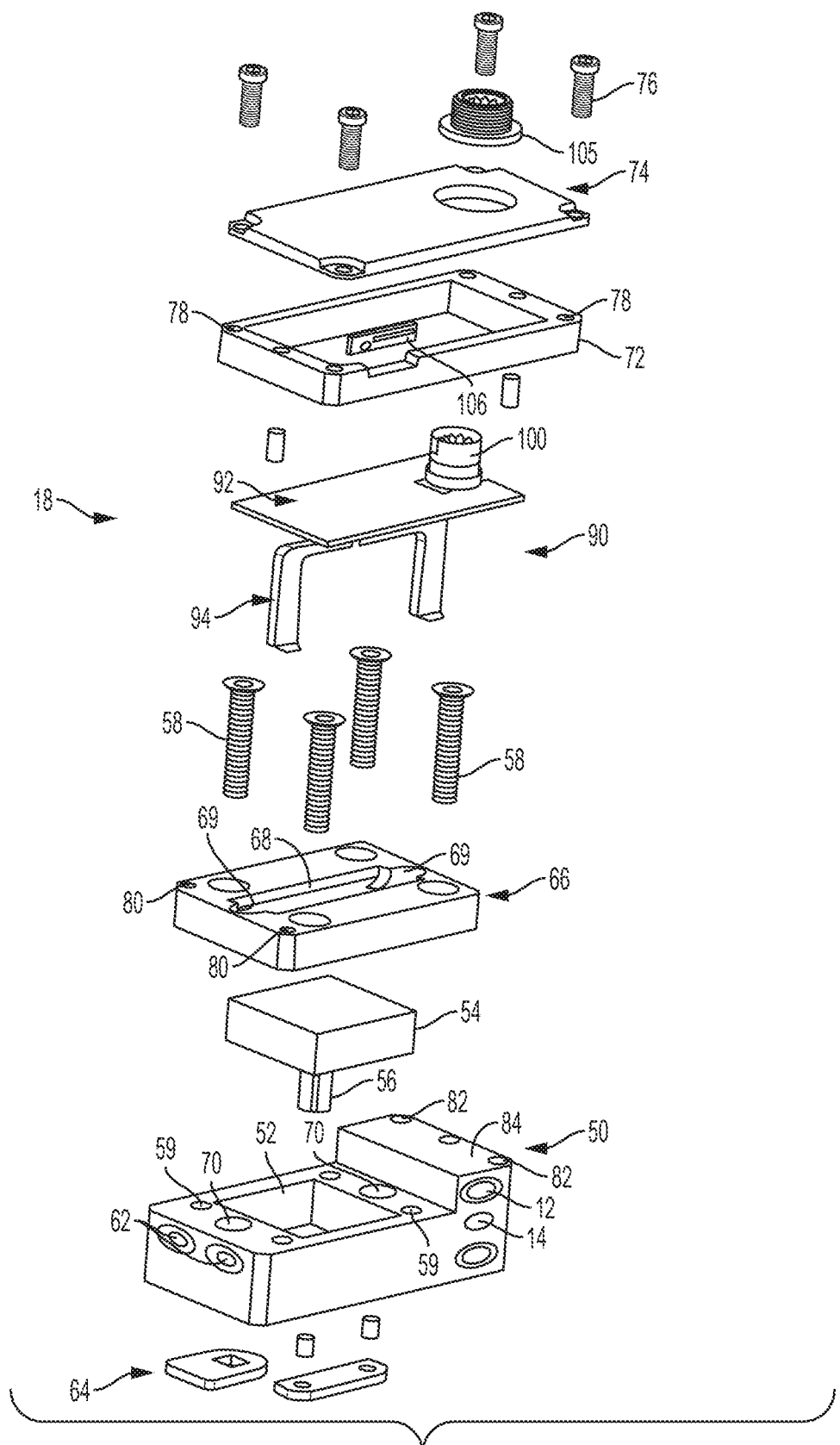
FIG. 5 illustrates an exploded perspective view of a second housing component of the end-of-arm magnetic coupling tool of FIG. 1 which houses an exemplary actuator for switching of the magnetic flux source, a plurality of exemplary magnetic field sensors for interaction with the housing and pole shoes of the magnetic flux source, and an exemplary on-board logic control circuit for delivering tool status data and indication via an exemplary output device.

Turning then to FIG. 5, the actuator and electronic sensor and feedback assembly 18 (as identified in FIG. 2) is illustrated Referring to FIGS. 3 and 5, assembly 18 comprises a four part housing assembly 48 whose parts serve different functional purposes.

A lower rectangular-footprint actuator housing part 50 is made (machined and/or cast) from aluminum and includes a rectangular depression 52 with a through passage opening towards the lower face of housing part 50, which serves to house a rotary actuator 54.

Rotary actuator 54 has a torque output shaft 56 which in the assembled state of tool 10, in which lower housing part 50 is hermetically secured to the top of the magnet assembly's housing 22 using four fastening bolts 58 which extend through four bores 59 in lower housing part 50 and engage with threaded bores 60 on the top face of housing 22. Torque output shaft 56 is inserted into hexagonal drive insert 36 present at the upper magnet 32. This enables actuator 54 to impart selective torque to rotate top magnet 32 in its housing 22 to turn the switchable permanent magnet device 20 between the off state, the on state, and a partial on state. Referring in this context to and as may be gleaned from FIG. 4, the lines across the upper faces of both magnets 30, 32 represent the respective separation planes of the North and South active poles of magnets 30, 32.

When the north and south poles of both magnets 30, 32 are on the same width-ward side of housing 22 such that the north pole of permanent magnet 32 completely overlaps the north pole of permanent magnet 30, device 20 is in the on state, providing flux past workpiece engagement surfaces 44 at pole shoes 38 and flux detection surfaces 46 at housing 22. When the north and south poles of both magnets are on the same width-ward side of housing 22 such that the north pole of permanent magnet 32 only partially overlaps the north pole of permanent magnet 30, device 20 is in the partial on state, providing flux past workpiece engagement surfaces 44 at pole shoes 38 and flux detection surfaces 46 at housing 22. When the north and south pole of both magnets 30, 32 are on the opposite sides (i.e. anti-aligned) such that the north pole of permanent magnet 32 completely overlaps the south pole of permanent magnet 30, the device is in the off state and flux is confined within the housing 22 and magnets 30, 32. Additional details on exemplary actuation and sensing systems are provided in U.S. Pat. No. 7,012,495 and U.S. Provisional Application No. 62/634,783, filed Feb. 23, 2018, titled VARIABLE FIELD MAGNETIC COUPLERS AND METHODS FOR ENGAGING A FERROMAGNETIC WORKPIECE, docket MTI-0016-01-US, the entire disclosures of which are expressly incorporated by reference herein.

Lower housing part 50 also includes two coupling conduits 62 through which the actuator 54 receives hydraulic or pneumatic fluid, depending on the actuator's make-up, to rotate its output shaft selectively to turn unit 20 on and off. In one embodiment, actuator 54 is an electric actuator and receives power from robotic system 700. Exemplary electric actuators include stepper motors. Reference number 64 in FIGS. 3 and 5 references a flag and hard stop that are provided to limit rotation and provide reference stops/positions for the upper magnet 32 of unit 20 in the on state and the off state rotational orientations. Retractable pins may be included to selectively provide reference stops for upper magnet 32 in various partial on states as described in U.S. Provisional Application No. 62/634,783, filed Feb. 23, 2018, titled VARIABLE FIELD MAGNETIC COUPLERS AND METHODS FOR ENGAGING A FERROMAGNETIC WORKPIECE, docket MTI-0016-01-US, the entire disclosure of which is expressly incorporated by reference herein.

In embodiments, logic control circuit 23 monitors the rotational position of magnet 32 to verify that magnet 32 has been moved to the appropriate reference position for known partial on states and the on state. In examples where actuator 54 is a stepper motor, logic control circuit 23 monitors a position signal from the stepper motor and compares that to a stored position value to determine if magnet 32 in in the requested partial on or on state.

In embodiments, magnetic coupling device 10 includes a brake, such as a frictional brake which may interact with a rotatable member coupled to permanent magnet 32. The frictional brake may be actuated to maintain the current position of rotatable member and hence the current position of permanent magnet 32.

In embodiments, actuator 54 is a stepper motor and the ability of the stepper motor to hold its output shaft at a current position also holds permanent magnet 32 at a current position and hence magnetic coupling device 10 in a current state (on state, off state, partial on state).

An intermediate aluminum (or other non-ferromagnetic metallic) housing part 66 of housing assembly 48 has a rectangular footprint and is secured to the lower housing part 50 by the above mentioned fastening bolts 58. Intermediate housing part 66 has a rectangular recess 68 with bores 69 on the width-ward ends of recess 68 extending from top to bottom, with the width-ward end bores 69 locating outside the rectangular depression 52 in lower housing part 50 and coinciding with respective cylindrical passage channels 70 that extend either from the top to the bottom face of lower housing part 50 or from the top to end a small distance from the bottom face.

On top of intermediate housing part 66 is a rectangular frame-like upper housing part 72, also made from non-ferromagnetic metal material, whose upper open end is closed by a rectangular non-ferromagnetic cover plate 74 which by way of four fastening screws 76 extending through bores 78 at the four corners of upper housing part 72 is sandwiched in sealing manner between cover plate 74 and intermediate housing part 66. It will be noted that two of the fastening screws 76 secure in threaded bores 80 on one width-ward side on the top of intermediate housing part 66, whereas the other two fastening screws 76 are seated and secured at two threaded bores 82 on a width-ward opposite side in a top block portion 84 of lower housing part 50, so that all housing parts 50, 66, 72 and 74 of housing assembly 48 of actuator and electronic sensor and feedback assembly 18 secure safely to one another.

Figure 6:
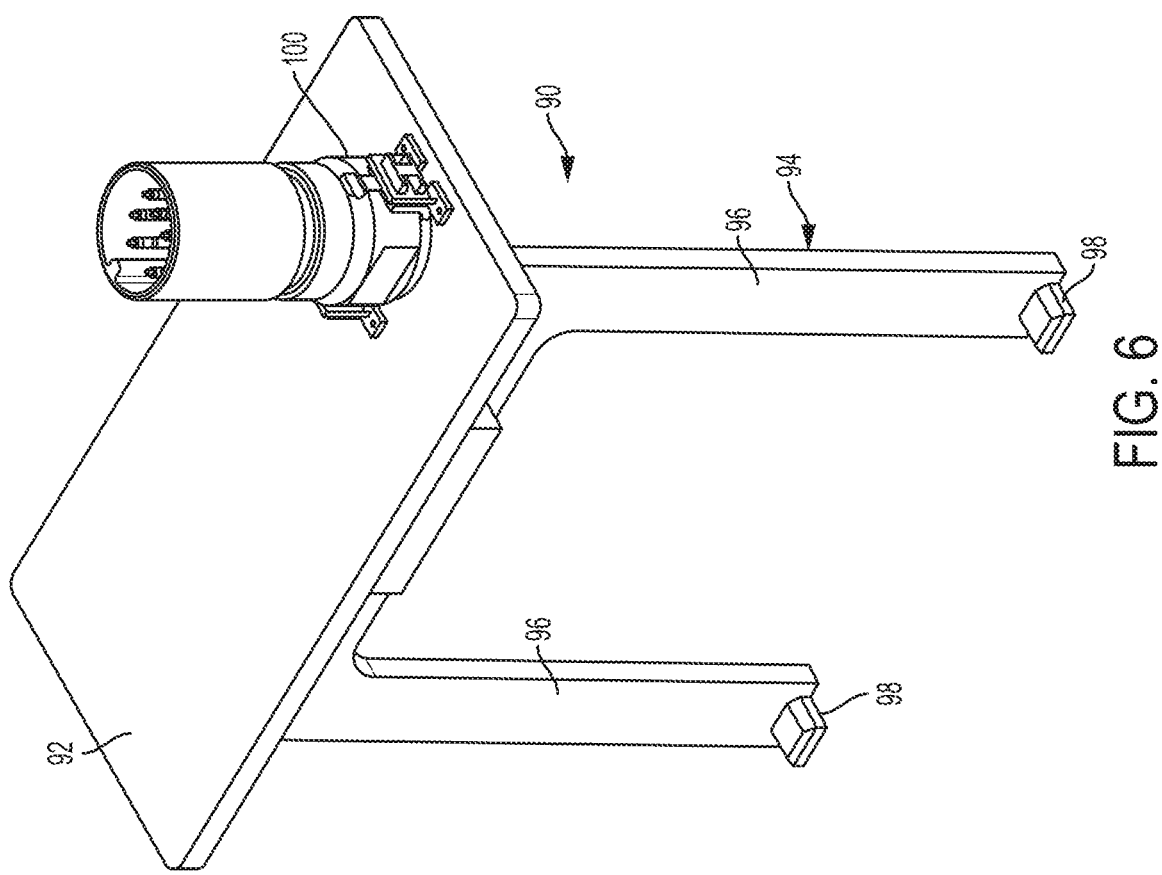
FIG. 6 illustrates a perspective view of portions of the logic control circuit of FIG. 5 including an exemplary coupled sensor printed circuit board assembly and an exemplary control logic printed circuit board with an exemplary input/output connector.
Figure 7:
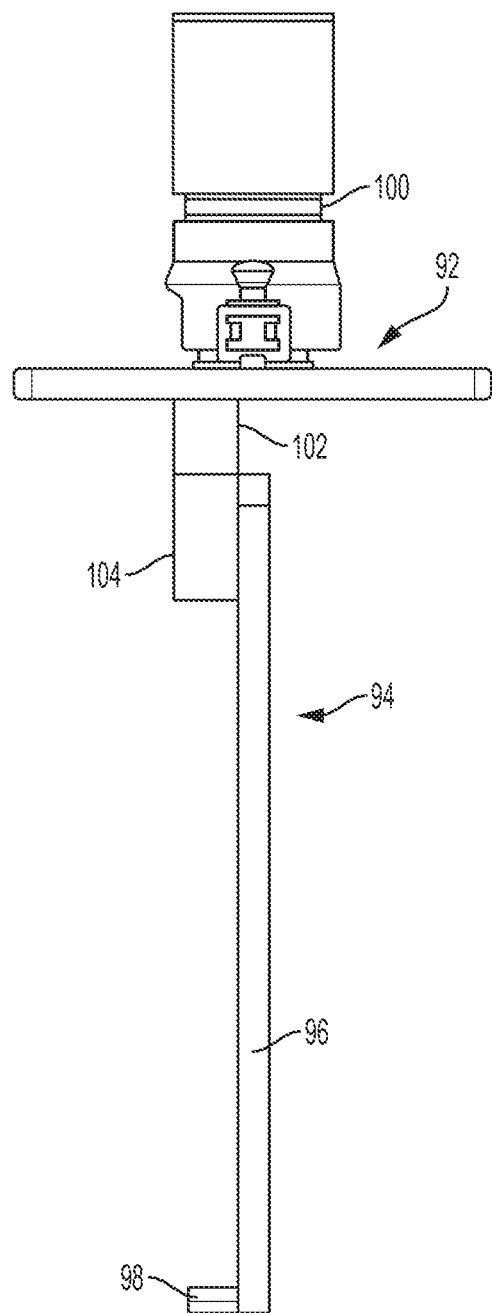
FIG. 7 illustrates a side elevation of FIG. 6.
Figure 8:
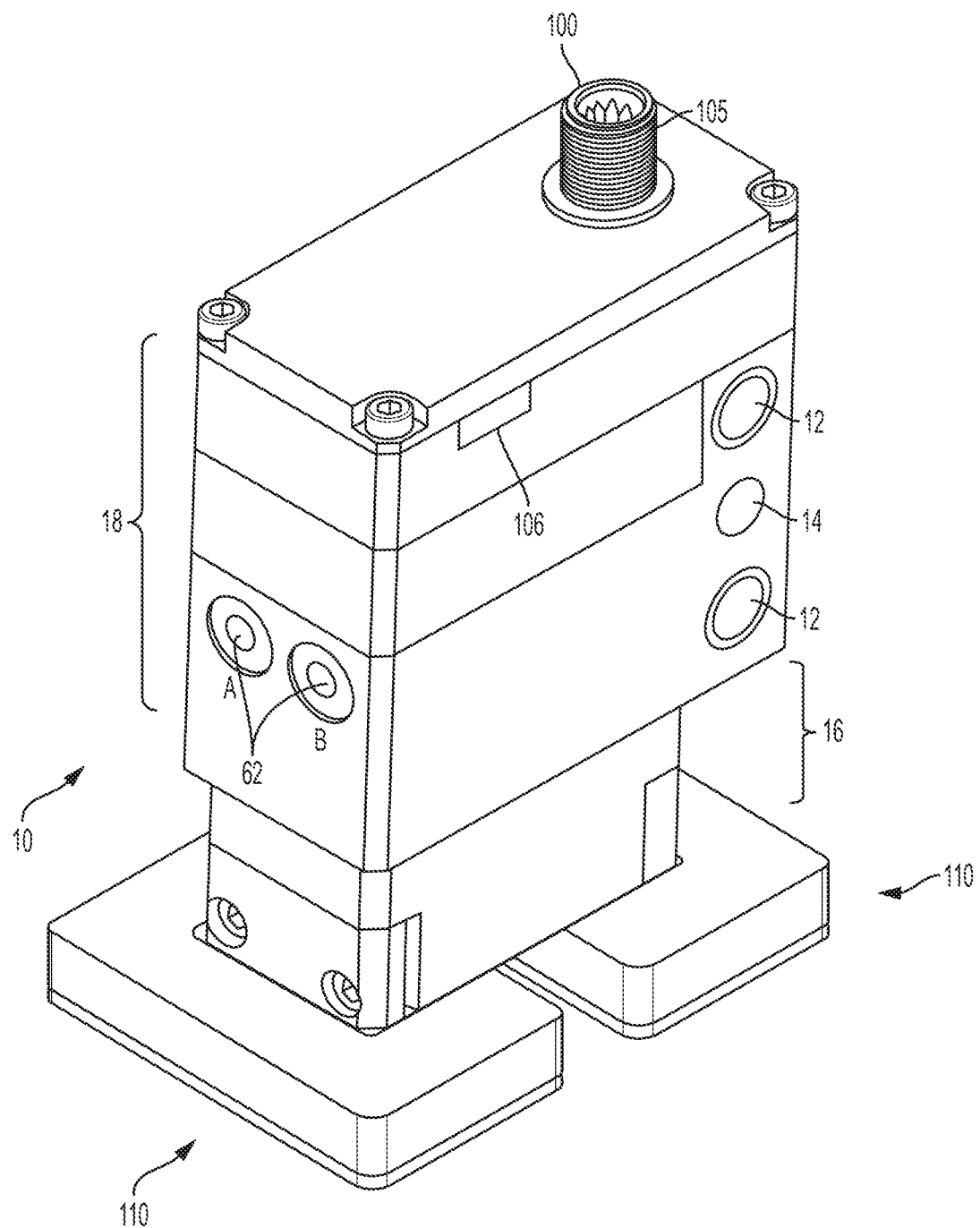
FIG. 8 illustrates a perspective view of an embodiment of the end-of-arm magnetic coupling tool of FIG. 1 including degauss capability.
Figure 9:
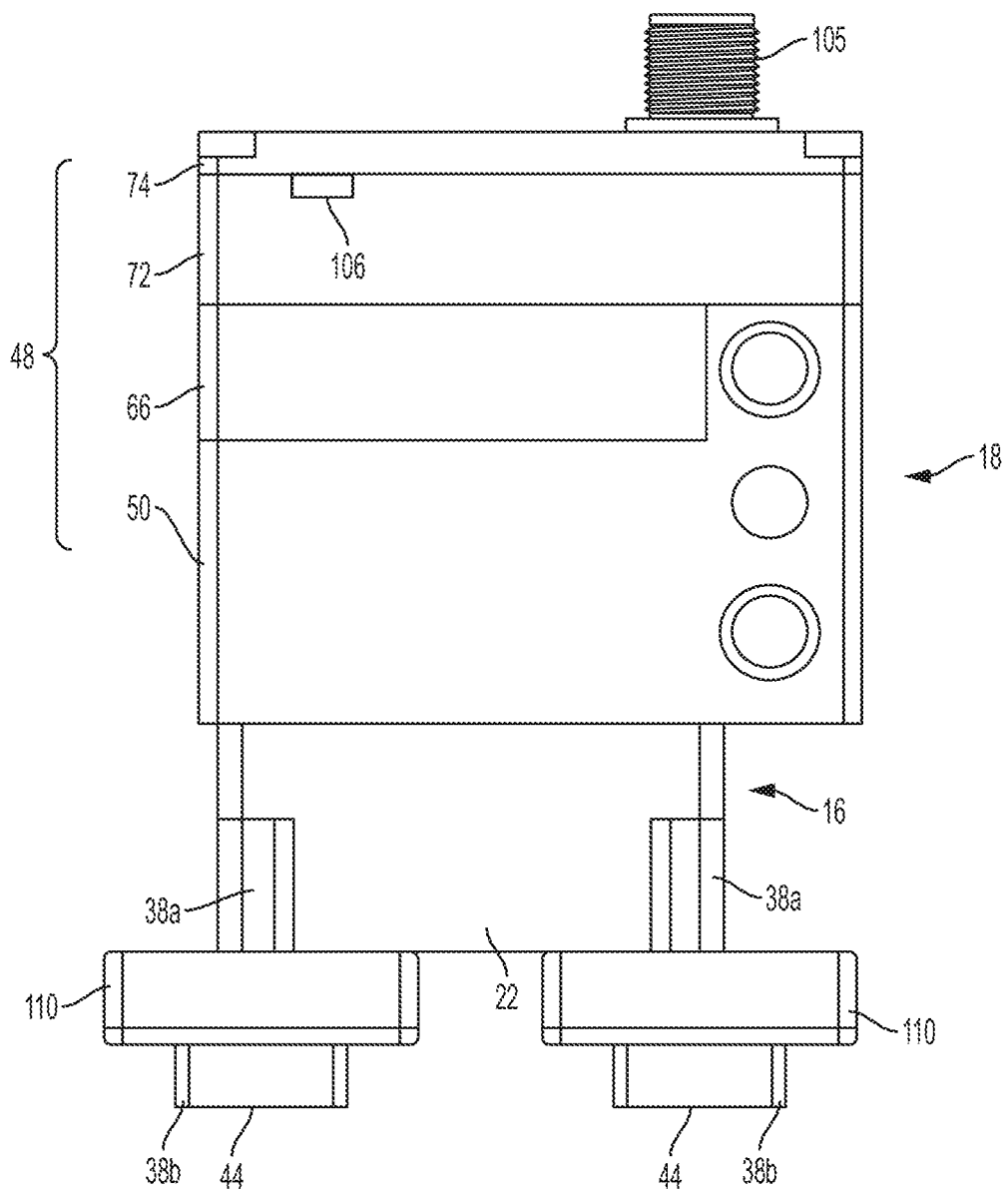
FIG. 9 illustrates a side elevation view of the arrangement of FIG. 8.

Referring to FIG. 5, actuator and electronic sensor and feedback assembly 18 further includes a magnetic field sensor and sensor signal processing circuit unit 90 which is part of logic control circuit 23 and that will now be described with reference to FIGS. 6 and 7. Unit 90 comprises two PCBs (printed circuit boards), a main control PCB 92 and a magnetometer sensor PCB 94 comprising two leg portions 96 which at their respective terminal ends each support/mount a magnetic flux sensor 98 of Linear Hall Effect type as mentioned above.

Main control PCB 92 includes a microcontroller (not illustrated separately), an M12 electronic connector 100 for interfacing I/O signals to/from the sensors and microcontroller with external equipment, and a board-to-board connector 102 on its underside for coupling with a complimentary board-to-board connector 104 located in the horizontal leg of PCB 94; connector 102 and 104 serve, beyond providing a mechanical connection between the PCBs, to conduct signals between electronic components on the respective boards, as is known in industry.

Referring to FIG. 3, main control PCB 92 will locate and be secured in the assembled state of upper housing assembly 48 within frame-like upper housing part 72, the board-to-board connectors 102 and 104 will come to locate within the rectangular through-passage 68 of intermediate housing part 66, and the leg portions 96 of magnetometer sensor board PCB 94 will extend past rectangular through-passage 68 of intermediate housing part 66 into the two cylindrical passage channels 70 in lower housing part 50. The overall arrangement ensures that the Hail Effect sensors 98 of PCB 94 will come to be securely located in a defined position a small distance away from the flux detection surfaces 46 of housing 22. In essence, this arrangement ensures that one magnetic flux sensor 98 of magnetometer sensor board PCB 94 is positioned over the North Pole of the switchable permanent magnet device 20 (one of the pole extension shoes 38), and the other sensor 98 is positioned over the South Pole (one of the pole extension shoes 38).

The magnetic field sensor and sensor signal processing circuit unit 90 has a layout and electronic components that allow magnetic flux signals to be sent electrically from sensors 98 to the microcontroller/processor on the main PCB 92 where these signals can be conditioned and information embedded in the signal can then be processed by the microcontroller through a series of algorithms to provide tool state feedback via an M12 electronic connector 100 which is secured to cover plate 74 using M12 pressed screw connector 105 used for attaching an M12 cable assembly to the M12 electrical connector 100 linked to the microcontroller.

Main PCB 92 may incorporate one or more output devices 144, illustratively LEDs, that receive status signals from the microcontroller/processor to provide a visual representation of certain tool states, beyond using the signals for an external control device. These tool states can be appreciated visually by an operator through an LED window 106 present in a wall of the frame-like upper housing part 72. The tool states will in any event include: magnet unit 20 of switchable permanent magnet assembly 16 on or off, North Pole pole shoe 38 (i.e. its workpiece engagement surface 44) on target or not (within settable thresholds, as explained below), which is indicative of the north pole shoe having a good magnetic hold on the workpiece), South Pole pole shoe 38 (i.e. its workpiece engagement surface 44) on target or not (within settable thresholds, as explained below), which is indicative of the south pole shoe having a good hold on the workpiece), and workpiece presence with overall good pull force exertion (both pole have good contact on the workpiece).

In an exemplary embodiment, the following operations were handled by tool 10: (1) Microprocessor (having an ADC unit) used to read magnetic sensor values; (2) Microprocessor used to read multiple sensors values; (3) Sensor readings used to light up tool status indication LEDs at certain sensor values; (4) Sensor readings used to light up an LED for the tool being On/Off; (5) an averaging function was created on the microprocessor to averages the sensor values; (6) A calibration function was created incorporating the averaging function to determine the on values for the sensors; and (7) The calibrated values from the calibration function were used to determine if the poles were off target, outside the target zone 121. In this exemplary embodiment of the EOAMT 10, a STM320F038 Discovery board was initially used followed by a custom designed main PCB board using STM32F030R8T6, and software coded and uploaded into memory of the processor, to perform the tool's functional settings, including calibration of the tool's sensors and controller.

An exemplary calibration procedure for the tool 10 includes placing the tool with its two workpiece engagement surfaces 44 against a workpiece 17 to be handled by the tool 10, in varying positions, multiple sampling of magnetic field sensor data at the sensors 98 located in close proximity to the flux detection surfaces 46 of the magnet unit's housing for each of the varying positions, averaging of sampled data, and storing threshold values in memory 33 against which live sensor data sampled during operation of the tool can be compared to determine tool status. To this end, the STM320F038 Discovery board was configured to allow toggling of data input. A three step calibration procedure then includes, in the specified order:

1. Toggle the calibration input of input devices 41 (see FIG. 13).
   a. Now the tool is in calibration mode.
   b. Wait for the power LED to stop flashing.
2. Place the tool with its workpiece engagement surfaces against a workpiece with 'ideal' contact and turn on the magnetic flux unit to an on state or alternatively to a known partial on state.
3. Toggle the calibration input.
   a. Wait for the power LED to stop flashing.
   b. Once the power LED stops flashing, turn off the magnetic flux unit of the tool.
4. Orient the tool with its workpiece engagement surfaces on the workpiece so that the S-Pole pole shoe is at the extent of what a tool operator (user) wants to be the on target value and turn the unit on to an on state or alternatively to a known partial on state.
5. Toggle the calibration input.
   a. Wait for the power LED to stop flashing.
   b. Once the power LED stops flashing, turn off the tool's magnetic flux source.
6. Orient the tool on the part so that the N-Pole pole shoe is at the extent of what the user wants to be the on target value and turn the unit on to an on state or alternatively to a known partial on state.
7. Toggle the calibration input.
   a. Wait for the power LED to stop flashing.
   b. Once the power LED stops flashing, turn off the unit.
8. Once the power LED stops flashing, the tool wilt go back into sensing mode.

At this point in time, the state outputs of the tool should be functioning properly for the on state or known partial on state that was calibrated. If this is not the case, repeat the calibration steps.

Sensitivity inputs can be added to the firmware as well so that the user can adjust to be more or less sensitive from the calibrated values.

Another functionality which the tool with its on-board sensor array and signal processing logic can deliver is a so-called 'double blank' monitoring functionality, which is useful when magnetic coupling device 10 is used to de-stack ferromagnetic sheet blanks or partially shaped sheet material components from a staple (e.g. for transfer of the blanks between or to a blank drawing or molding station). This functionality includes a calibration of the tool as follows:

1. Toggle the calibration input.
   a. Now the user is in calibration mode.
   b. Wait for the power LED to stop flashing.
   c. Place the tool with its pole shoes on one sheet of steel with ideal contact and turn on to an on state or alternatively to a known partial on state the magnetic flux source of the tool (Note: this step is required each time the user changes sheet material thicknesses).
2. Toggle the calibration input.
   a. Wait for the power LED to stop flashing.
   b. Once the power LED stops flashing, turn off the unit.
3. Once the power LED stops flashing, the tool will go back into normal sensing mode.

At this point in time, the state outputs of the tool should be functioning properly. If this is not the case, repeat the calibration steps. If in a subsequent operation, the sensed leakage flux for the calibrated on state or partial on state is less than the stored calibrated value by a threshold amount (absolute or percentage) then tool 10 may be coupled to multiple workpieces instead of a single workpiece.

As mentioned herein other configurations of magnets may be used in place of permanent magnets 30, 32. Referring to FIGS. 26-30, an exemplary switchable permanent magnet assembly 200 of the present disclosure is represented. Switchable permanent magnet assembly 200 may replace magnetic flux source 15. Further, permanent magnet assembly 200 is placed in a non-ferrous housing, as opposed to housing 22 for magnetic coupling device 10. As explained in more detail herein pole portions 250 of permanent magnet system 200 are located at a lower side of the housing and contact workpiece 17 (see FIGS. 29 and 30) or have pole extension members positioned directly below pole portions 250 and contacting workpiece 17.

Switchable permanent magnet assembly 200 includes an upper platter 212 and a lower platter 214 to be placed in housing 22. Each of platters 212 and 214 include a plurality of spaced-apart permanent magnets 230 and a plurality of pole portions 250. Each of the plurality of spaced-apart permanent magnets 230 are illustratively shown as a single permanent magnet, but may comprise multiple permanent magnets and/or at least one permanent magnet positioned within a housing. Exemplary platters are provided in U.S. Pat. No. 7,161,451, German Utility Model DE202016006696U1, and U.S. Provisional Patent Application No. 62/248,804, filed Oct. 30, 2015, titled MAGNETIC COUPLING DEVICE WITH A ROTARY ACTUATION SYSTEM, docket MTI-0007-01-US-E, the entire disclosures of which are expressly incorporated by reference herein.

Returning to the example of FIGS. 26-30, each permanent magnet 230 has a north pole side 232 and a south pole side 234. The permanent magnets 230 and pole portions 250 of platter 212 and of platter 214 are each arranged to form a closed shape wherein one of pole portions 250 is positioned between two of permanent magnets 230. Further, the permanent magnets 230 are arranged so that each of the two permanent magnets 230 contacting the pole portion 250 therebetween have either their north pole sides or their south pole sides contacting the pole portion 250. When the north pole sides of the adjacent permanent magnets 230 are contacting a pole portion 250, the pole portion 250 is referred to as a north pole portion. When the south pole sides of the adjacent permanent magnets 230 are contacting a pole portion 250, the pole portion 250 is referred to as a south pole portion.

Each of upper platter 212 and lower platter 214 includes an equal and even number of permanent magnet 230 and an equal number of pole portions 250. In one embodiment, in each of upper platter 212 and lower platter 214, permanent magnets 230 and pole portions 250 are arranged in a circular configuration.

In embodiments, lower platter 214, like magnet 30 in tool 10, is held stationary relative to the housing containing lower platter 214 and upper platter 212, like magnet 32 in tool 10, rotates relative to lower platter 214. Upper platter 212 is rotatable in directions 290, 292 about a central axis 294 relative to lower platter 214 to alter an alignment of the permanent magnets 230 and pole portions 250 of upper platter 212 relative to the permanent magnets 230 and pole portions 250 of lower platter 214.

Switchable permanent magnet assembly 200 is considered to be in an on state when the south pole portions 250 of lower platter 214 are aligned with the south pole portions 250 of upper platter 212 and the north pole portions 250 of lower platter 214 are aligned with the north pole portions 250 of upper platter 212. In the on-state, a workpiece is held by magnetic coupling device 10 due to a completion of a magnetic circuit from the aligned north pole portions 250 of upper platter 212 and lower platter 214, through the workpiece, and to the aligned south pole portions 250 of upper platter 212 and 214.

Switchable permanent magnet assembly 200 is considered to be in an off state when the south pole portions 250 of lower platter 214 are aligned with the north pole portions 250 of upper platter 212 and the north pole portions 250 of lower platter 214 are aligned with the south pole portions 250 of upper platter 212. In the off state, a workpiece is not held by magnetic coupling device 10 due to a completion of a magnetic circuit within upper platter 212 and lower platter 214 from the aligned north pole portions 250 of upper platter 212 to the south pole portions 250 of lower platter 214 and from the aligned north pole portions of upper platter 212 to the south pole portions 250 of lower platter 214.

Switchable permanent magnet assembly 200 is considered to be in a partial on state when the south pole portions 250 of upper platter 212 are partially overlapping the north pole portions 250 of lower platter 214 and the north pole portions 250 of upper platter 212 are partially overlapping the south pole portions 250 of lower platter 214. When in the partial on state, a workpiece may be held by magnetic coupling device 10 due to a completion of a magnetic circuit from the overlapping north pole portions 250 of upper platter 212 and lower platter 214, through the workpiece 27, and to the overlapping south pole portions 250 of upper platter 212 and lower platter 214. The strength of the magnetic circuit increases as the degree of overlap of the overlapping north pole portions 250 of upper platter 212 and lower platter 214 and the overlapping south pole portions 250 of upper platter 212 and lower platter 214 increases.

Figure 26:
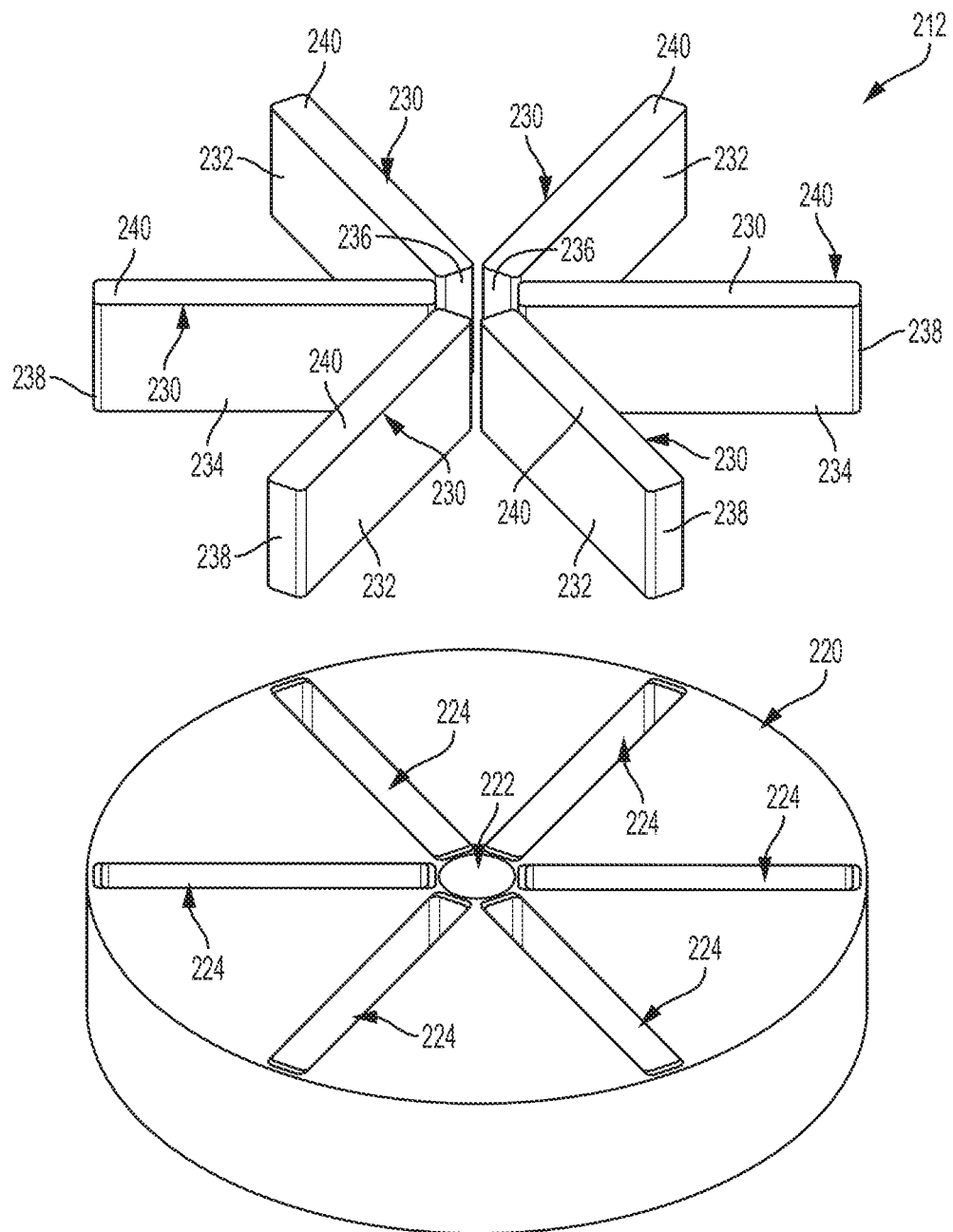
FIG. 26 illustrates an exploded, perspective view of an exemplary platter having a plurality of permanent magnets and pole portions.

Referring to FIG. 26, upper platter 212 is illustrated. Upper platter 212 includes a cylindrical base component 220 having a central aperture 222 and a plurality of radially extending apertures 224. Each of the radially extending apertures 224 is sized and shaped to receive a permanent magnet 230. Each permanent magnet 230 has a north side 232, a south side 234, a radially inward facing side 236, a radially outward facing side 238, a top 240, and a bottom.

Figure 27:
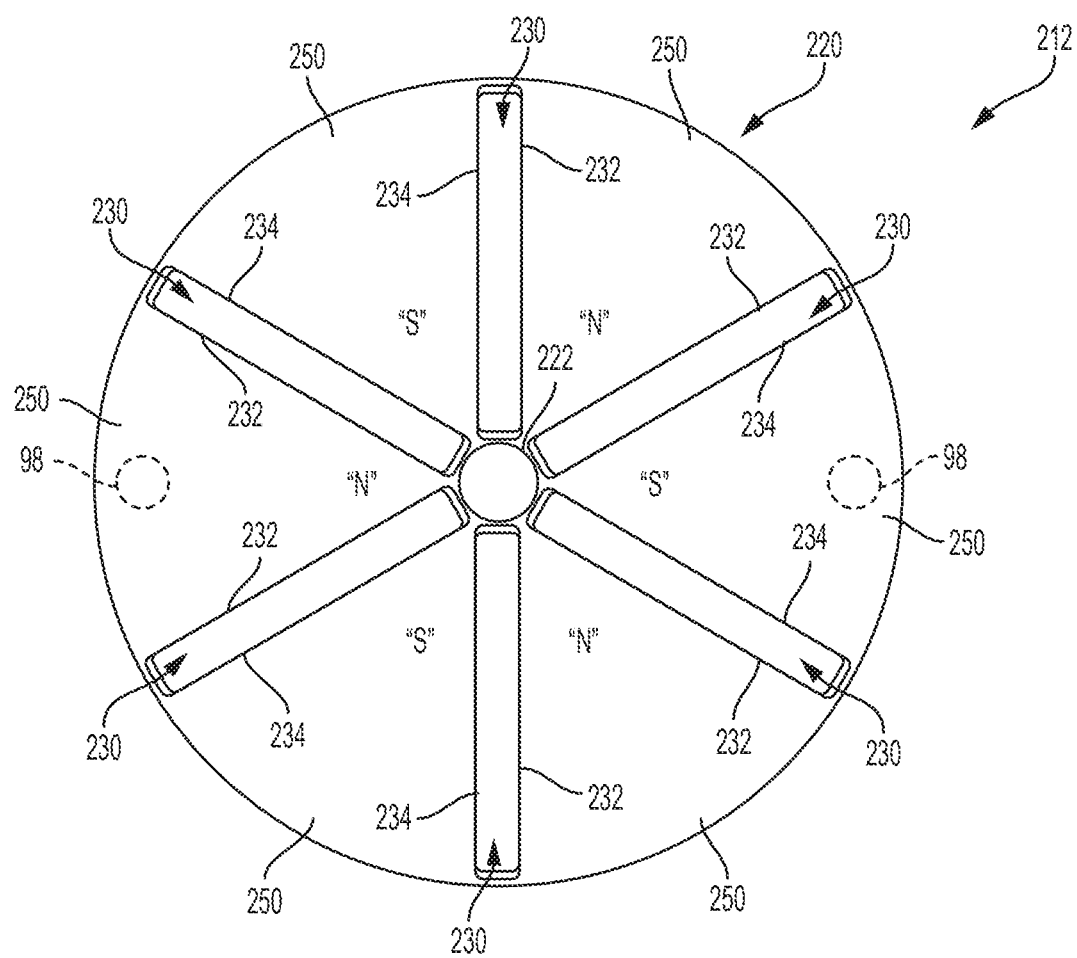
FIG. 27 illustrates a top, assembled view of the platter of FIG. 26.

Referring to FIG. 27, a top view of upper platter 212 is shown. Cylindrical base component 220 surrounds each of north sides 232, south sides 234, radially inward facing side 136, and radially outward facing side 138 of permanent magnet 230. In one embodiment, apertures 224 are not through apertures, but rather blind depth apertures from the bottom side of cylindrical base component 220 and hence cylindrical base component 220 would also surround top 240 of pole portions 250. In the illustrated embodiment, cylindrical base component 220 is a single integral component. In one embodiment, cylindrical base component 220 is comprised of two or more components joined together.

As shown in FIG. 27, permanent magnets 230 are arranged so that the north sides 232 of adjacent magnets are facing each other and the south sides 234 of adjacent magnets 230 are facing each other. This arrangement results in the portions 250 of cylindrical base component 220 between permanent magnet 230 to act as pole extensions for permanent magnet 230. In embodiments, base component 220 and hence pole portions 250 are made of steel. Other suitable ferromagnetic materials may be used for base component 220.

Figure 28:
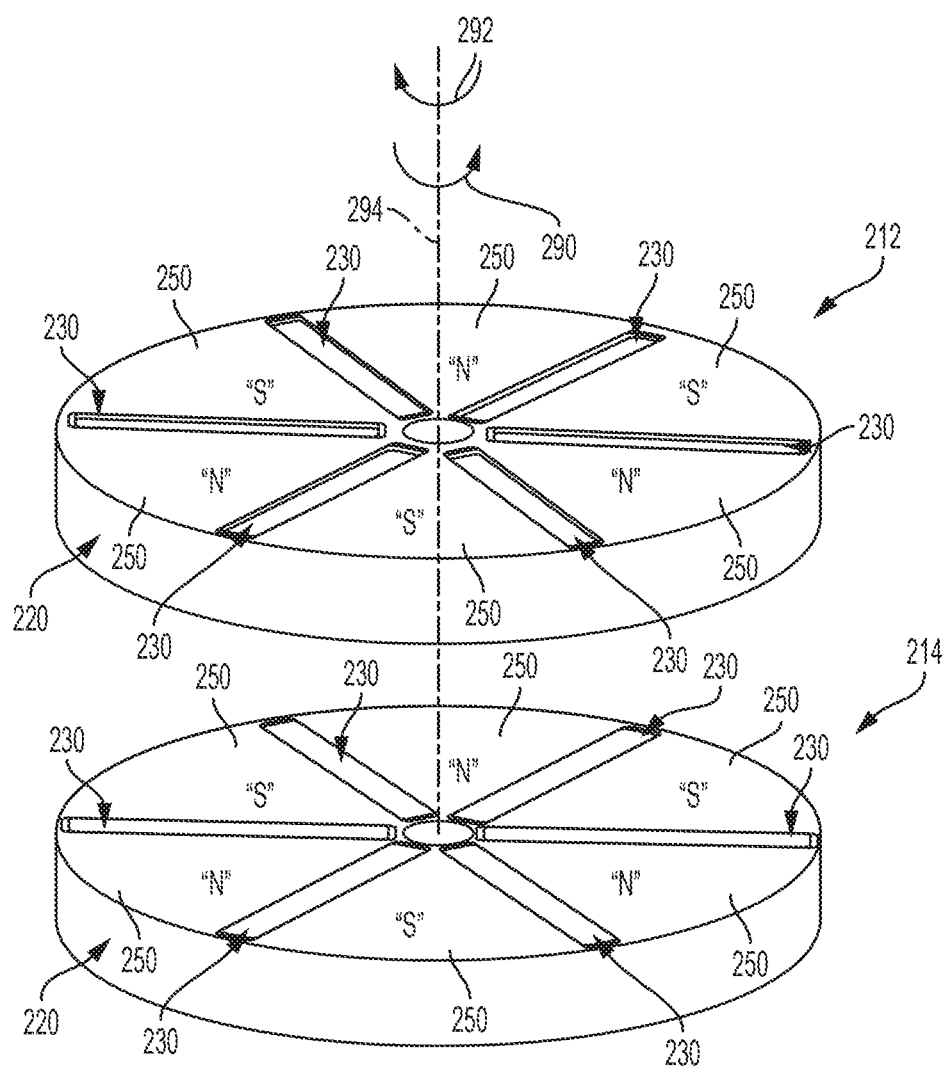
FIG. 28 illustrates a perspective view of the two instances of the platter of FIG. 26.

Referring to FIG. 28, upper platter 212 is shown exploded relative to lower platter lower platter 214. Lower platter 214 is generally identical to upper platter 212. Upper platter 212 may be rotated relative to lower platter 214 to place switchable permanent magnet assembly 200 in an on state, a partial on state, or an off state.

Figure 29:
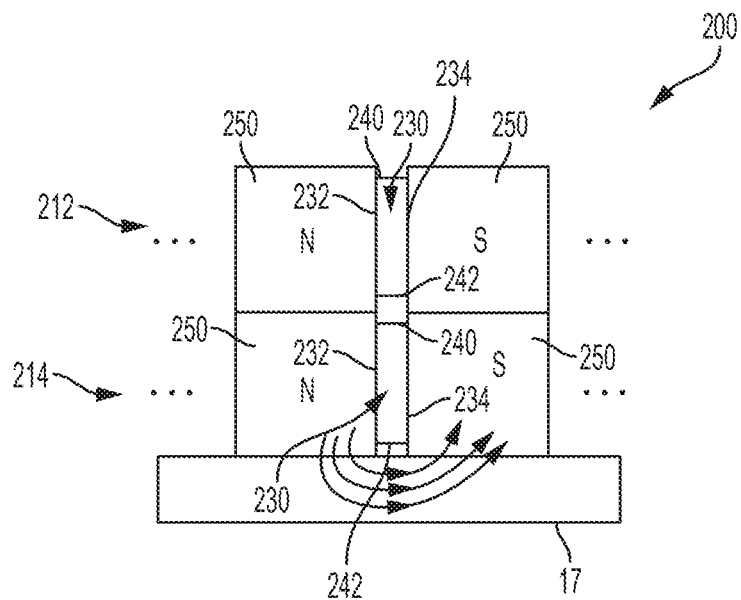
FIG. 29 illustrates the two platters of FIG. 28 oriented in an on state.

Referring to FIG. 29, upper platter 212 and lower platter 214 are arranged in an on-state wherein the south pole portions 250 of upper platter 212 are adjacent the south pole portions 250 of lower platter 214 and the north pole portions 250 of upper platter 212 are adjacent the north pole portions 250 of lower platter 214. In the on-state, a workpiece 27 being made from a ferromagnetic material is held by magnetic coupling device including the upper and lower platters 212, 214 due to a completion of a magnetic circuit from the aligned north pole portions 250 of upper platter 212 and lower platter 214, through the workpiece 27, and to the aligned south pole portions 250 of upper platter 212 and lower platter 214. The lower surfaces of north and south pole portions 250 form the workpiece contact interfaces. Alternatively, instances of pole shoes 38, although of different shape than in FIG. 1, may positioned between the lower surfaces of north and south pole portions 250 and the workpiece 17 to provide the workpiece contact interfaces 44 with workpiece 17. Further, sensors 98 may be positioned adjacent various ones of north pole and south pole portions 250. In embodiments, at least one of the north pole portions 250 and at least one of the south pole portions 250 has a sensor 98 associated therewith to monitor the leakage flux associated with the respective north pole portion and the respective south pole portion. As shown in FIG. 27, a first sensor 98 may be placed proximate to a north pole portion 250, such as directly over north pole portion 250 or radially outward of north pole portion 250, and a second sensor 98 may be placed proximate to a south pole portion 250, such as directly over south pole portion 250 or radially outward of south pole portion 250. Logic control circuit 23 may perform calibration runs for permanent magnet assembly 200 in a similar fashion as described herein for magnetic coupling device 10 to store sensor values for determining operating states of the device including permanent magnet assembly 200.

Figure 30:
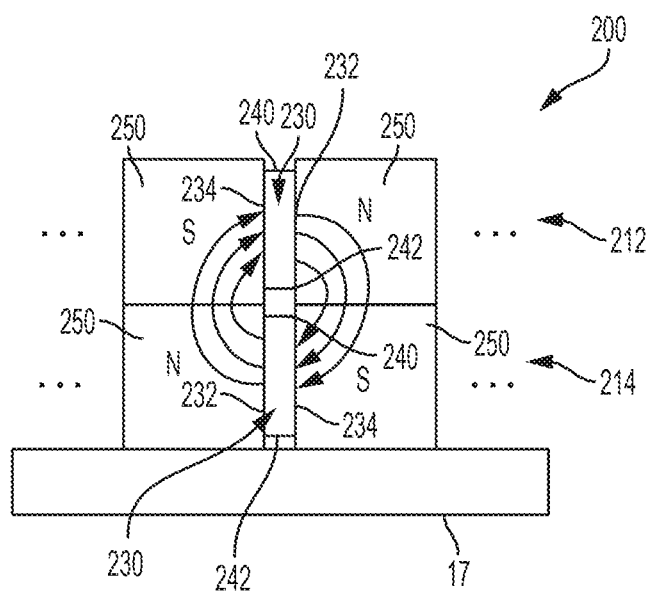
FIG. 30 illustrates the two platter of FIG. 28 oriented in an off state.

Referring to FIG. 30, upper platter 212 and lower platter 214 are arranged in an off-state when the south pole portions 250 of upper platter 212 are adjacent the north pole portions 250 of lower platter 214 and the north pole portions 250 of upper platter 212 are adjacent the south pole portions 250 of lower platter 214. In the off-state, a workpiece 27 being made from a ferromagnetic material is not held by magnetic coupling device including the upper and lower platters 212, 214 due to a completion of a magnetic circuit between the aligned south pole portions 250 of upper platter 212 and the north pole portions 250 of lower platter 214 and between the aligned north pole portions 250 of upper platter 212 and the south pole portions 250 of lower platter 214. In other words, platters 212 and 214 shunt the magnetic circuit within the pole portions 150 causing the external magnetic field to collapse. Upper platter 212 and lower platter 214 may also be arranged to provide one or more partial on states of the magnetic coupling device including upper platter 212 and lower platter 214.

Figure 31:
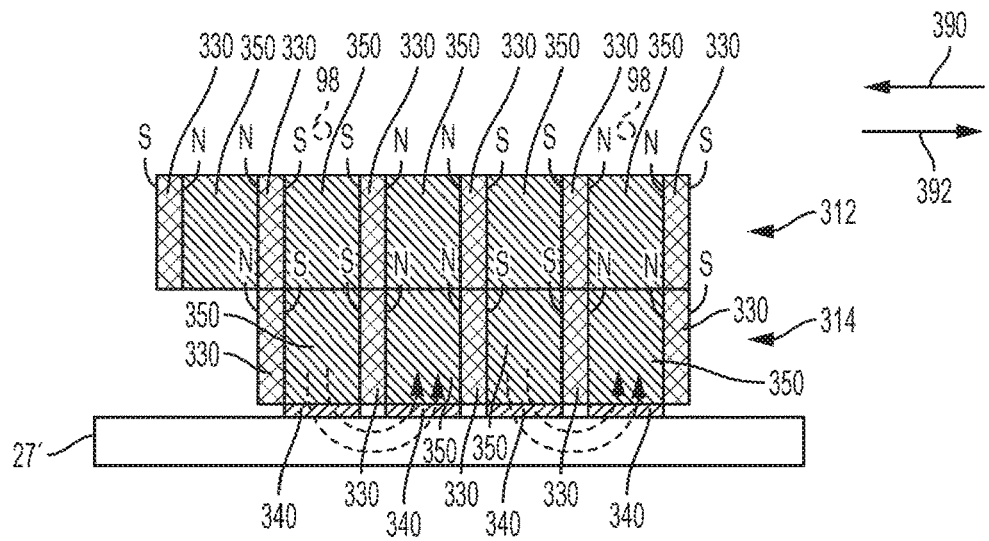
FIG. 31 illustrates a diagrammatical view of an exemplary magnetic coupling device having an upper assembly and a lower assembly, each including a plurality of permanent magnets and pole portions arranged in a linear array, the magnetic coupling device being in an on state.
Figure 32:
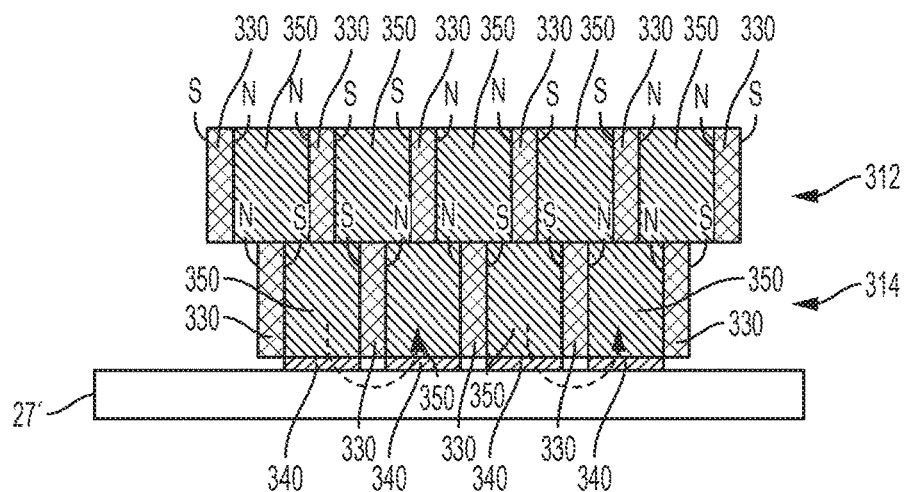
FIG. 32 illustrates the magnetic coupling device of FIG. 31 in a partial on state.
Figure 33:
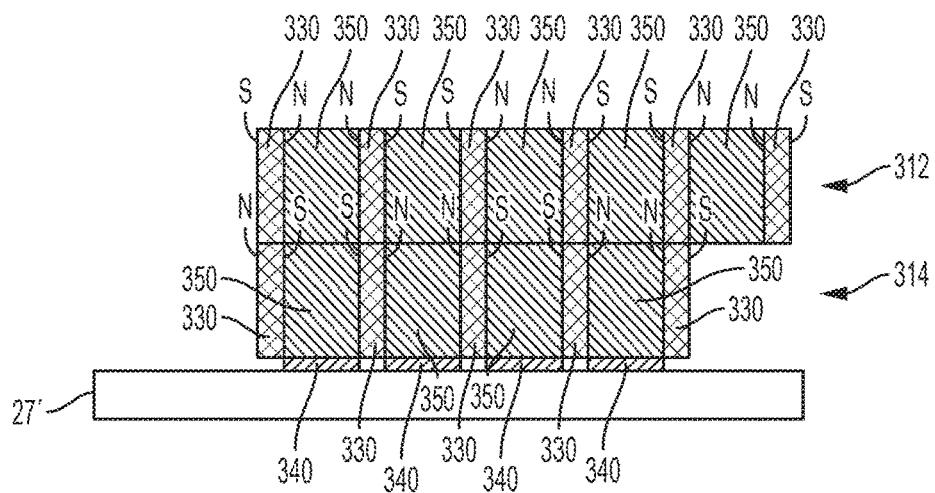
FIG. 33 illustrates the magnetic coupling device of FIG. 31 in an off state.

As mentioned herein other configurations of magnets may be used in place of permanent magnets 30, 32. Referring to FIGS. 31-33, an exemplary switchable permanent magnet assembly 300 of the present disclosure is represented. Switchable permanent magnet assembly 300 may replace magnetic flux source 15. Further, permanent magnet assembly 300 is placed in a non-ferrous housing, as opposed to housing 22 for magnetic coupling device 10. As explained in more detail herein pole portions 350 of permanent magnet system 300 are located at a lower side of the housing and contact workpiece 17 or have pole extension members 340 (see FIGS. 31-33) positioned directly below pole portions 350 and contacting workpiece 17.

Switchable permanent magnet assembly 300 includes an upper assembly 312 and a lower assembly 314. Each of assemblies 312 and 314 include a plurality of spaced-apart permanent magnets 330 and a plurality of pole portions 350. Each of the plurality of spaced-apart permanent magnets 330 are illustratively shown as a single permanent magnet, but may comprise multiple permanent magnets and/or at least one permanent magnet positioned within a housing.

Each permanent magnet 330 has a north pole side (N) and a south pole side (S). The permanent magnets 330 and pole portions 350 of assembly 312 and of assembly 314 are each arranged in a linear array wherein one of pole portions 350 is positioned between two of permanent magnets 330. Further, the permanent magnets 330 are arranged so that each of the two permanent magnets 330 contacting the pole portion 350 therebetween have either their north pole sides (N) or their south pole sides (S) contacting the pole portion 350. When the north pole sides (N) of the adjacent permanent magnets 330 are contacting a pole portion 350, the pole portion 350 is referred to as a north pole portion. When the south pole sides (S) of the adjacent permanent magnets 330 are contacting a pole portion 350, the pole portion 350 is referred to as a south pole portion.

In embodiments, lower assembly 314, like magnet 30 in tool 10, is held stationary relative to the housing containing lower assembly 314 and upper assembly 312, like magnet 32 in tool 10, rotates relative to lower assembly 314. Upper assembly 312 is translatable relative to lower assembly 314 in directions 390 and 392 to alter an alignment of the permanent magnets 330 and pole portions 350 of upper assembly 312 relative to the permanent magnets 330 and pole portions 350 of lower assembly 314. Permanent magnets 330 of lower assembly 312 are spaced apart from workpiece 17 due to pole shoes 340 coupled to pole portions 350. Alternatively, pole portions may be extended to provide the spacing. Additionally, a spacer (not shown) is provided between the permanent magnets of upper assembly 312 and lower assembly 314.

Figure 20:
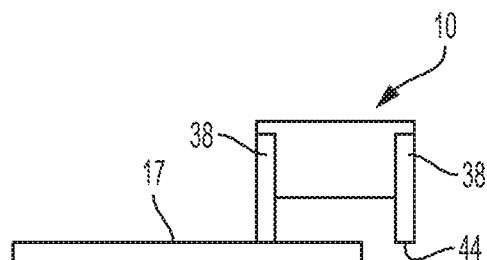
FIG. 20 illustrates a simplified front elevation view of the end of arm magnetic coupling device of FIG. 1 contacting a right edge portion of a workpiece.

Switchable permanent magnet assembly 300 is considered to be in an on state when the south pole portions 350 of lower assembly 314 are aligned with the south pole portions 350 of upper assembly 312 and the north pole portions 350 of lower assembly 314 are aligned with the north pole portions 350 of upper assembly 312 (see FIG. 20). In the on-state, workpiece 17 is held by switchable permanent magnet assembly 300 due to a completion of a magnetic circuit from the aligned north pole portions 350 of upper assembly 312 and lower assembly 314, through the workpiece 27, and to the aligned south pole portions 350 of upper assembly 312 and lower assembly 314.

Switchable permanent magnet assembly 300 is considered to be in an off state when the south pole portions 350 of lower assembly 314 are aligned with the north pole portions 350 of upper assembly 312 and the north pole portions 350 of lower assembly 314 are aligned with the south pole portions 350 of upper assembly 312 (see FIG. 22). In the off state, a workpiece 17 is not held by switchable permanent magnet assembly 300 due to a completion of a magnetic circuit within upper assembly 312 and lower assembly 314 from the aligned north pole portions 350 of upper assembly 312 to the south pole portions 350 of lower assembly 314 and from the aligned north pole portions of upper assembly 312 to the south pole portions 350 of lower assembly 314.

Switchable permanent magnet assembly 300 is considered to be in a partial on state when the south pole portions 350 of upper assembly 312 are partially overlapping the north pole portions 350 of lower assembly 314 and the north pole portions 350 of upper assembly 312 are partially overlapping the south pole portions 350 of lower assembly 314. When in the partial on state, a workpiece 17 may be held by switchable permanent magnet assembly 300 due to a completion of a magnetic circuit from the overlapping north pole portions 350 of upper assembly 312 and lower assembly 314, through the workpiece 17, and to the overlapping south pole portions 350 of upper assembly 312 and lower assembly 314. The strength of the magnetic circuit increases as the degree of overlap of the overlapping north pole portions 350 of upper assembly 312 and lower assembly 314 and the overlapping south pole portions 350 of upper assembly 312 and lower assembly 314 increases.

Further, sensors 98 may be positioned adjacent various ones of north pole and south pole portions 350. In embodiments, at least one of the north pole portions 350 and at least one of the south pole portions 350 has a sensor 98 associated therewith to monitor the leakage flux associated with the respective north pole portion and the respective south pole portion. As shown in FIG. 31, a first sensor 98 may be placed proximate to a north pole portion 350, such as directly over north pole portion 350 or radially outward of north pole portion 350, and a second sensor 98 may be placed proximate to a south pole portion 350, such as directly over south pole portion 350 or radially outward of south pole portion 350. Logic control circuit 23 may perform calibration runs for permanent magnet assembly 300 in a similar fashion as described herein for magnetic coupling device 10 to store sensor values for determining operating states of the device including permanent magnet assembly 200.

Referring to FIGS. 8-12, in embodiments, magnetic coupling tool 10 includes degaussing functionality for removing residual magnetism following handling of workpieces using magnetic coupling tool 10. Additional details regarding systems providing degaussing functionality are provided in U.S. Provisional Patent Application No. 62/490,706, titled MAGNETIC COUPLING TOOL WITH DEGAUSS CAPABILITY, filed Apr. 27, 2017, the entire disclosure of which are expressly incorporated by reference herein.

In an exemplary embodiment, magnetic coupling device 10 includes an on-off switchable di-pole magnetic flux source 15; a first housing component 22 in which is received the magnetic flux source 15; and a pair of magnetic pole extension shoes 38 having each a workpiece engagement surface 44. The pole extension shoes 38 are mounted to the first housing component 22 such as to receive magnetic flux from the magnetic flux source 15 and make such available at the workpiece engagement surfaces 44. At least one magnetic field sensors 98, but preferably a number of first magnetic field detection sensors equal in number to the number of pole extension shoes and/or workpiece engagement surfaces, are located a predetermined distance away but in close proximity to a flux detection surface 46 preferably at an end opposite the workpiece engagement surface 44 of an associated one of the pole extension shoes. A pair of degaussing electrical windings 110, one each wound about a section of an associated one of the two magnetic pole extension shoes 38, are provided. Logic control circuit 23 is further operative to (i) receive an output signal from the at least one magnetic field detection sensor and determine from said output signal(s) an operating state of the tool indicative of the magnetic flux source being switched off, (ii) in such event switch-on an electric power supply to the degaussing electrical windings and (iii) perform a degaussing cycle wherein the degaussing electrical windings generate an oscillating and alternating magnetic field over a predetermined time.

In embodiments, the degaussing electrical windings 110 and exchangeable pole extension shoe members 38 form modular units attachable to the first housing component 29, wherein the pole extension shoe members 38 form part of a magnetic flux delivery circuit of the EOAMT 10 when used in magnetically coupling the EOAMT 10 with a workpiece 17, as well as, form part with the degaussing windings 110 of an electromagnet which is operated in a degaussing cycle during degaussing of the workpiece 17.

In embodiments, the logic control circuit 23 is devised such that the degaussing cycle will be performed immediately before magnetic coupling device 10 is removed from a workpiece 17 that has previously been handled with magnetic coupling device 10, i.e. when magnetic coupling device 10 is stationary with the workpiece engagement surfaces 44 at the workpiece 17 and the magnetic flux source 15 has been turned off to effect decoupling. By performing the degaussing cycle at that stage, the pole shoes 38 of magnetic coupling device 10 will act as conduits to focus the degaussing operation to the workpiece area which in the first place will exhibit the magnetic remanence after placing magnetic coupling device 10 in the off state.

In embodiments, the pole extension shoes 38 are comprised of at least two components, a first pole extension member 38a secured in removable manner to the first housing component and a second pole extension member 38b removably secured in extension to the first member and defining the workpiece engagement surface 44, wherein the degaussing electrical windings 110 encircle a section of the second pole extension member 38b. This two-part pole shoe lay-out enables the EOAMT 10 to be deployed with or without degaussing functionality, by allowing simple decoupling of the second pole extension member 38b from the first pole extension member 38a, whereby the first pole shoe member 38a will then exhibit/provide the workpiece engagement surface 44. Equally, it allows the second pole shoe member 38b to be exchangeable so as to provide a workpiece engagement surface 44 that is optimized to the geometry of the workpiece 17.

In embodiments, the pole shoes 38 have, in the section covered by the degaussing windings 110, a cross section sufficient to direct a substantial and preferably all of the magnetic flux generated upon the degaussing windings 110 being energized, to the workpiece engagement surface 44. This ensures that all of the magnetic flux provided by the degaussing windings 110 is effectively used in performing degaussing of the workpiece 17 at the contact zone with the pole extension shoes 38. It is of course also possible for the pole shoes 38 to have in the section covered by the degaussing windings 110, a cross section sufficient to direct a substantial portion (but not all) of the magnetic flux generated upon being energized, to the workpiece engagement surface 44 and generate magnetic flux leakage around the workpiece engagement surface 44. This measure will assist in degaussing zones outside the immediate contact zone between pole extension shoes and workpiece.

In embodiments, the logic control circuit 23 further includes an AC driver (hardware or software) for generating a pulse width modulated (PWM) current which as explained in more detail herein is supplied to the degaussing windings 110. Further, in embodiments, functional blocks of the logic control circuit 23 for performing the degaussing cycle.

In embodiments, the degaussing windings 110, in being wrapped about (i.e. encircling) a section of the ferromagnetic pole extension shoes 38, effectively create an electromagnet. The control circuit and the microprocessor of logic control circuit 23 are configured such that the electromagnets are driven to alternate the polarity and magnitude beneath the poles shoes 38. The pole shoes 38 always have their fields in opposite directions during normal (coupling) use of the tool. For different size tools, the parameters of the electromagnets are changed to correlate the strength of the magnetic field to that of the switchable permanent magnet unit deployed in the magnetic coupling device 10 to overcome the residual magnetic field that is left in the workpiece without creating a new residual field.

The two electromagnets performing the degaussing function can be controlled using a typical DC motor driver. In order to minimize the residual magnetism left in the workpiece 17, an alternating magnetic field that decreases in magnitude is used. The alternating magnetic field is controlled by the microcontroller (through the dedicated DC motor drive chip) with a pulse width modulated (PWM) waveform and a direction pin. The direction pin is what alternates the direction of the current supplied to the degaussing windings (coils). The PWM waveform is what controls the actual magnetic field seen through the electromagnets.

There are a number of parameters that affect the PWM waveform, and in turn, the magnetic field, such as frequency, duty cycle, and amplitude. Workpieces 17 with different geometries and steel compositions require different parameters to property degauss. Therefore, the control circuit can either be provided with suitable memory banks for storing pre-defined parameter tables accessible to the programed microprocessor, or alternatively customized data can be stored which is sampled during calibration runs during which the parameters are cycled and changed, the residual magnetism of the workpiece measured and then an 'optimal' set of parameters for a PWM waveform determined, that achieves a desired degaussing level of the specific workpiece. Exemplary hardware circuits for achieving various forms of PWM drivers are provided in U.S. Pat. Nos. 3,895,270 and 4,384,313, although more generic circuits coupled to a programmable microprocessor may also be employed.

Turning to the Figures exemplary embodiments are illustrated. Referring to FIGS. 8-11, an exemplary embodiment of magnetic coupling device 10 including degaussing functionality is illustrated. Pole shoes 38 include degaussing windings 110 wrapped around each pole shoe 38.

Multi-piece ferromagnetic pole extension shoes 38 are provided. Pole shoes 38 are mounted to the width-ward recessed sides at the lower portion of housing 22 using a pair of fastening screws 40. Pole shoes 38 include an essentially rectangular prismatic first member 38a having chamfered edges along its height, which are mounted to the width-ward sides at the lower portion of housing 22 and complement the shape of the upper portion of housing 22, and a rectangular plate-like second member 38b secured by fastening screws 38c at the lower terminal ends of upright shoe member 38a. Alternative shapes of pole shoes 38' may be used.

The pole extension shoes 38 define at a lower face (i.e. at the second member 38b) respective workpiece engagement surfaces 44 which in the illustrated embodiment are planar, but could be of different geometry and/or contoured to form fittingly abut against a curved or uneven target surface of a workpiece to be magnetically coupled to and handled by tool 10. The fit of pole shoes members 38a to the receptacles defined at the lower portion of housing 22 is such as to minimize or indeed essentially avoid magnetic circuit air gaps; in other words, the thick-walled width-ward portions of housing 22 and the pole shoes 38' together form a magnetic flux path from the magnets 30, 32 to the top axial end faces of housing 22 and the lower end of pole shoes 38.

Figure 11:
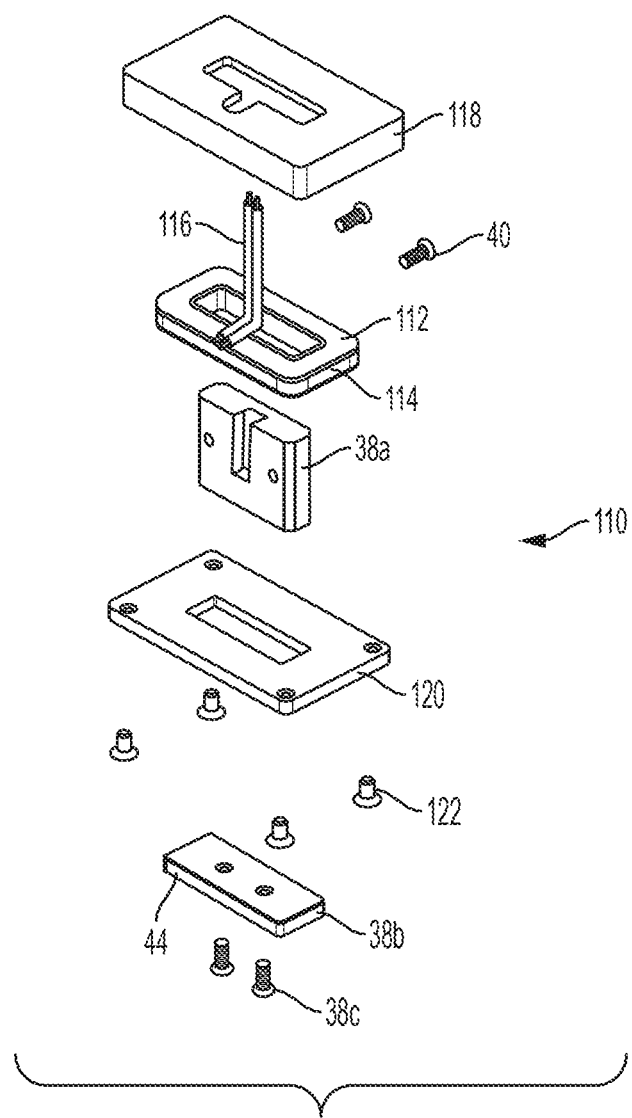
FIG. 11 illustrates an exploded view of one of the degaussing modules shown in FIG. 8.

Referring to FIG. 11, an exploded view of degauss assembly 110 is illustrated. Degauss assembly 110 includes an electric degaussing winding or coil 114 wound about a bobbin 112, with a 2-wire ribbon cable 116 for connection to a control circuit as will be explained below. Coil 114 and bobbin 112 are received within top bobbin cover 118 made of non-ferromagnetic steel or other material, whereby ribbon cable 116 passes through an opening in the top wall of bobbin cover 118. Bottom bobbin cover 120 is then fastened to top bobbin cover 118 via fasteners 122.

The above mentioned pole extension shoe 38 of the switchable permanent magnet unit 20 is then incorporated into the degaussing module by sliding rectangular prismatic pole shoe component 38a through an appropriately and correspondingly shaped opening in the middle of bottom bobbin cover 120 to extend through bobbin 112 and protrude past the complementary opening in top bobbin cover 118. The customizable pole extension shoe component 38b, which provides the workpiece engagement surface 44, is either already attached to the lower axial end of pole shoe component 38a using fasteners 38c, or can be secured afterwards, and comes to abut against the lower bobbin cover plate 120. As previously noted, pole extension shoe component 38a and degaussing coil 114 effectively provide a dedicated electromagnet for performing the degaussing cycle.

Figure 10:
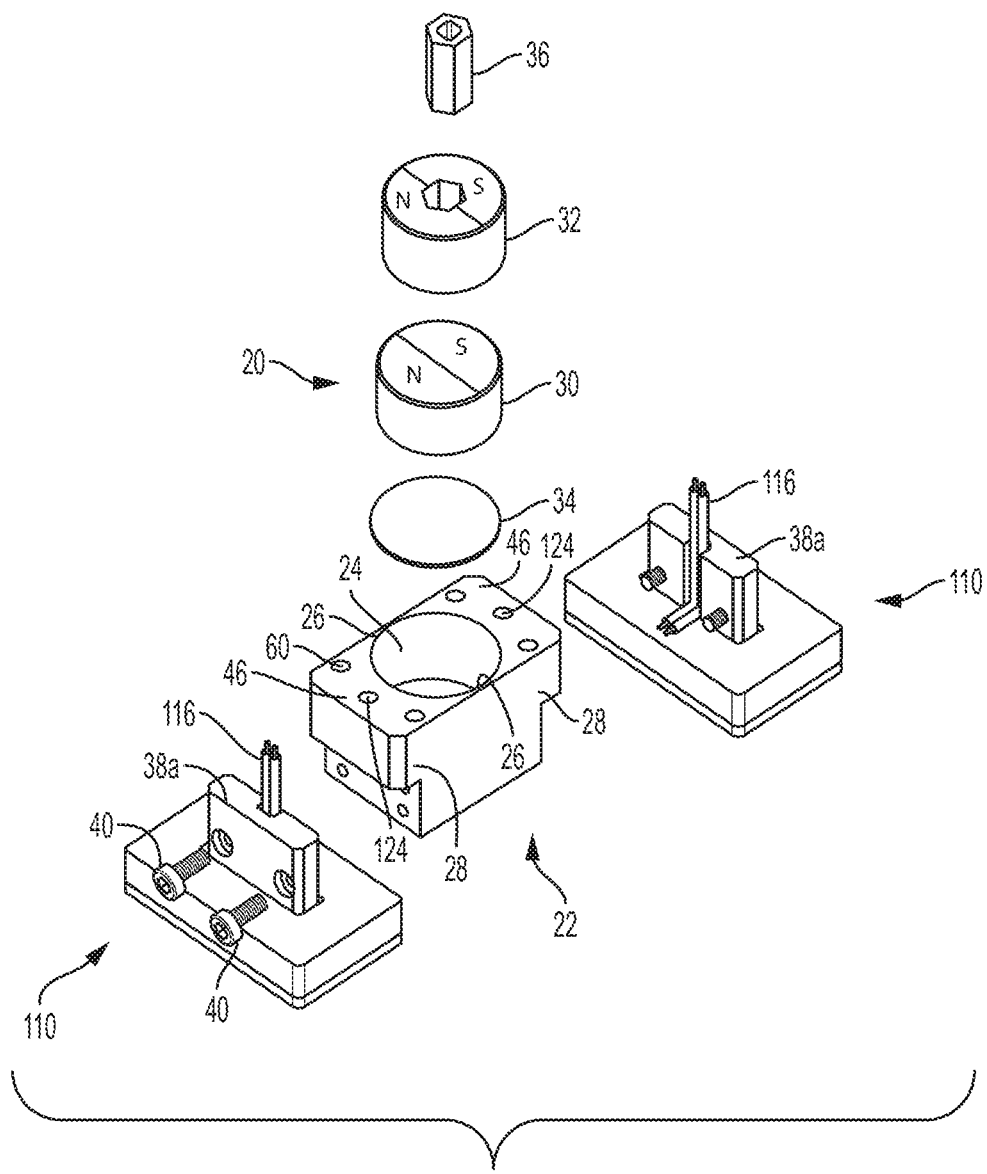
FIG. 10 illustrates an exploded view of the magnetic flux source of the end-of-arm magnetic coupling tool of FIG. 8, being an on/off switchable permanent magnet unit, and two degaussing modules that carry pole extension shoes for the magnetic flux source.

Now referencing FIG. 10, each 2-wire ribbon cable 116 is routed through dedicated degauss wire routing bores 124 extending through the upper portion of housing 22 on either width-ward side of cylindrical bore 24, and the two degauss modules 110 are then attached to housing 22 of switchable magnet unit 20 through the above mentioned fastening bolts 40, thus also securing the pole extension shoes 38 to the unit 22 and thus providing for completion of the switchable magnetic flux source used in normal operation of the tool 10 to attach to a workpiece.

The logic control circuit 23, in particular main PCB 92 incorporates the necessary hardware and software required for operating the degauss modules 110, in particular for generating the degaussing AC (and controlling its waveform) that is sent through the degaussing coils 114. The 2-wire ribbon cables 116 of degaussing modules 110 attach to sockets at pole board PCB 94 which is connected to main control board PCB 92 via board-to-board connectors 102, 104.

Current (which given it is PWM-modulated can appropriately also be described as an operating signal for the degaussing coils 114) going through the ribbon cables 116 to the coils 114 is controlled via the microcontroller and a motor driver on the main control PCB 92. These signals are controlled via a PWM waveform from the microcontroller to provide a high frequency AC signal. The degaussing PWM and direction pin work by alternating positive/negative between the North and South poles and decreasing the magnitude each period. Depending on the material composition and geometry of the workpiece being degaussed, different waveform parameters need to be changed including, but not limited to, frequency, magnitude, and shape.

The PWM signals effectively create a rapidly changing magnetic degaussing circuit with the workpiece which eliminates the residual magnetism. Exemplary processes are disclosed herein.

As regards degaussing coils 114, the wire gage, length, and number of windings (as well as how far those winding are from the pole extension shoe (or core of the electromagnet) of the coil affect the inductance and resistance of the coils. The changes in inductance and resistance affect the ramp up time of the coils, which means different coils (different size units) need different series of PWM waveforms. The ideal ramp up time can be calculated to determine the appropriate frequency. In general, larger degaussing units require more coil mass, which increases the ramp up time meaning that larger units will take longer to degauss.

The way the coils are wired also has an effect on the inductance and resistance of the coils. If the coils are wired in series the resistance is roughly double that of when they are in parallel. Thus, the way the coils are wired also has an effect on the PWM waveform.

In embodiments, five parameters are used by the logic control circuit 23 to alter the operation of degaussing coils 114. These parameters include (a) Prescaler: The prescaler divides the counter clock frequency from the main clock of the main PCB board's STM32F030R8T6. 240 has been the standard used for consistency (when the period is set to 200 the frequency for each pulse is 1 kHz); (b) Period: The period for each individual pulse (positive integer with 1 unit=5 µs when prescaler set to 240); (c) Steps: The number of pulses at each amplitude (positive integer); (d) Cycles: The number of amplitudes used to degauss (positive integer); and (e) Amplitude: The maximum duty cycle used to degauss (float with 0<x<1).

Figure 12:
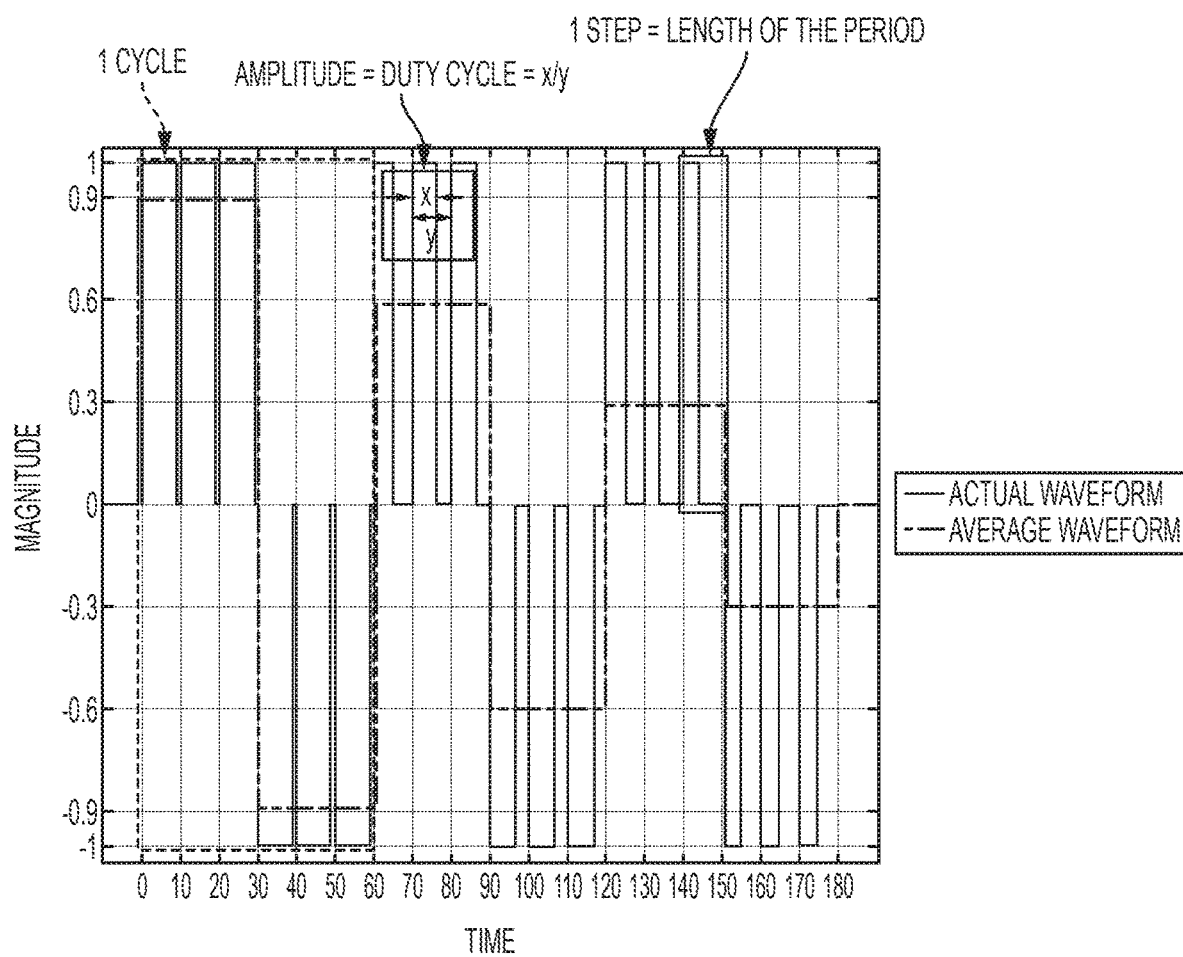
FIG. 12 illustrates an exemplary degauss wave form of use in a degaussing cycle with the degaussing modules of FIG. 11.

An exemplary degauss waveform is shown in FIG. 12. It should be noted though that the step function could be replaced with other type of functions that seek to mimic a sine wave form more closely. The following is the list of parameters used to create the waveform of FIG. 12: (a) Period: 10 (1 time unit on this graph=5 µs when the prescaler is set to 240); (b) Steps: 3 (Note that there are 3 positive steps and 3 negative steps per cycle); (c) Cycles: 3 (Note that The waveform goes positive and then negative a total of 3 times. Further note that the number of cycles is equivalent to the number of different magnitudes); (d) Amplitude: 0.9 (Note that the maximum duty cycle is 0.9 and that the average waveform magnitude is equal to the duty cycle/amplitude. Further note that the magnitudes are determined from the maximum amplitude divided by the number of cycles 0.9/3=0.3 (1st Cycle=±0.9; 2nd Cycle=±0.6; and 3rd Cycle=±0.3)).

By performing calibration runs in varying the above parameters, the degaussing efficiency and efficacy of magnetic coupling tool 10 may be optimized. For example, the table below was prepared using data obtained using a prototype coupling tool with degauss functionality based on a Magswitch AR70 unit. The table compares the performance of different software parameters and the maximum residual gauss level observed. This data was taken on 51200 steel, which is known to retain residual magnetism. This data was taken with the prescaler set to 240.

TABLE 1

AR70 Degauss Data on 51200 Steel

| Test # | Period (1 unit = 5 μs) | Steps | Cycles | Amplitude | Max Residual Observed (G) |
|---|---|---|---|---|---|
| 1 | 400 | 100 | 5 | 0.95 | 12 |
| 2 | 400 | 50 | 10 | 0.95 | 17 |
| 3 | 400 | 50 | 5 | 0.95 | 15 |

The number of steps per cycle was double the amount for the $1^{st}$ test as compared to the $2^{nd}$ and $3^{rd}$ tests. The first test had a lower residual, thus the ramp up for the $2^{nd}$ and $3^{rd}$ test was not long enough (the number of steps directly relates to the ramp up).

Using a different type of magnetic flux unit, a Magswitch J50 unit with degauss capability, different tests were conducted which show the importance of running calibration tests in determining the best degaussing outcomes for a given workplace.

The following software parameters were used in the generation of a PWM signal supplied to the degaussing coils: Prescaler: 240; Period: 250; Steps: 10; Cycles: 20; and Amplitude: 0.7. With these parameters, the degauss cycle took roughly 200 ms, and the maximum current draw of the coils was about 0.9 A. The coils were wired in parallel for this unit. The total resistance of the coils was roughly 8Ω.

With a change of parameters, different outcomes are observable. The following software parameters were used in the generation of a PWM signal supplied to the degaussing coils for a second test: Prescaler: 240; Period: 300; Steps: 10; Cycles: 20; and Amplitude: 0.7. With these parameters, the degauss cycle takes roughly 200 ms, and the maximum current draw was about 0.3 A. The coils are wired in series for this unit. The total resistance of the coils was roughly 30Ω.

A number of other parameters were tested before narrowing these down. Initially, the number of steps was much greater, but it was creating a more sustained magnetic field that had negative effects on degaussing. The number of cycles was initially much lower, but with a decreased number of steps, the number of cycles could be increased while keeping the degauss cycle under 0.5 s. The amplitude was initially higher, but with the increased frequency on this unit, there were issues with the limits of the transistor switching speeds.

It will be understood that the above provided data is based on prototype development and optimization will yield degaussing cycle times that are acceptable in robotic handling of workpieces.

Figure 24:
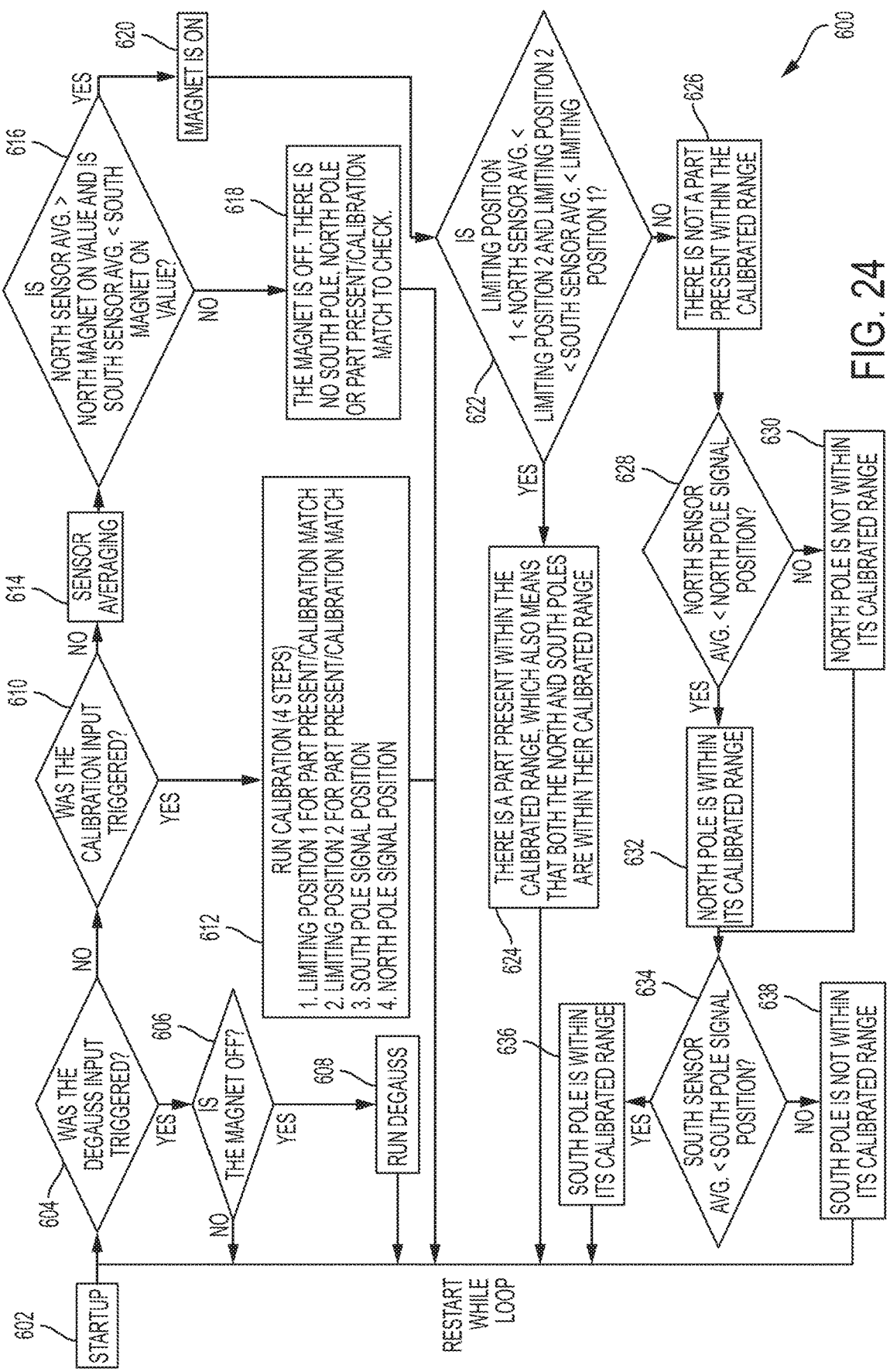
FIG. 24 illustrates an exemplary processing sequence of the control logic, including calibration subroutine, performed by the end-of-arm magnetic coupling tool during operation.

Referring to FIG. 24, a functional processing sequence 600 of logic control circuit 23 is illustrated. The processing sequence shows the various steps which the tool's software is programmed to undertake in employing an initial four calibration process of the tool (as compared to the 3-step outline above) for a given workpiece 17, and the steps performed in determining the various possible status of the tool in its magnetic interaction with the workpiece 17, based on comparison of actual sensor data with calibrated threshold sensor data (averaged). The tool 10 executes a startup routine, as represented by block 602. A check is made to see if a degauss input of the input devices 41 was triggered, as represented by block 604. If triggered a check is made to determine if the magnetic flux source 15 is in an off state, as represented by block 606. If so, a degauss cycle is performed as represented by block 608.

If the degauss input was not triggered, a check is made to determine if a calibration input of the input devices 41 was triggered, as represented by block 610. If so, a four step calibration run is performed, as represented by block 612. In one example, magnetic coupling device 10 is calibrated to a single sheet thickness (1 mm) that is a small square (100 mm×100 mm). The two Limiting Positions are calibrated for positions of magnetic coupling device 10 near the center of the sheet. The North pole signal is calibrated for the north pole shoe being on an edge of the sheet (not in the corners) and the South pole signal is calibrated for the south pole shoe being on an edge of the sheet (not in the corners).

If the calibration input was not triggered, the sensor values for magnetic sensors 98 are averaged, as represented by block 614. In one example, block 614 entails for each sensor 98 averaging the magnetic field sensor values of the tool sampling magnetic flux data points within a defined (very short) measurement time period, and processing these signals by the on-board processor of the magnetic field sensor and sensor signal processing circuit unit, all of which can be performed in a few milliseconds. This of course increases accuracy of data sampling and performance of the tool's sensor suite to determine the different tool status.

A check is made to see if the sampled values indicate that the magnetic flux unit 15 is in an on state (or calibrated partial on state), as represented by block 616. If not, it is determined the magnetic flux circuit is off, as represented by block 618. If so, the magnetic flux circuit is indicated to be on, as represented by block 620.

Next, the averaged sensor values for the magnetic sensor associated with the north pole shoe and the sensor values for the magnetic sensor associated with the south pole are checked to see it is within the range of the limiting position 1 and limiting position 2 calibrated values, as represented by block 622. On the small thin plate mentioned above, the magnetic flux sensor values will start to change rapidly as the magnetic coupling device is moved away from the center of the plate. If both are in range, it is determined that a part is present and engaged in a targeted zone, as represented by block 624. If not, a check of the magnetic flux sensor values for each magnetic sensor 98 is compared to the respective pole position calibration values to determine if either the north pole or the south pole is on the part, as represented by blocks 626-638.

In one embodiment, a six step calibration procedure is implemented. The following sensor values are calibrated: (1) Limiting position 1 North best flux circuit; (2) Limiting position 1 South best flux circuit; (3) Limiting position 2 North worst flux circuit; (4) Limiting position 2 South worst flux circuit; (5) South pole position; and (6) North pole position. This calibration procedure differs from the four step calibration sequence above wherein the limit positions corresponded to the center of the sheet. In this procedure, the magnetic coupling device 10 is within the limit ranges as long as both the north pole shoe and the south pole shoe are on the sheet. For sensor values (1) and (2), the magnetic coupling device 10 is located at the center of the sheet, and these values are recorded. For sensor value (3), the magnetic coupling device 10 is located with the north pole shoe adjacent to two edges of the sheet (in a corner) and the value for the north pole shoe sensor is recorded. For sensor value (4), the magnetic coupling device 10 is located with the south pole shoe adjacent to two edges of the sheet (in a corner) and the value for the south pole shoe sensor is recorded. Sensor values (5) and (6) are the same as sensor values (3) and (4) for one example (limit range is whole sheet). If the sensor values for (3) and (4) where for positions not in the corners of the sheet, then sensor values (5)_and (6) would differ from (3) and (4) because sensor values (5) and (6) are taken with magnetic coupling device in the corners of the sheet. Referring to FIG. 25, an exemplary robotic system 700 is illustrated. The embodiments described in relation to robotic system 700 may be applied to other types of machines, (e.g., mechanical gantries, crane hoists, pick and place machines, etc.).

Robotic system 700 includes electronic controller 770. Electronic controller 770 includes additional logic stored in associated memory 774 for execution by processor 772. A robotic movement module 702 is included which controls the movements of a robotic arm 704. In the illustrated embodiment, robotic arm 704 includes a first arm segment 706 which is rotatable relative to a base about a vertical axis. First arm segment 706 is moveably coupled to a second arm segment 708 through a first joint 710 whereat second arm segment 708 may be rotated relative to first arm segment 706 in a first direction. Second arm segment 708 is moveably coupled to a third arm segment 711 through a second joint 712 whereat third arm segment 711 may be rotated relative to second arm segment 708 in a second direction. Third arm segment 711 is moveably coupled to a fourth arm segment 714 through a third joint 716 whereat fourth arm segment 714 may be rotated relative to third arm segment 711 in a third direction and a rotary joint 718 whereby an orientation of fourth arm segment 714 relative to third arm segment 711 may be altered. Magnetic coupling device 10 is illustratively shown secured to the end of robotic arm 704. Magnetic coupling device 10 is used to couple a workpiece 17 (not shown) to robotic arm 704. Although magnetic coupling device 10 is illustrated, any of the magnetic coupling devices described herein and any number of the magnetic coupling devices described herein may be used with robotic system 700.

In one embodiment, electronic controller 770 by processor 772 executing robotic movement module 702 moves robotic arm 704 to a first pose whereat magnetic coupling device 100 contacts the workpiece at a first location. Electronic controller 770 by processor 772 executing a magnetic coupler state module 776 instructs magnetic device 10 to move upper magnet 32 relative to lower magnet 30 to place magnetic coupling device 10 in one of the on state or a partial on state to couple the workpiece to robotic system 700. In embodiments, magnetic coupler state module 776 includes the functionality of logic control circuit 23. Thus, the functionality of logic control circuit 23 may be located within tool 10 or remote from tool 10. Electronic controller 770 by processor 772 executing robotic movement module 702 moves the workpiece from the first location to a second, desired, spaced apart location. Once the workpiece is at the desired second location, electronic controller 770 by processor 772 executing magnetic coupler state module 776 instructs magnetic device 10 to move upper magnet 12 relative to lower magnet 14 to place magnetic coupling device 10 in the off state to decouple the workplace from robotic system 700. Electronic controller 770 then repeats the process to couple, move, and decouple another workpiece 17. In one embodiment, prior to moving away from the workpiece 17, controller 770 instructs magnetic coupling device 10 to execute a degauss cycle.

Figure 35:
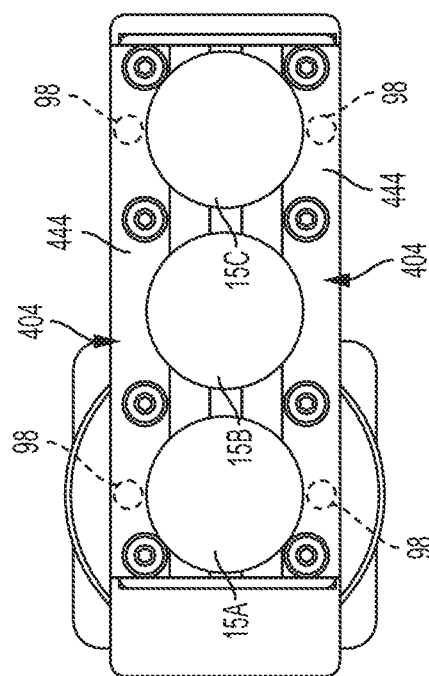
FIG. 35 illustrates a bottom view of the linear array magnetic coupling device of FIG. 34.
Figure 34:
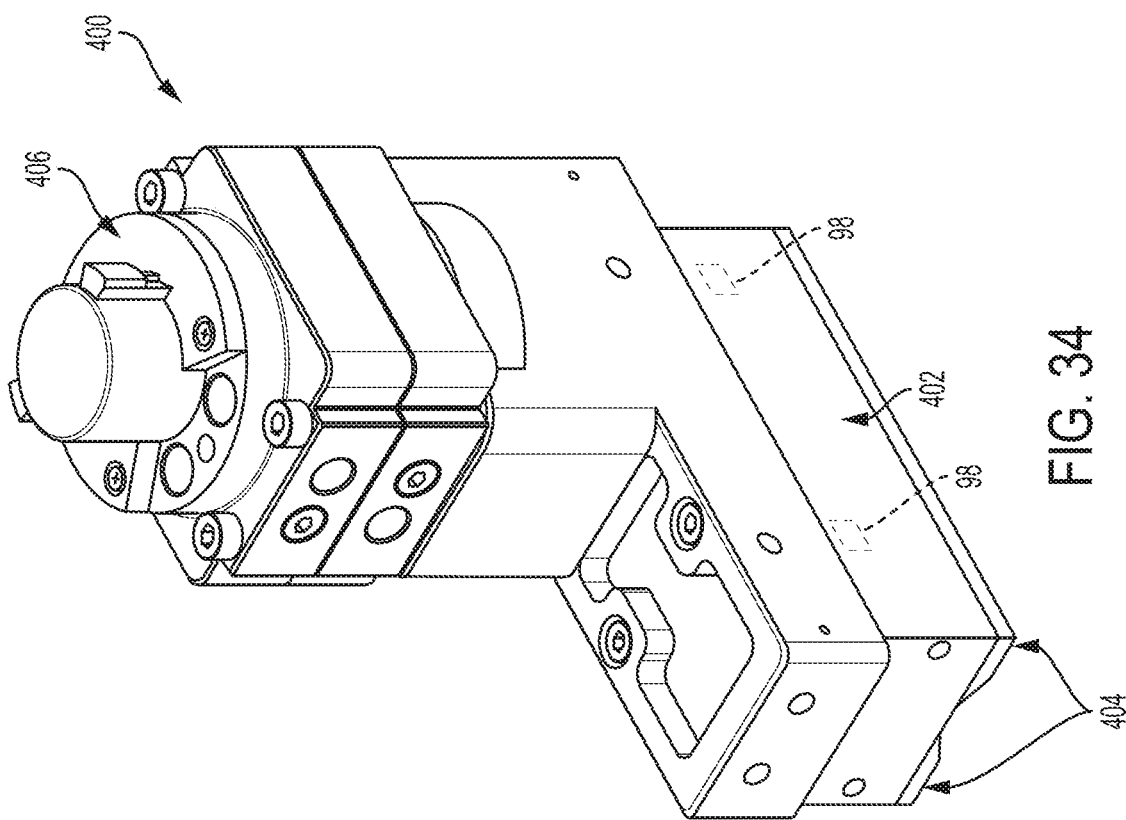
FIG. 34 illustrates a perspective view of an exemplary linear array magnetic coupling device including sensors and logic control circuit for determining operational states of the magnetic coupling device.

In embodiments, magnetic coupling device 10 has an elongated housing to hold multiple instances of magnetic flux source 15 in a linear array. An exemplary device having multiple instances of magnetic flux source 15 is the LAY Series unit as manufactured and sold by Magswitch Technology Inc. Referring to FIGS. 34 and 35, a magnetic coupling device 400 is shown. Magnetic coupling device 400 includes a housing 402 containing multiple instances of magnetic flux source 15, illustratively flux sources 15A-C. Pole extension shoes 404 are provided along a lower side of housing 402. The relative positions of magnet 32 of each instance of magnetic flux source 15 is controlled through an actuator 406. Each instance of magnetic flux source 15 operates in the same manner as for magnetic coupling device 10 and are placable in any one of an on state, an off state, and a partial on state.

Further, magnetic coupling device 400 includes magnetic field sensors 98 positioned within housing 402. Magnetic field sensors 98 are shown being positioned proximate the pole shoes 404 of two of the magnetic flux sources 15, illustratively flux sources 15A and 15C. In embodiments, magnetic field sensors 98 are associated with only a single flux source 15 of the plurality of magnetic flux sources 15A-C. In embodiments, magnetic field sensors 98 are associated with each flux source 15 of the plurality of magnetic flux sources 15A-C. Logic control circuit 23 by monitoring the magnetic field sensors 98, is able to determine a quality of magnetic circuit formed by workpiece engagement surfaces 444 of pole shoes 404 and a workpiece 17, proximity to a workpiece 17, or other operating states disclosed herein.

Figure 37:
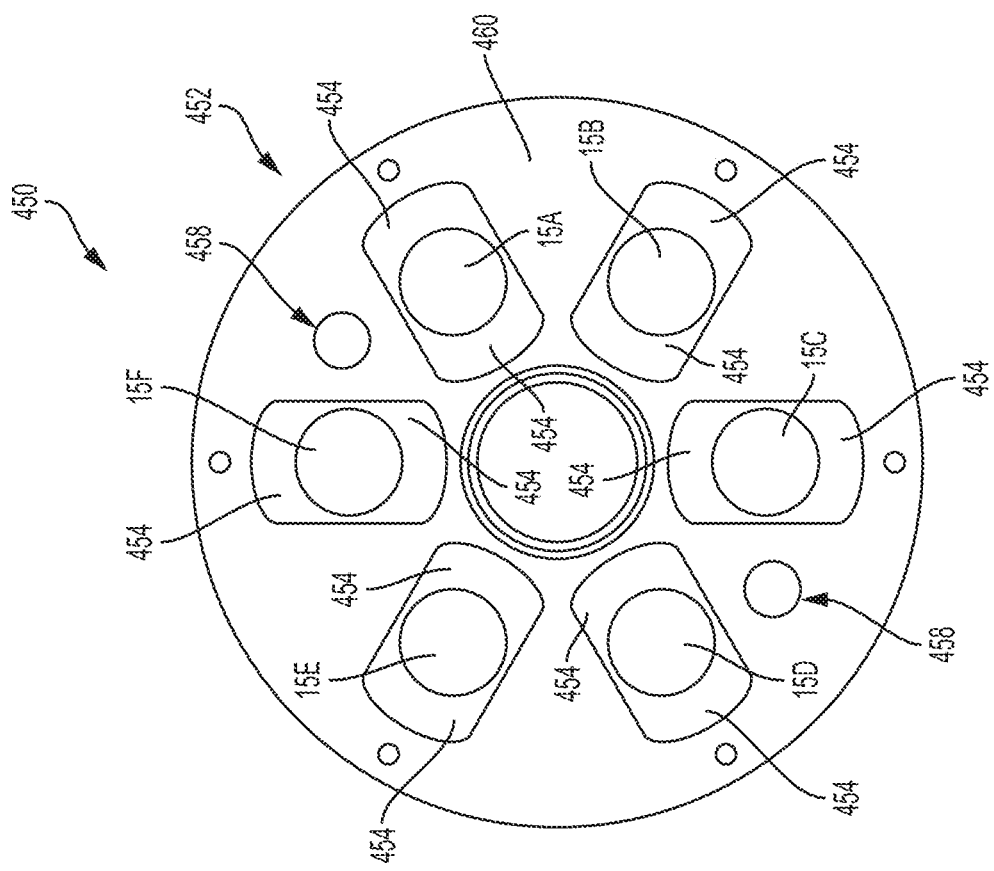
FIG. 37 illustrates a bottom view of the circular array magnetic coupling device of FIG. 36.
Figure 36:
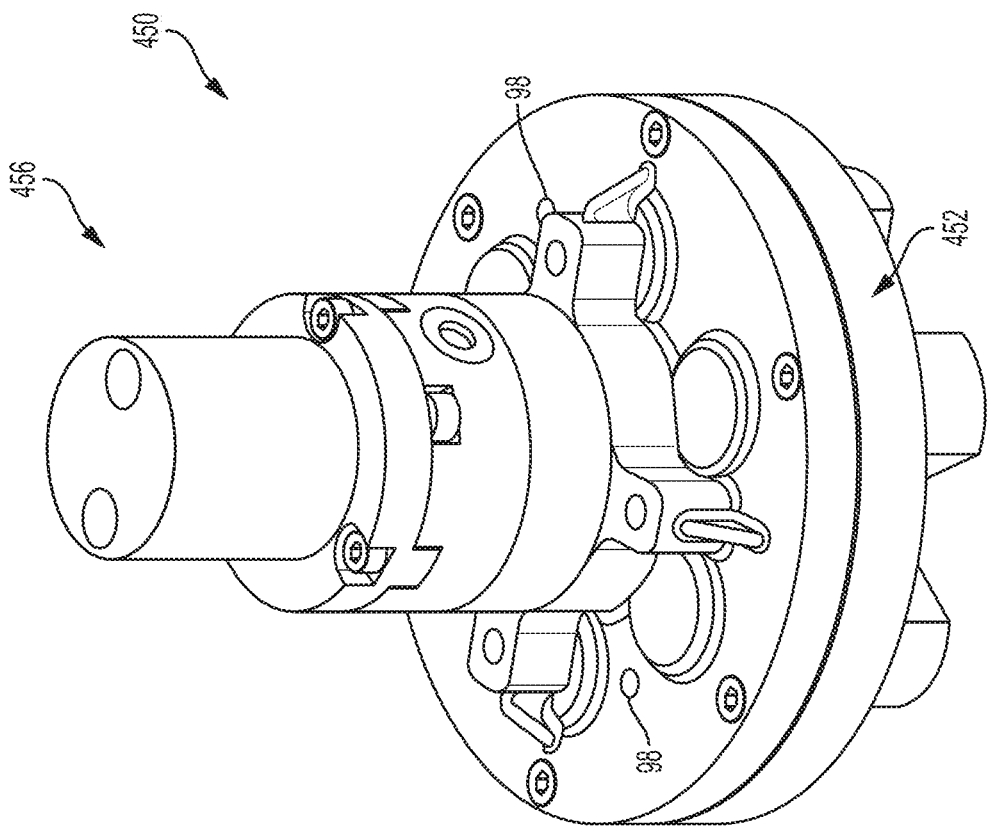
FIG. 36 illustrates a perspective view of an exemplary circular array magnetic coupling device including sensors and logic control circuit for determining operational states of the magnetic coupling device.

In embodiments, magnetic coupling device 10 has an elongated housing to hold multiple instances of magnetic flux source 15 in a circular array. An exemplary device having multiple instances of magnetic flux source 15 is the AY Series unit as manufactured and sold by Magswitch Technology Inc. Referring to FIGS. 36 and 37, a magnetic coupling device 450 is shown. Magnetic coupling device 450 includes a housing 452 supporting multiple instances of magnetic flux source 15, illustratively flux sources 15A-F, each having its own pair of workpiece engagement surfaces 454. The relative position of magnet 32 for each instance of magnetic flux source 15 is controlled through an actuator 456. Each instance of magnetic flux source 15 operates to form magnetic working circuits therebetween through workpiece 17. The operation of magnetic coupling device 450 is described in more detail in U.S. Pat. No. 9,484,137, the entire disclosure of which is expressly incorporated by reference.

Further, magnetic coupling device 450 includes magnetic field sensors 98 positioned within housing 452. In embodiments, magnetic field sensors 98 are positioned in cylindrical protrusions 458 extending down from a lower surface 460 of housing 452. In the illustrated embodiment, two magnetic sensors 98 are positioned in respective protrusions 458, one being positioned between magnetic flux source 15F and 15A and the other positioned between magnetic flux sources 15C and 15D. In embodiments, a magnetic field sensor 98 is positioned in a protrusion 458 between any two of magnetic flux sources. In embodiments, magnetic field sensors 98 are positioned in respective protrusions between each pair of adjacent magnetic flux sources 15A-F along a diameter of the circular array. Logic control circuit 23 by monitoring the magnetic field sensors 98, is able to determine a quality of magnetic circuit formed by workpiece engagement surfaces 454 of magnetic flux sources 15A-F and a workpiece 17, proximity to a workpiece 17, or other operating states disclosed herein.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the described features. Accordingly, the scope of the present invention is intended to embrace all such alternatives, modifications, and variations as fall within the scope of the claims, together with all equivalents thereof.

The invention claimed is:

1. A magnetic coupling tool for magnetically coupling to a ferromagnetic workpiece, comprising:
    a housing;
    a switchable magnetic flux source supported by the housing including a plurality of permanent magnets, the plurality of permanent magnets including a first permanent magnet and a second permanent magnet movable relative to the first permanent magnet;
    a plurality of workpiece engagement surfaces supported by the housing and magnetically coupled to the switchable magnetic flux source, the plurality of workpiece engagement surfaces adapted to contact the ferromagnetic workpiece, a first workpiece engagement surface of the plurality of workpiece engagement surfaces corresponding to a north pole of the magnetic coupling tool and a second workpiece engagement surface of the plurality of workpiece engagement surfaces corresponding to a south pole of the magnetic coupling tool, the second permanent magnet being movable relative to the first permanent magnet to alter the magnetic flux at both the first workpiece engagement surface of the switchable magnetic flux source and the second workpiece engagement surface of the switchable magnetic flux source;
    a plurality of magnetic field sensors supported by the housing, a first magnetic field sensor of the plurality of magnetic field sensors positioned to monitor a first magnetic flux associated with the first workpiece engagement surface of the plurality of workpiece engagement surfaces and a second magnetic field sensor of the plurality of magnetic field sensors positioned to monitor a second magnetic flux associated with the second workpiece engagement surface of the plurality of workpiece engagement surfaces; and
    a logic control circuit operatively coupled to the plurality of magnetic field sensors, the logic control circuit configured to determine at least one operating state of the magnetic coupling tool based on an output from at least one of the plurality of magnetic field sensors.

2. The magnetic coupling tool of claim 1, wherein the logic control circuit is configured to determine if the switchable magnetic flux source is in an off state.

3. The magnetic coupling tool of claim 2, wherein the logic control circuit determines if the switchable magnetic flux source is in an off state by a comparison of an output of at least one of the plurality of magnetic field sensors to a first threshold stored on a memory accessible by the logic control circuit.

4. The magnetic coupling tool of claim 1, wherein the logic control circuit is configured to determine if at least one of the plurality of workpiece engagement surfaces is proximate to the ferromagnetic workpiece.

5. The magnetic coupling tool of claim 4, wherein the logic control circuit determines if at least one of the plurality of workpiece engagement surfaces is proximate to the ferromagnetic workpiece by a comparison of an output of at least one of the plurality of magnetic field sensors to a second threshold stored on a memory accessible by the logic control circuit.

6. The magnetic coupling tool of claim 1, wherein the logic control circuit is configured to determine a spacing of the first workpiece engagement surface from the ferromagnetic workpiece.

7. The magnetic coupling tool of claim 6, wherein the spacing of the first workpiece engagement surface from the ferromagnetic workpiece is determined by a comparison of an output of the first magnetic field sensor to at least one threshold stored on a memory accessible by the logic control circuit.

8. The magnetic coupling tool of claim 1, wherein the logic control circuit is configured to determine an orientation of the first workpiece engagement surface and the second workpiece engagement surface relative to the ferromagnetic workpiece.

9. The magnetic coupling tool of claim 8, wherein the orientation of the first workpiece engagement surface and the second workpiece engagement surface relative to the ferromagnetic workpiece is determined by a comparison of an output of the first magnetic field sensor and an output of the second magnetic field sensor.

10. The magnetic coupling tool of claim 9, wherein a first spacing between the first workpiece engagement surface and the ferromagnetic workpiece and a second spacing between the second workpiece engagement surface and the ferromagnetic workpiece are determined by the logic control circuit to be generally equal when the output of the first magnetic field sensor and the output of the second magnetic field sensor satisfy a first criteria.

11. The magnetic coupling tool of claim 10, wherein the first criteria is that the output of the first magnetic field sensor is within a threshold amount of the output of the second magnetic field sensor.

12. The magnetic coupling tool of claim 1, wherein the logic control circuit is configured to determine if a placement of the first workpiece engagement surface and the second workpiece engagement surface relative to the ferromagnetic workpiece are within a target zone of the ferromagnetic workpiece.

13. The magnetic coupling tool of claim 12, wherein the placement of the first workpiece engagement surface and the second workpiece engagement surface relative to the ferromagnetic workpiece are determined to be within a target zone of the ferromagnetic workpiece when both an output of the first magnetic field sensor satisfies a first criteria and an output of the second magnetic field sensor satisfies a second criteria.

14. The magnetic coupling tool of claim 13, wherein the first criteria is the output of the first magnetic field sensor is within a first range of magnetic flux values and the second criteria is the output of the second magnetic field sensor is within a second range of magnetic flux values.

15. The magnetic coupling tool of claim 14, wherein the first range of magnetic flux values includes a first limit value corresponding to the first workpiece engagement surface positioned at a first limit position of the target zone relative to the ferromagnetic workpiece and a second limit value corresponding to the first workpiece engagement surface positioned at a second limit position of the target zone relative to the ferromagnetic workpiece.

16. The magnetic coupling tool of claim 14, wherein the second range of magnetic flux values includes a first limit value corresponding to the second workpiece engagement surface positioned at a first limit position of the target zone relative to the ferromagnetic workpiece and a second limit value corresponding to the second workpiece engagement surface positioned at a second limit position of the target zone relative to the ferromagnetic workpiece.

17. The magnetic coupling tool of claim 13, wherein the logic control circuit determines a first end of the magnetic coupling tool including the first workpiece contact surface is positioned outside of the target zone when the second criteria is satisfied and the first criteria is not satisfied.

18. The magnetic coupling tool of claim 17, wherein the logic control circuit determines a second end of the magnetic coupling tool including the second workpiece contact surface is positioned outside of the target zone when the first criteria is satisfied and the second criteria is not satisfied.

19. The magnetic coupling tool of claim 1, wherein the logic control circuit is configured to determine an orientation of the first workpiece engagement surface and the second workpiece engagement surface relative to the ferromagnetic workpiece in two rotational axes based on the output of the plurality of magnetic field sensors.

20. The magnetic coupling tool of claim 19, wherein the plurality of magnetic field sensors includes a third magnetic field sensor and a fourth magnetic field sensor, the first magnetic field sensor being positioned in a left side half of the magnetic coupling tool, the second magnetic field sensor being positioned in a right side half of the magnetic coupling tool, the third magnetic field sensor being positioned in a front half of the magnetic coupling tool, the front half including a first portion of the left side half and a first portion of the right side half, and the fourth magnetic field sensor being positioned in a rear half of the magnetic coupling tool, the rear half including a second portion of the left side half and a second portion of the right side half, the logic control circuit determines the orientation of the first workpiece engagement surface and the second workpiece engagement surface relative to the ferromagnetic workpiece in two rotational axes based on the output of each of the first magnetic field sensor, the second magnetic field sensor, the third magnetic field sensor, and the fourth magnetic field sensor.

21. The magnetic coupling tool of claim 19, wherein the logic control circuit is configured to determine an orientation of the first workpiece engagement surface and the second workpiece engagement surface relative to the ferromagnetic workpiece in two rotational axes based on the output of the plurality of magnetic field sensors, the first magnetic field sensor and the second magnetic field sensor each being a three-dimensional magnetic field sensor.

22. The magnetic coupling tool of claim 19, wherein the logic control circuit is further configured to determine a spacing of the magnetic coupling tool relative to the ferromagnetic workpiece.

23. The magnetic coupling tool of claim 22, wherein the logic control circuit is configured to determine the spacing of the magnetic coupling tool relative to the ferromagnetic workpiece independent of the orientation of the magnetic coupling tool relative to the ferromagnetic workpiece.

24. The magnetic coupling tool of claim 1, wherein the logic control circuit is configured to determine, whether one or more of the workpiece engagement surfaces at the pole extension shoes abut a workpiece, and whether abutment of a workpiece at one or more of the workpiece engagement surfaces is adequate and within predetermined positional thresholds.

25. The magnetic coupling tool of claim 1, further comprising an actuator operatively coupled to the second permanent magnet to move the second permanent magnet relative to the first permanent magnet.

26. The magnetic coupling tool of claim 25, wherein the actuator is a stepper motor.

27. The magnetic coupling tool of claim 25, wherein the logic control circuit is operatively coupled to the actuator to control an orientation of the second permanent magnet relative to the first permanent magnet.

28. The magnetic coupling tool of claim 1, wherein the second permanent magnet is rotatable relative to the first permanent magnet about an axis intersecting with the second permanent magnet to alter a position of the second permanent magnet relative to the first permanent magnet.

29. The magnetic coupling tool of claim 1, wherein the second permanent magnet is rotatable relative to the first permanent magnet about an axis in a non-intersecting relationship with the second permanent magnet to alter a position of the second permanent magnet relative to the first permanent magnet.

30. The magnetic coupling tool of claim 29, further comprising a first platter supported by the housing and a second platter supported by housing, the second platter being moveable relative to the first platter to alter a position of the second permanent magnet relative to the first permanent magnet,
wherein the first platter comprising
a first plurality of spaced apart permanent magnets including the first permanent magnet, each of the first plurality of spaced apart permanent magnets has a north pole side and a south pole side, and
a first plurality of pole portions interposed between adjacent permanent magnets of the first plurality of permanent magnets, wherein the first plurality of permanent magnets are arranged so that each pole portion of the first plurality of pole portions is one of a north pole portion which is adjacent the north pole side of two permanent magnets of the first plurality of permanent magnets and a south pole portion which is adjacent the south pole side of two permanent magnets of the first plurality of permanent magnets;
the second platter comprising
a second plurality of spaced apart permanent magnets including the second permanent magnet, each of the second plurality of spaced apart permanent magnets has a north pole side and a south pole side, and
a second plurality of pole portions interposed between adjacent permanent magnets of the second plurality of permanent magnets, wherein the second plurality of permanent magnets are arranged so that each pole portion of the first plurality of pole portions is one of a north pole portion which is adjacent the north pole side of two permanent magnets of the second plurality of permanent magnets and a south pole portion which is adjacent the south pole side of two permanent magnets of the second plurality of permanent magnets, wherein the first magnetic sensor is associated with one of the north pole portions of the second platter and the second magnetic sensor is associated with one of the south pole portions of the second platter.

31. The magnetic coupling tool of claim 1, further comprising a plurality of pole extension shoes supported by the housing, the plurality of pole extension shoes including a first pole extension shoe including the first workpiece engagement surface and a second pole extension shoe including the second workpiece engagement, wherein the housing includes a lower side positioned between the first pole extension shoe and the second pole extension shoe, the first pole extension shoe and the second pole extension shoe extending below the lower side of the housing.

32. The magnetic coupling tool of claim 31, wherein the first pole extension shoe and the second pole extension shoe are removable from the housing.

33. The magnetic coupling tool of claim 1, wherein the first magnetic field sensor and the second magnetic field sensor are positioned outside of an envelope of the second permanent magnet.

34. The magnetic coupling tool of claim 1, wherein the first magnetic field sensor is positioned in a first half of the magnetic coupling tool and the second magnetic field sensor is positioned in a second half of the magnetic coupling tool.

35. The magnetic coupling tool of claim 31, wherein the first pole extension shoe is associated with a flux detection circuit surface opposite the workpiece engagement surface of the first pole extension shoe, the first magnetic sensor is positioned above the flux detection circuit associated with the first pole extension shoe.

36. The magnetic coupling tool of claim 35, wherein the housing includes a first recess, the first pole extension shoe being received in the first recess and the first magnetic sensor being positioned directly above the first recess.

37. The magnetic coupling tool of claim 31, wherein the second pole extension shoe is associated with a flux detection circuit surface opposite the workpiece engagement surface of the second pole extension shoe, the second magnetic sensor is positioned above the flux detection circuit associated with the second pole extension shoe.

38. The magnetic coupling tool of claim 35, wherein the housing includes a second recess, the second pole extension shoe being received in the second recess and the second magnetic sensor being positioned directly above the second recess.

39. The magnetic coupling tool of claim 1, wherein the first magnetic field sensor and the second magnetic field sensor are positioned within the housing.

40. The magnetic coupling tool of claim 1, further comprising at least one temperature sensor supported by the housing, the logic control circuit is operatively coupled to the at least one temperature sensor and the logic control circuit based on an output of the temperature sensor adjusts the output received from the at least one of the plurality of magnetic field sensors.

41. The magnetic coupling tool of claim 1, wherein the first magnetic field sensor and the second magnetic field sensor are each vector magnetometers.

42. The magnetic coupling tool of claim 1, further comprising a communication module supported by the housing, wherein the logic control circuit is operatively coupled to the communication module to interface with external control electronics.

43. The magnetic coupling tool of claim 31, the magnetic coupling tool further comprising
a plurality of degaussing electrical windings, a first degaussing electrical winding of the plurality of degaussing electrical windings being positioned about the first pole extension shoe of the plurality of pole extension shoes and a second degaussing electrical winding of the plurality of degaussing electrical windings being positioned about a second pole extension shoe of the plurality of pole extension shoes, wherein the logic control circuit is operatively coupled to the first degaussing electrical winding and the second degaussing electrical winding, the logic control circuit configured to perform a degaussing cycle with the plurality of degaussing electrical windings, the degaussing cycle including generating an oscillating and alternating magnetic field with the first degaussing electrical winding and the second degaussing electrical winding for a period of time.

44. The magnetic coupling tool of claim 43, wherein each of the first pole extension shoe and the second pole extension shoe include a first portion covered by the respective first and second degaussing electrical windings, a cross sectional area of the respective first portions being sufficient to direct a substantial and preferably all of the magnetic flux generated upon the respective first and second degaussing electrical windings being energised to the respective first and second workpiece engagement surfaces.

45. The magnetic coupling tool of claim 43, wherein the first workpiece engagement surface and the second workpiece engagement surface are both in contact with the ferromagnetic workpiece during the degaussing cycle and the switchable magnetic flux source is in an off state.

46. The magnetic coupling device of claim 1 further comprising an output device which provides an indication of the operating state of the magnetic coupling device.

47. The magnetic coupling device of claim 1, further comprising an output device which provides a plurality of distinct indications each corresponding to a respective one of a plurality of distinct operating states of the magnetic coupling device.

48. The magnetic coupling device of claim 47, wherein the plurality of distinct indications are each a visual indication perceivable from an exterior of the housing.

49. The magnetic coupling device of claim 47, wherein the output device includes a plurality of lights which are controlled to provide the plurality of distinct indications.

50. A robotic system for lifting a ferromagnetic workpiece, the robotic system comprising:
a robotic arm including a base and a plurality of moveable arm segments; and
a magnetic coupling device according to claim 1 operatively coupled to the robotic arm at a first end opposite the base.

51. A method of determining at least one operating state of a magnetic coupling tool, the method comprising the steps of:
detecting a first magnetic flux associated with a north pole of a switchable magnetic flux source supported by a housing, the switchable magnetic flux source including a plurality of permanent magnets, including a first permanent magnet and a second permanent magnet movable relative to the first permanent magnet, the first magnetic flux being detected at a location remote from a workpiece engagement surface of the north pole of the magnetic coupling tool and to a first side of the switchable magnetic flux source;

detecting a second magnetic flux associated with a south pole of the switchable magnetic flux source, the second magnetic flux being detected at a location remote from a workpiece engagement surface of the south pole of the magnetic coupling tool and to a second side of the switchable magnetic flux source, the second side being opposite the first side; and determining if the magnetic coupling tool is in a first operating state based on at least one of the detected first magnetic flux and the detected second magnetic flux.

52. The method of claim 51, wherein the step of determining the first operating state of the magnetic coupling tool includes the steps of:

determining if the detected first magnetic flux satisfies a first criteria;

determining if the detected second magnetic flux satisfies a second criteria; and determining that the magnetic coupling tool is in the first operating state if the detected first magnetic flux satisfies the first criteria and the detected second magnetic flux satisfies the second criteria.

53. The method of claim 52, wherein the first criteria is the output of the first magnetic field sensor is within a first range of magnetic flux values and the second criteria is the output of the second magnetic field sensor is within a second range of magnetic flux values.

54. The method of claim 53, wherein the first range of magnetic flux values includes a first limit value corresponding to the first workpiece engagement surface positioned at a first limit position of a target zone relative to the ferromagnetic workpiece and a second limit value corresponding to the first workpiece engagement surface positioned at a second limit position of the target zone relative to the ferromagnetic workpiece.

55. The method of claim 53, wherein the second range of magnetic flux values includes a first limit value corresponding to the second workpiece engagement surface positioned at a first limit position of the target zone relative to the ferromagnetic workpiece and a second limit value corresponding to the second workpiece engagement surface positioned at a second limit position of the target zone relative to the ferromagnetic workpiece.

56. The method of claim 52, further comprising the step of determining the first side of the magnetic coupling tool including the first workpiece contact surface is positioned outside of a target zone on the ferromagnetic workpiece when the second criteria is satisfied and the first criteria is not satisfied.

57. The method of claim 52, further comprising the step of determining the second side of the magnetic coupling tool including the second workpiece contact surface is positioned outside of a target zone on the ferromagnetic workpiece when the first criteria is satisfied and the second criteria is not satisfied.

58. The method of claim 51, wherein the first operating state is the magnetic coupling tool is in an off state.

59. The method of claim 58, wherein the step of determining if the magnetic coupling tool is in the first operating state includes the step of comparing of an output of at least one of the plurality of magnetic field sensors to a first threshold.

60. The method of claim 51, wherein the first operating state is that at least one of the plurality of workpiece engagement surfaces is proximate to the ferromagnetic workpiece.

61. The method of claim 60, wherein the step of determining if the magnetic coupling tool is in the first operating state includes the step of comparing an output of at least one of the plurality of magnetic field sensors to a second threshold stored on a memory accessible by the logic control circuit.

62. The method of claim 51, further comprising the step of determining a spacing of the first workpiece engagement surface from the ferromagnetic workpiece.

63. The method of claim 51, further comprising the step of determining an orientation of the first workpiece engagement surface and the second workpiece engagement surface relative to the ferromagnetic workpiece.

64. The method of claim 63, wherein the step of determining the orientation of the first workpiece engagement surface and the second workpiece engagement surface relative to the ferromagnetic workpiece includes the step of comparing an output of the first magnetic field sensor and an output of the second magnetic field sensor.

65. The method of claim 64, wherein the first workpiece engagement surface and the second workpiece engagement surface of the magnetic coupling tool are generally parallel to the ferromagnetic workpiece when the output of the first magnetic field sensor and the output of the second magnetic field sensor satisfy a first criteria.

66. The method of claim 65, wherein the first criteria is that the output of the first magnetic field sensor is within a threshold amount of the output of the second magnetic field sensor.

67. A magnetic coupling tool for magnetically coupling to a ferromagnetic workpiece, comprising:

a housing;

a switchable magnetic flux source supported by the housing including a plurality of permanent magnets, the plurality of permanent magnets including a first permanent magnet and a second permanent magnet movable relative to the first permanent magnet;

a plurality of pole extension shoes each having a workpiece interface; the plurality of pole extension shoes coupled to the housing to receive magnetic flux from the switchable magnetic flux source, the received magnetic flux being available to the ferromagnetic workpiece through the respective workpiece interfaces of the plurality of pole extension shoes;

a plurality of degaussing electrical windings, a first degaussing electrical winding of the plurality of degaussing electrical windings being positioned about a first pole extension shoe of the plurality of pole extension shoes and a second degaussing electrical winding of the plurality of degaussing electrical windings being positioned about a second pole extension shoe of the plurality of pole extension shoes; and a logic control circuit operatively coupled to the switchable magnetic flux source, the first degaussing electrical winding, and the second degaussing electrical winding, the logic control circuit configured to (i) position the second permanent magnet in a first orientation relative to first permanent magnet and (ii) perform a degaussing cycle with the plurality of degaussing electrical windings, the degaussing cycle including generating an oscillating and alternating magnetic field with the first electrical winding and the second electrical winding for a period of time.

68. The magnetic coupling tool of claim 67, wherein each of the first pole extension shoe and the second pole extension shoe include a first portion covered by the respective first and second degaussing electrical windings, a cross sectional area of the respective first portions being sufficient to direct a substantial and preferably all of the magnetic flux generated upon the respective first and second degaussing electrical windings being energised to the respective first and second workpiece engagement surfaces.

69. The magnetic coupling tool of claim 67, wherein the first workpiece engagement surface and the second workpiece engagement surface are both in contact with the ferromagnetic workpiece during the degaussing cycle and the switchable magnetic flux source is in an off state.

70. A magnetic coupling tool for magnetically coupling to a ferromagnetic workpiece, comprising:
a housing;
a switchable magnetic flux source supported by the housing including a plurality of permanent magnets, the plurality of permanent magnets including a first permanent magnet and a second permanent magnet movable relative to the first permanent magnet;
a plurality of workpiece engagement surfaces supported by the housing and magnetically coupled to the switchable magnetic flux source, the plurality of workpiece engagement surfaces adapted to contact the ferromagnetic workpiece, a first workpiece engagement surface of the plurality of workpiece engagement surfaces corresponding to a north pole of the magnetic coupling tool and a second workpiece engagement surface of the plurality of workpiece engagement surfaces corresponding to a south pole of the magnetic coupling tool;
a plurality of magnetic field sensors supported by the housing, a first magnetic field sensor of the plurality of magnetic field sensors positioned at a first location remote from the first workpiece engagement surface and to a first side of the switchable magnetic flux source to monitor a first magnetic flux associated with the first workpiece engagement surface of the plurality of workpiece engagement surfaces and a second magnetic field sensor of the plurality of magnetic field sensors positioned at a second location remote from the second workpiece engagement surface and to a second side of the switchable magnetic flux source, the second side being opposite the first side, to monitor a second magnetic flux associated with the second workpiece engagement surface of the plurality of workpiece engagement surfaces; and
a logic control circuit operatively coupled to the plurality of magnetic field sensors, the logic control circuit configured to determine at least one operating state of the magnetic coupling tool based on an output from at least one of the plurality of magnetic field sensors.

71. A magnetic coupling tool for magnetically coupling to a ferromagnetic workpiece, comprising:
a housing;
a switchable magnetic flux source supported by the housing including a plurality of permanent magnets, the plurality of permanent magnets including a first permanent magnet and a second permanent magnet movable relative to the first permanent magnet, the second permanent magnet is rotatable relative to the first permanent magnet about an axis intersecting with the second permanent magnet to alter a position of the second permanent magnet relative to the first permanent magnet;
a plurality of workpiece engagement surfaces supported by the housing and magnetically coupled to the switchable magnetic flux source, the plurality of workpiece engagement surfaces adapted to contact the ferromagnetic workpiece, a first workpiece engagement surface of the plurality of workpiece engagement surfaces corresponding to a north pole of the magnetic coupling tool and a second workpiece engagement surface of the plurality of workpiece engagement surfaces corresponding to a south pole of the magnetic coupling tool;
a plurality of magnetic field sensors supported by the housing, a first magnetic field sensor of the plurality of magnetic field sensors positioned to monitor a first magnetic flux associated with the first workpiece engagement surface of the plurality of workpiece engagement surfaces and a second magnetic field sensor of the plurality of magnetic field sensors positioned to monitor a second magnetic flux associated with the second workpiece engagement surface of the plurality of workpiece engagement surfaces; and
a logic control circuit operatively coupled to the plurality of magnetic field sensors, the logic control circuit configured to determine at least one operating state of the magnetic coupling tool based on an output from at least one of the plurality of magnetic field sensors.

72. A magnetic coupling tool for magnetically coupling to a ferromagnetic workpiece, comprising:
a housing;
a magnetic flux source supported by the housing including a plurality of magnets, the plurality of magnets including a first permanent magnet fixed relative to the housing and a second magnet configurable relative to the first permanent magnet to provide a first configuration wherein a north pole of the second magnet is aligned with a north pole of the first permanent magnet and a south pole of the second magnet is aligned with a south pole of the first permanent magnet and a second configuration wherein the north pole of the second magnet is misaligned with the north pole of the first permanent magnet and the south pole of the second magnet is misaligned with the south pole of the first permanent magnet;
a plurality of workpiece engagement surfaces supported by the housing and magnetically coupled to the magnetic flux source, the plurality of workpiece engagement surfaces adapted to contact the ferromagnetic workpiece, a first workpiece engagement surface of the plurality of workpiece engagement surfaces corresponding to a north pole of the magnetic coupling tool in the first configuration of the magnetic coupling tool and a second workpiece engagement surface of the plurality of workpiece engagement surfaces corresponding to a south pole of the magnetic coupling tool in the first configuration of the magnetic coupling tool;
a plurality of magnetic field sensors supported by the housing, a first magnetic field sensor of the plurality of magnetic field sensors positioned to monitor a first magnetic flux associated with the first workpiece engagement surface of the plurality of workpiece engagement surfaces and a second magnetic field sensor of the plurality of magnetic field sensors positioned to monitor a second magnetic flux associated with the second workpiece engagement surface of the plurality of workpiece engagement surfaces; and
a logic control circuit operatively coupled to the plurality of magnetic field sensors, the logic control circuit configured to determine at least one operating state of the magnetic coupling tool based on an output from at least one of the plurality of magnetic field sensors.

73. A method of determining at least one operating state of a magnetic coupling tool, the method comprising the steps of:
  detecting a first magnetic flux associated with a north pole of a magnetic flux source supported by a housing, the magnetic flux source including a plurality of magnets, including a first permanent magnet fixed relative to the housing and a second magnet configurable relative to the first permanent magnet to provide a first configuration wherein a north pole of the second magnet is aligned with a north pole of the first permanent magnet and a south pole of the second magnet is aligned with a south pole of the first permanent magnet and a second configuration wherein the north pole of the second magnet is misaligned with the north pole of the first permanent magnet and the south pole of the second magnet is misaligned with the south pole of the first permanent magnet, the first magnetic flux being detected at a location remote from a workpiece engagement surface of a north pole of the magnetic coupling tool and to a first side of the magnetic flux source;
  detecting a second magnetic flux associated with a south pole of the magnetic flux source, the second magnetic flux being detected at a location remote from a workpiece engagement surface of a south pole of the magnetic coupling tool and to a second side of the magnetic flux source, the second side being opposite the first side; and
  determining if the magnetic coupling tool is in a first operating state based on at least one of the detected first magnetic flux and the detected second magnetic flux.

74. The magnetic coupling tool of claim 70, wherein the second permanent magnet and the first permanent magnet are vertically stacked.

75. The magnetic coupling tool of claim 70, wherein the second permanent magnet is rotatable relative to the first permanent magnet.

76. The magnetic coupling tool of claim 75, wherein the second permanent magnet and the first permanent magnet are vertically stacked.

77. The magnetic coupling tool of claim 71, wherein the second permanent magnet and the first permanent magnet are vertically stacked.

78. The magnetic coupling tool of claim 72, wherein the second magnet and the first permanent magnet are vertically stacked.

79. The magnetic coupling tool of claim 72, wherein the second magnet is a second permanent magnet.

80. The method of claim 73, wherein the second magnet and the first permanent magnet are vertically stacked.

81. The method of claim 73, wherein the second magnet is a second permanent magnet.

* * * * *